(12) United States Patent
Sasaki et al.

(10) Patent No.: US 11,804,502 B2
(45) Date of Patent: Oct. 31, 2023

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventors: Naoto Sasaki, Nagasaki (JP); Yutaka Ooka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/171,927

(22) Filed: Feb. 21, 2023

(65) Prior Publication Data
US 2023/0197745 A1    Jun. 22, 2023

Related U.S. Application Data

(63) Continuation of application No. 17/317,118, filed on May 11, 2021, now Pat. No. 11,616,090, which is a (Continued)

(30) Foreign Application Priority Data

Sep. 30, 2016  (JP) ................................ 2016-192849
Mar. 31, 2017  (JP) ................................ 2017-069561

(51) Int. Cl.
*H01L 27/146* (2006.01)
*H04N 25/75* (2023.01)

(52) U.S. Cl.
CPC .. *H01L 27/14618* (2013.01); *H01L 27/14621* (2013.01); *H01L 27/14627* (2013.01);
(Continued)

(58) Field of Classification Search
CPC ......... H01L 27/14618; H01L 27/14621; H01L 27/14627; H01L 27/14683; H04N 25/27
(Continued)

(56) References Cited

U.S. PATENT DOCUMENTS

| | | |
|---|---|---|
| 5,733,802 A | 3/1998 | Inoue et al. |
| 2004/0130640 A1 | 7/2004 | Fujimori |

(Continued)

FOREIGN PATENT DOCUMENTS

| | | |
|---|---|---|
| CN | 101065844 A | 10/2007 |
| EP | 1577950 A1 | 9/2005 |

(Continued)

OTHER PUBLICATIONS

International Search Report and Written Opinion of PCT Application No. PCT/JP2017/028404, dated Oct. 24, 2017, 13 pages of English Translation and 09 pages of ISRWO.

(Continued)

*Primary Examiner* — Igwe U Anya
(74) *Attorney, Agent, or Firm* — CHIP LAW GROUP

(57) ABSTRACT

The height of a solid-state imaging element is further reduced as compared to the related art. A solid-state imaging element that is a wafer-level chip size package, including: an optical sensor chip; a protective layer that is stacked on a light receiving surface of the optical sensor chip; and a rewiring layer that is stacked on a surface opposite to the light receiving surface of the optical sensor chip, in which a connection terminal of the rewiring layer is a copper flat pad without a solder ball, an alloy layer of tin and copper is not formed on a front surface of the flat pad, and a thermal expansion coefficient of the protective layer is substantially balanced with a thermal expansion coefficient of the rewiring layer.

7 Claims, 24 Drawing Sheets

Related U.S. Application Data continuation of application No. 16/328,717, filed as application No. PCT/JP2017/028404 on Aug. 4, 2017, now Pat. No. 11,031,422.

(52) U.S. Cl.
CPC .. *H01L 27/14636* (2013.01); *H01L 27/14683* (2013.01); *H04N 25/75* (2023.01)

(58) Field of Classification Search
USPC ......................................................... 257/432
See application file for complete search history.

(56) References Cited

U.S. PATENT DOCUMENTS

| | | | |
|---|---|---|---|
| 2008/0042227 A1 | 2/2008 | Asano et al. | |
| 2008/0303107 A1* | 12/2008 | Minamio | H01L 27/14618 257/E31.127 |
| 2010/0295167 A1 | 11/2010 | Watanabe | |
| 2012/0038813 A1 | 2/2012 | Jung et al. | |
| 2012/0086092 A1 | 4/2012 | Yanagita et al. | |
| 2013/0249033 A1 | 9/2013 | Kim et al. | |
| 2014/0138788 A1 | 5/2014 | Kim et al. | |
| 2015/0270243 A1 | 9/2015 | Yang et al. | |
| 2017/0117320 A1* | 4/2017 | Matsugai | H01L 27/14645 |
| 2018/0166490 A1 | 6/2018 | Wakiyama et al. | |

FOREIGN PATENT DOCUMENTS

| | | |
|---|---|---|
| JP | 2004-207461 A | 7/2004 |
| JP | 2008-072111 A | 3/2008 |
| JP | 2008-270650 A | 11/2008 |
| JP | 2009-016405 A | 1/2009 |
| JP | 2009-164314 A | 7/2009 |
| JP | 2012-175461 A | 9/2012 |
| JP | 2014-022395 A | 2/2014 |
| JP | 2014-072294 A | 4/2014 |
| JP | 2016-001681 A | 1/2016 |
| JP | 201603256 A | 1/2016 |
| KR | 10-2007-0086904 A | 8/2007 |
| WO | 2004/059740 A1 | 7/2004 |
| WO | 2006/073085 A1 | 7/2006 |
| WO | 2015/190070 A1 | 12/2015 |

OTHER PUBLICATIONS

Notice of Allowance for U.S. Appl. No. 16/328,717, dated Feb. 8, 2021, 8 pages.
Non-Final Office Action for U.S. Appl. No. 16/328,717, dated Apr. 2, 2020, 13 pages.
Final Office Action for U.S. Appl. No. 16/328,717, dated Oct. 8, 2020, 18 pages.
Advisory Action for U.S. Appl. No. 16/328,717, dated Jan. 7, 2021, 02 pages.
International Preliminary Report on Patentability of PCT Application No. PCT/JP2017/028404, dated Apr. 11, 2019, 13 pages of English Translation and 06 pages of IPRP.
Notice of Allowance for U.S. Appl. No. 17/317,118, dated Nov. 21, 2022, 7 pages.
Non-Final Office Action for U.S. Appl. No. 17/317,118, dated Aug. 1, 2022, 11 pages.

\* cited by examiner

SOLID-STATE IMAGING ELEMENT AND IMAGING DEVICE

CROSS REFERENCE TO RELATED APPLICATIONS

The present application is a continuation application of U.S. patent application Ser. No. 17/317,118, filed on May 11, 2021, which is a continuation application of U.S. patent application Ser. No. 16/328,717, filed on Feb. 26, 2019, which is a U.S. National Phase of International Patent Application No. PCT/JP2017/028404 filed on Aug. 4, 2017, which claims priority benefit of Japanese Patent Application No. JP 2016-192849 filed in the Japan Patent Office on Sep. 30, 2016 and also claims priority benefit of Japanese Patent Application No. JP 2017-069561 filed in the Japan Patent Office on Mar. 31, 2017. Each of the above-referenced applications is hereby incorporated herein by reference in its entirety.

TECHNICAL FIELD

The present technology relates to a solid-state imaging element and an imaging device.

BACKGROUND ART

A solid-state imaging element has been proposed in which a transparent adhesive is applied to all of a light receiving region and a peripheral circuit region of a light receiving surface and a transparent member is placed and fixed (see Patent Documents 1 to 3). According to the solid-state imaging element, for example, it is possible to improve moisture resistance, to prevent a reduction in strength, to reduce a size and a thickness, to prevent the attachment of a foreign material to a light receiving surface.

CITATION LIST

Patent Document

Patent Document 1: Japanese Patent Application Laid-Open No. 2004-207461
Patent Document 2: Japanese Patent Application Laid-Open No. 2008-270650
Patent Document 3: Japanese Patent Application Laid-Open No. 2012-175461

SUMMARY OF THE INVENTION

Problems to be Solved by the Invention

There is a demand for further reducing the height of a solid-state imaging element. The solid-state imaging element according to the related art has room for contrivance to thin each part.

The present technology has been made in view of the above-mentioned problems and an object of the present technology is to further reduce the height of a solid-state imaging element as compared to the related art.

Solutions to Problems

An aspect of the present technology is a solid-state imaging element that is a wafer-level chip size package, including: an optical sensor chip; a protective layer that is stacked on a light receiving surface of the optical sensor chip; and a rewiring layer that is stacked on a surface opposite to the light receiving surface of the optical sensor chip, in which a connection terminal of the rewiring layer is a copper flat pad without a solder ball, an alloy layer of tin and copper is not formed on a front surface of the flat pad, and a thermal expansion coefficient of the protective layer is substantially balanced with a thermal expansion coefficient of the rewiring layer.

Note that the above-mentioned solid-state imaging element includes various aspects, such as an aspect in which the solid-state imaging element is implemented with being incorporated into other apparatus or an aspect in which the solid-state imaging element is implemented together with other methods.

Effects of the Invention

According to the present technology, it is to further reduce the height of the solid-state imaging element as compared to the related art. In addition, the effects described in the specification are illustrative and are not limited. Additional effects may also be obtained.

MODE FOR CARRYING OUT THE INVENTION

Hereinafter, the present technology will be described with reference to the drawings.

Figure 1:
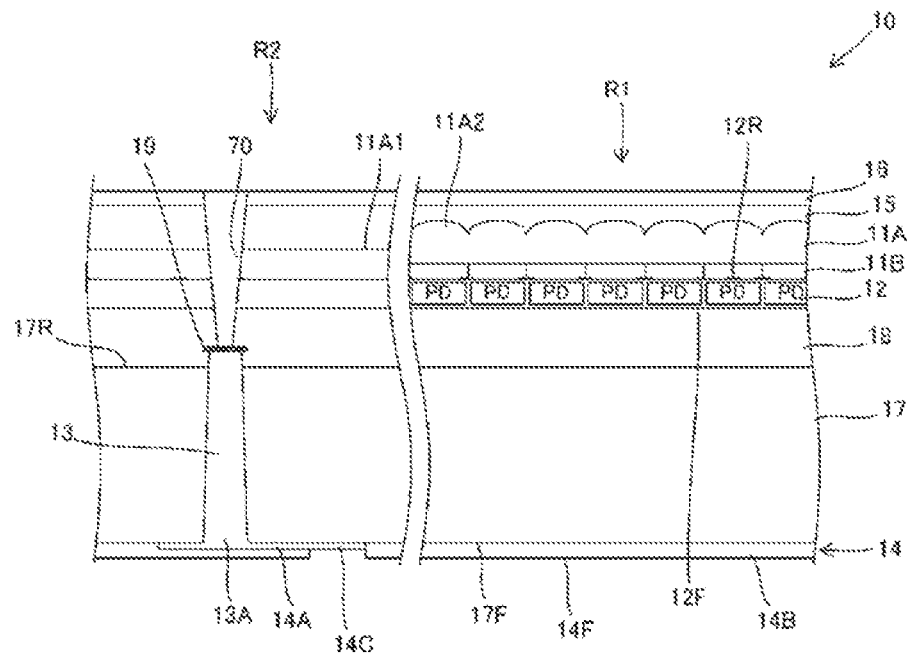
FIG. 1 is a diagram schematically illustrating the configuration of a solid-state imaging element according to this embodiment.

(A) First Embodiment of Solid-state Imaging Element:
FIG. 1 is a diagram schematically illustrating the configuration of a solid-state imaging element 10 according to this embodiment. The solid-state imaging element 10 receives light incident from an object, performs photoelectric conversion, and outputs an electric signal corresponding to the amount of light. The solid-state imaging element 10 is a wafer-level chip size package (WLCSP) formed by a method which performs, for example, the formation of terminals and performs wiring before a wafer (silicon wafer) is cut and then dices the wafer.

In the solid-state imaging element 10, one layer or a plurality of layers are formed on each of a front surface 12F and a rear surface 12R of a semiconductor substrate 12. For example, these layers are formed by a chemical vapor deposition method, a physical vapor deposition method, a coating method, such as a spin coating method, a lithography technique, or the adhesion of a support substrate, a peripheral circuit board, or the like that has been manufactured separately. A color filter 11B and an on-chip lens 11A are stacked on the rear surface 12R which is a light receiving surface of the semiconductor substrate 12.

A resin layer 15 and an inorganic material layer 16 are stocked on the on-chip lens 11A. A wiring layer 18 is stacked on the front surface 12F of the semiconductor substrate 12. A rewiring layer 14 is provided on the front side of the wiring layer 18. In addition, other layers may be stacked and interposed between the layers stacked on each surface of the semiconductor substrate 12. A semiconductor substrate, such as a silicon wafer, is used as the semiconductor substrate 12.

The type of solid-state imaging element 10 is not particularly limited and may be a front side illumination type or a backside illumination type. Further, the solid-state imaging element 10 may be a complementary metal oxide semiconductor (CMOS) type, a charge coupled device (CCD) type, or other types. In a case where the solid-state imaging element is the front side illumination type, the wiring layer 18 is formed between the semiconductor substrate 12 and the color filter 11B. In addition, hereinafter, an example in which a backside-illumination-type CMOS image sensor is used as the solid-state imaging element 10 which is the WLCSP will be described.

In the semiconductor substrate 12, a plurality of photodiodes PD are provided in parallel as photoelectric conversion elements along the rear surface 12R in an imaging element region R1. In addition, pixel transistors (not illustrated) (transfer transistors, reset transistors, amplifying transistors, or select transistors) are provided in the semiconductor substrate 12 along the front surface 12F in the imaging element region R1. The pixel transistor is basically provided in each pixel. However, in the case of a floating diffusion (FD) sharing type in which an FD is shared by a plurality of pixels, the transfer transistor is provided in each pixel and the other pixel transistors are provided for each FD.

The semiconductor substrate 12 is connected to a peripheral circuit through pixel driving lines or vertical signal lines which form the wiring layer 18 stacked on the front surface 12F. For example, the peripheral circuit includes some or all of a vertical driving unit 122, an analog-digital conversion unit 123 (AD conversion unit 123), a reference signal generation unit 124, a horizontal driving unit 125, a communication timing control unit 126, and a signal processing unit 127 which will be described later. The peripheral circuit is formed in a peripheral circuit region R2 that is provided outside the imaging element region R1 and/or on a peripheral circuit board which will be described later.

A plurality of color filters 11B are stacked on the rear surface 12R of the semiconductor substrate 12 so as to correspond to each position of the photodiodes PD. A plurality of on-chip lenses 11A are stacked on the color filters 11B so as to correspond to each position of the color filters 11B. The on-chip lens 11A is formed using an inorganic film with a high refractive index, such as a silicon nitride film (SiN film), a silicon oxynitride film (SiON film), or a silicon oxide film (SiO film), and can be formed by an etch back method. These films have a refractive index of about 1.4 to 2.0.

The resin layer 15 covers the on-chip lenses 11A such that the on-chip lenses 11A are buried and is formed with such a thickness that the on-chip lenses 11A is not exposed to the outside of the resin layer 15. The on-chip lens 11A has a spherical lens 11A2 that is formed on a substantially flat base portion 11A1 as a hill-shaped swelling. The resin layer 15 is formed so as to cover all of the base portion 11A1 and the spherical lens 11A2 without any gap therebetween. For example, in a case where the spherical lens 11A2 is formed at a height of 500 nm from the base portion 11A1, the resin layer 15 is formed with a thickness of 600 nm or more from the base portion 11A1.

The resin layer 15 is made by using a material having transparency, heat resistance, and the like, for example, a transparent silicone-based resin, an acryl-based resin, an epoxy-based resin, a styrene-based resin, or the like. The resin layer 15 has a lower refractive index than the on-chip lens 11A and has a higher refractive index than an optical transmission medium (generally, air) outside the light receiving surface of the solid-state imaging element 10. For example, the resin layer 15 has a refractive index of about 1.3 to 1.5.

This configuration in which the on-chip lenses 11A are completely covered with the resin layer 15 and the front surface of the resin layer 15 is substantially flat makes it possible to planarize the light receiving surface of the solid-state imaging element 10. In addition, since the resin layer 15 is made by using the material that has a lower refractive index than the on-chip lens 11A and has a higher refractive index than the optical transmission medium outside the light receiving surface of the solid-state imaging element 10, it is possible to ensure a light focusing performance by the on-chip lens 11A.

The inorganic material layer 16 is provided with a substantially constant thickness along the front surface of the resin layer 15 so as to cover the entire front surface of the resin layer 15. In this embodiment, the inorganic material layer 16 is located on the outermost surface of the solid-state imaging element 10 and functions as a protective film of the solid-state imaging element 10. The material forming the inorganic material layer 16 is, for example, an inorganic material such as silicon oxide (SiO) or silicon oxynitride (SiON). The unevenness of the front surface of the on-chip lens 11A is planarized by the inorganic material layer 16 provided so as to cover the front surface of the resin layer 15. Therefore, the cover glass that is provided on the on-chip lens 11A in the related art is not needed and it is possible to reduce the height of the solid-state imaging element 10.

As described above, the wiring layer 18 is stacked on the front surface 12F of the semiconductor substrate 12. In a case where a peripheral circuit board is separately manufactured and is three-dimensionally stacked on an image sensor so as to be integrated with the image sensor, the peripheral circuit board is bonded to the front side of the wiring layer 18. A support substrate 17, such as bulk silicon, is bonded to the front side of the wiring layer 18 or the front side of the peripheral circuit board.

A through electrode (for example, a through silicon via (TSV)) 13 that passes through the support substrate 17 from a front surface 17F (a surface that does not face the semiconductor substrate 12) to a rear surface 17R is formed in the solid-state imaging element 10. The through electrode 13 passes through the support substrate 17, reaches an input/output pad 19 that is provided in the peripheral circuit region R2, and electrically connects the front surface 17F of the support substrate 17 and the input/output pad 19. The input/output pad 19 is used as a terminal for inputting and outputting signals from and to the outside in the peripheral circuit of the solid-state imaging element 10.

Figure 5:
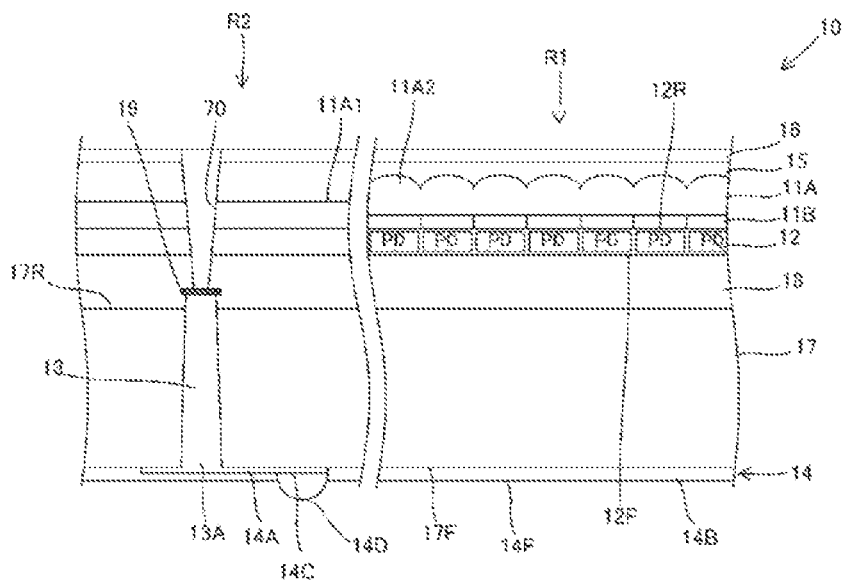
FIG. 5 is a diagram schematically illustrating the configuration of the solid-state imaging element according to this embodiment.

The rewiring layer 14 is stacked on the front surface 17F of the support substrate 17. The rewiring layer 14 includes a redistribution wire 14A as a metal wire that is formed on the front surface 17F of the support substrate 17, a solder resist 14B that covers the redistribution wire 14A, and a land 14C which will be a connection terminal of the solid-state imaging element 10. The redistribution wire 14A electrically connects an end portion 13A of the through electrode 13 and the land 14C provided on the front surface 17F of the support substrate 17. The land 14C is formed at a position corresponding to the connection terminal of the substrate which is the mounting destination of the solid-state imaging element 10. The connection terminal of the substrate is connected to the land 14C and is connected to the end portion 13A of the through electrode 13 through the redistribution wire 14A. The through electrode 13 and the redistribution wire 14A are covered and insulated by the solder resist 14B except the land 14C. In addition, in this embodiment, a land grid array (LGA) structure is described as an example. However, as illustrated in FIG. 5, a solder ball 14D may be formed on the land 14C to form a ball grid array (BGA) structure. Further, a metal post may be vertically provided on the land 14C.

The use of the rewiring layer 14 through the through electrode 13 makes it unnecessary to draw a metal wire (wire) so as to go around the side surface of the solid-state imaging element 10. Therefore, the mounting area of the module is reduced, the number of components is reduced, and a manufacturing process is efficient, for example. In addition, since it is not necessary to draw the metal wire around the side of the solid-state imaging element, the length of the wire is reduced and electrical characteristics are improved. In addition, a fine and flexible design is possible. As a result, it is possible to improve the transmission quality of signals and to improve the quality (for example, quality in image processing) of various kinds of signal processing in the subsequent stage using an output signal from a module.

Figure 2:
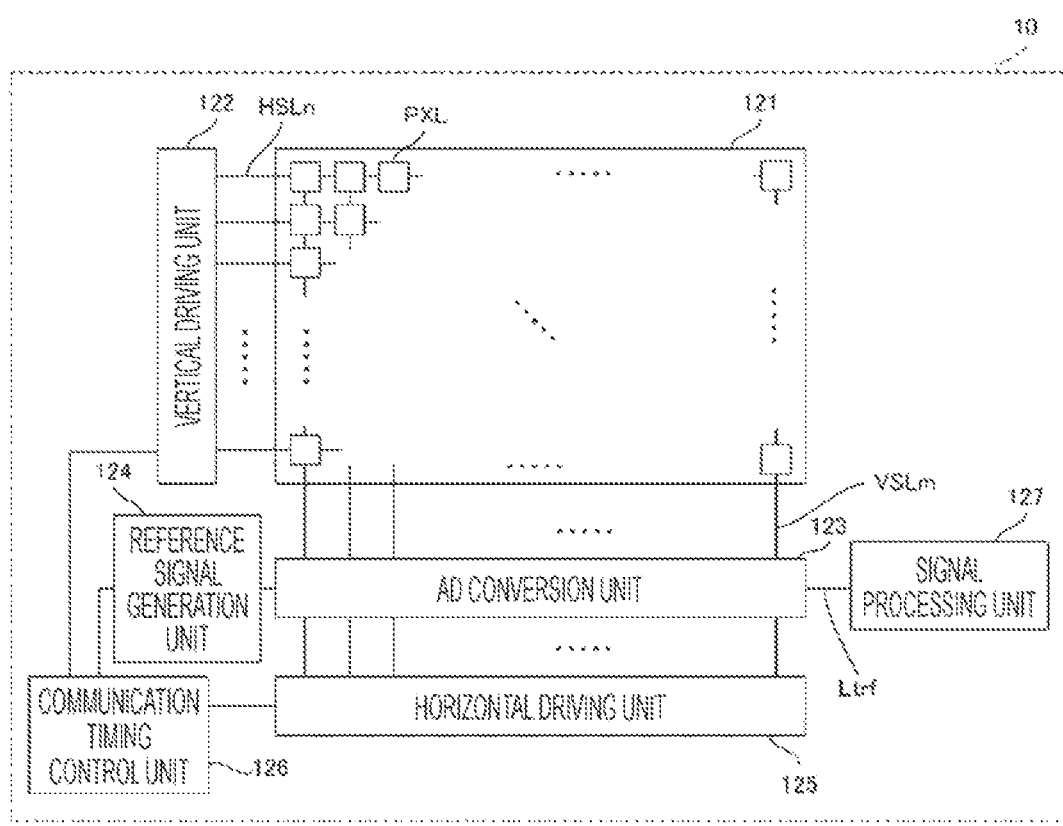
FIG. 2 is a block diagram illustrating the electrical configuration of the solid-state imaging element according to this embodiment.

FIG. 2 is a block diagram illustrating the electrical configuration of the solid-state imaging element 10. Further, in this embodiment, the CMOS image sensor which is a kind of X-Y-address-type solid-state imaging device is described as an example of the solid-state imaging device. Of course, a CCD image sensor may be used. Next, a specific example of the solid-state imaging device as the CMOS image sensor will be described with reference to FIG. 2.

In FIG. 2, the solid-state imaging element 10 includes a pixel unit 121, the vertical driving unit 122, the AD conversion unit 123, the reference signal generation unit 124, the horizontal driving unit 125, the communication timing control unit 126, and the signal processing unit 127.

In the pixel unit 121, a plurality of pixels PXL, each of which has a photodiode as a photoelectric conversion unit, are arranged in a two-dimensional matrix. A color filter array in which the colors of filters are divided in correspondence with each pixel is provided on a light receiving surface side of the pixel unit 121. In addition, the specific circuit configuration of the pixel PXL will be described later.

In the pixel unit 121, n pixel driving lines HSLn (n=1, 2, . . . ) and m vertical signal lines VSLm (m=1, 2, . . . ) are provided. The pixel driving lines HSLn are provided along the left-right direction (a pixel arrangement direction of a pixel row/the horizontal direction) of FIG. 2 and are arranged at regular intervals in the up-down direction of FIG. 2. The vertical signal lines VSLm are provided along the up-down direction (a pixel arrangement direction of a pixel column/the vertical direction) of FIG. 2 and are arranged at regular intervals in the left-right direction of FIG. 2.

One end of the pixel driving line HSLn is connected to an output terminal corresponding to each row of the vertical driving unit 122. The vertical signal line VSLm is connected to the pixels PXL in each column and one end of the vertical signal line VSLm is connected to the AD conversion unit 123. The vertical driving unit 122 or the horizontal driving unit 125 performs a control process of sequentially reading analog signals from each of the pixels PXL forming the pixel unit 121 under the control of the communication timing control unit 126. In addition, the detailed connection of the pixel driving lines HSLn and the vertical signal lines VSLm to each pixel PXL will be described later together with the description of the pixel PXL.

The communication timing control unit 126 includes, for example, a timing generator and a communication interface. The timing generator generates various clock signals on the basis of a clock (master clock) that is input from the outside. The communication interface receives, for example, data indicating an operation mode which is given from the outside of the solid-state imaging element 10 and outputs data including the internal information of the solid-state imaging element 10 to the outside.

The communication timing control unit 126 generates, for example, a clock having the same frequency as the master clock, a clock having a frequency obtained by dividing the frequency of the master clock by 2, and a low-speed clock having a frequency obtained by dividing the frequency of the master clock by 3 or more on the basis of the master clock and supplies the clock to each unit (for example, the vertical driving unit 122, the horizontal driving unit 125, the AD conversion unit 123, the reference signal generation unit 124, and the signal processing unit 127) in the device.

The vertical driving unit 122 is formed by, for example, a shift register, an address decoder, or the like. The vertical driving unit 122 includes a vertical address setting unit that controls a row address on the basis of a signal obtained by decoding a video signal input from the outside and a scanning control unit that controls row scanning.

The vertical driving unit 122 can perform read scanning and sweep scanning.

The read scanning is scanning that sequentially selects unit pixels from which a signal is read. Basically, the read scanning is sequentially performed for each row. In a case where the outputs of a plurality of pixels having a predetermined positional relationship therebetween are added or added and averaged to thin out the pixels, the read scanning is performed in a predetermined order.

The sweep scanning is scanning that resets unit pixels belonging to a row or a combination of pixels, from which a signal is read by the read scanning, a period of time corresponding to a shutter speed earlier than the read scanning.

The horizontal driving unit 125 sequentially selects each ADC circuit forming the AD conversion unit 123 in synchronization with the clock output from the communication timing control unit 126. The AD conversion unit 123 includes the ADC circuits (m=1, 2, . . . ) provided for each vertical signal line VSLm, converts an analog signal output from each vertical signal line VSLm into a digital signal, and outputs the digital signal to a horizontal signal line Ltrf under the control of the horizontal driving unit 125.

The horizontal driving unit 125 includes, for example, a horizontal address setting unit and a horizontal scanning unit, selects each ADC circuit of the AD conversion unit 123 which corresponds to the horizontal read row defined by the horizontal address setting unit, and guides a digital signal generated by the selected ADC circuit to the horizontal signal line Ltrf.

The digital signal output from the AD conversion unit 123 in this way is input to the signal processing unit 127 through the horizontal signal line Ltrf. The signal processing unit 127 performs a process of converting the signal output from the pixel unit 121 through the AD conversion unit 123 into an image signal corresponding to the color arrangement of the color filter array, using arithmetic processing.

In addition, the signal processing unit 127 performs, for example, a process of adding or adding and averaging the pixel signals in the horizontal direction or the vertical direction to thin out the pixels if necessary. The generated image signal is output to the outside of the solid-state imaging element 10.

The reference signal generation unit 124 includes a digital-analog converter (DAC) and generates a reference signal Vramp in synchronization with a count clock supplied from the communication timing control unit 126. The reference signal Vramp is a saw-tooth wave (ramp waveform) that changes stepwise over time from an initial value supplied from the communication timing control unit 126. The reference signal Vramp is supplied to each ADC circuit of the AD conversion unit 123.

The AD conversion unit 123 includes a plurality of ADC circuits. In a case where an analog voltage output from each pixel PXL is converted into a digital voltage, the ADC circuit compares the reference signal Vramp with the voltage of the vertical signal line VSLm for a predetermined AD conversion period (a P-phase period or a D-phase period which will be described later) using a comparator and counts a period of time before or after the magnitude relationship between the reference signal Vramp and the voltage (pixel voltage) of the vertical signal line VSLm is inverted. Therefore, it is possible to generate a digital signal corresponding to an analog pixel voltage. In addition, a specific example of the AD conversion unit 123 will be described later.

Figure 3:
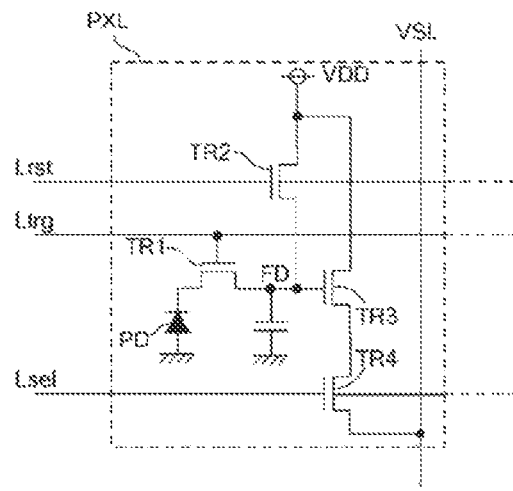
FIG. 3 is a diagram illustrating the circuit configuration of a pixel.

FIG. 3 is a diagram illustrating the circuit configuration of the pixel. FIG. 3 illustrates an equivalent circuit of a pixel having a general 4-transistor configuration. The pixel illustrated in FIG. 3 includes a photodiode PD and four transistors (a transfer transistor TR1, a reset transistor TR2, an amplifying transistor TR3, and a select transistor TR4).

The photodiode PD generates a current corresponding to the amount of light received, using photoelectric conversion. An anode of the photodiode PD is connected to the ground and a cathode of the photodiode PD is connected to a drain of the transfer transistor TR1.

Various control signals are input from various drivers or a reset signal generation circuit of the vertical driving unit 122 to the pixel PXL through signal lines Ltrg, Lrst, and Lsel.

The signal line Ltrg for transmitting a transfer gate signal is connected to a gate of the transfer transistor TR1. A source of the transfer transistor TR1 is connected to a connection point between a source of the reset transistor TR2 and a gate of the amplifying transistor TR3. The connection point forms the floating diffusion FD which is a capacitor accumulating signal charge.

In a case where a transfer signal is input to the gate of the transfer transistor TR1 through the signal line Ltrg, the transfer transistor TR1 is turned on and transfers the signal charge (here, photoelectrons) accumulated by the photoelectric conversion of the photodiode PD to the floating diffusion FD.

The signal line Lrst for transmitting a reset signal is connected to a gate of the reset transistor TR2 and a constant voltage source VDD is connected to a drain of the reset transistor TR2. In a case where the reset signal is input to the gate of the reset transistor TR2 through the signal line Lrst, the reset transistor TR2 is turned on and resets the floating diffusion FD to the voltage of the constant voltage source VDD. On the other hand, in a case where the reset signal is not input to the gate through the signal line Lrst, the reset transistor TR2 is turned off and forms a predetermined potential barrier between the floating diffusion FD and the constant voltage source VDD.

The amplifying transistor TR3 has the gate that is connected to the floating diffusion FD, a drain that is connected to the constant voltage source VDD, and a source that is connected to a drain of the select transistor TR4 and forms a source follower.

The signal line Lsel for a select signal is connected to a gate of the select transistor TR4 and a source of the select transistor TR4 is connected to the vertical signal line VSLm. In a case where a control signal (an address signal or a select signal) is input to the gate of the select transistor TR4 through the signal line Lsel, the select transistor TR4 is turned on. In a case where the control signal is not input to the gate through the signal line Lsel, the select transistor TR4 is turned off.

In a case where the select transistor TR4 is turned on, the amplifying transistor TR3 amplifies the voltage of the floating diffusion FD and outputs the voltage to the vertical signal line VSLm. The voltage output from each pixel through the vertical signal line VSLm is input to the AD conversion unit 123.

In addition, the circuit configuration of the pixel is not limited to the configuration illustrated in FIG. 3 and various known configurations, such as a 3-transistor configuration and a 4-transistor configuration, can be used. An example of the 4-transistor configuration is a configuration in which the select transistor TR4 is provided between the amplifying transistor TR3 and the constant voltage source VDD.

Figure 4:
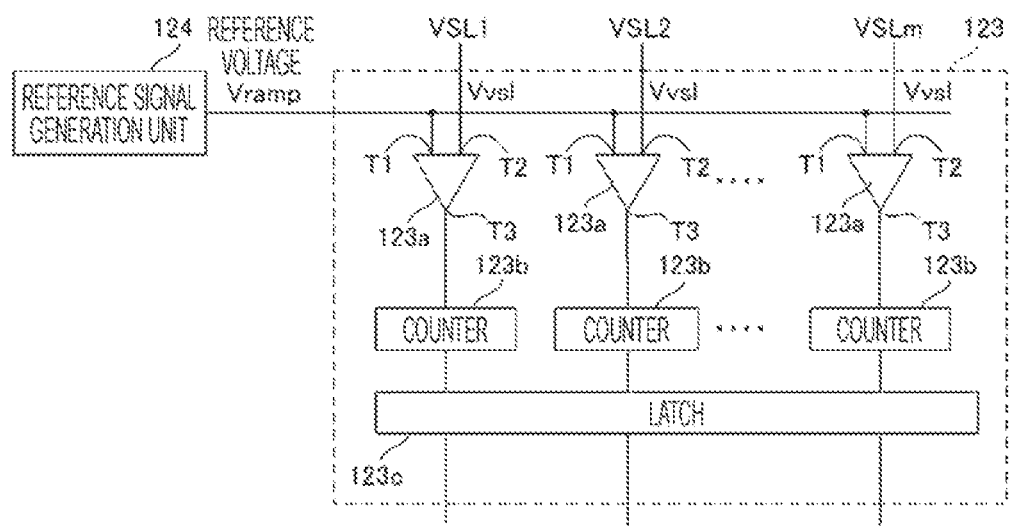
FIG. 4 is a diagram illustrating the configuration of an AD conversion unit.

FIG. 4 is a diagram illustrating the configuration of the AD conversion unit 123. As illustrated in FIG. 4, each of the ADC circuits forming the AD conversion unit 123 includes a comparator 123a and a counter 123b which are provided for each vertical signal line VSLm and a latch 123c.

The comparator 123a includes two input terminals T1 and T2 and one output terminal T3. The reference signal Vramp is input from the reference signal generation unit 124 to one input terminal T1 and an analog pixel signal (hereinafter, referred to as a pixel signal Vvsl) output from the pixel through the vertical signal line VSLm is input to the other input terminal T2.

The comparator 123a compares the reference signal Vramp with the pixel signal Vvsl. The comparator 123a outputs a high-level signal or a low-level signal according to the magnitude relationship between the reference signal Vramp and the pixel signal Vvsl. In a case where the magnitude relationship between the reference signal Vramp and the pixel signal Vvsl is changed, the output of the output terminal T3 is inverted between a high level and a low level.

The counter 123b is supplied with the clock from the communication timing control unit 126 and counts the time from the start to the end of AD conversion, using the clock. The start timing and the end timing of AD conversion are specified on the basis of the control signal (for example, whether or not the clock signal CLK is input, or the like) output from the communication timing control unit 126 and the inversion of the output of the comparator 123a.

In addition, the counter 123b performs A/D conversion for the pixel signal, using so-called correlated double sampling (CDS). Specifically, the counter 123b performs down counting while an analog signal corresponding to a reset component is being output from the vertical signal line VSLm under the control of the communication timing control unit 126. Then, the counter 123b performs up counting, using a count value obtained by the down counting as an initial value, while an analog signal corresponding to the pixel signal is being output from the vertical signal line VSLm.

The generated count value becomes a digital value corresponding to the difference between the signal component and the reset component. That is, the count value is a value obtained by calibrating a digital value corresponding to the analog pixel signal which is input from the pixel to the AD conversion unit 123 through the vertical signal line VSLm with the reset component.

The digital value generated by the counter 123b is stored in the latch 123c. The digital value is sequentially output from the latch 123c to the signal processing unit 127 through the horizontal signal line Ltrf under the control of the horizontal scanning unit.

Figure 6:
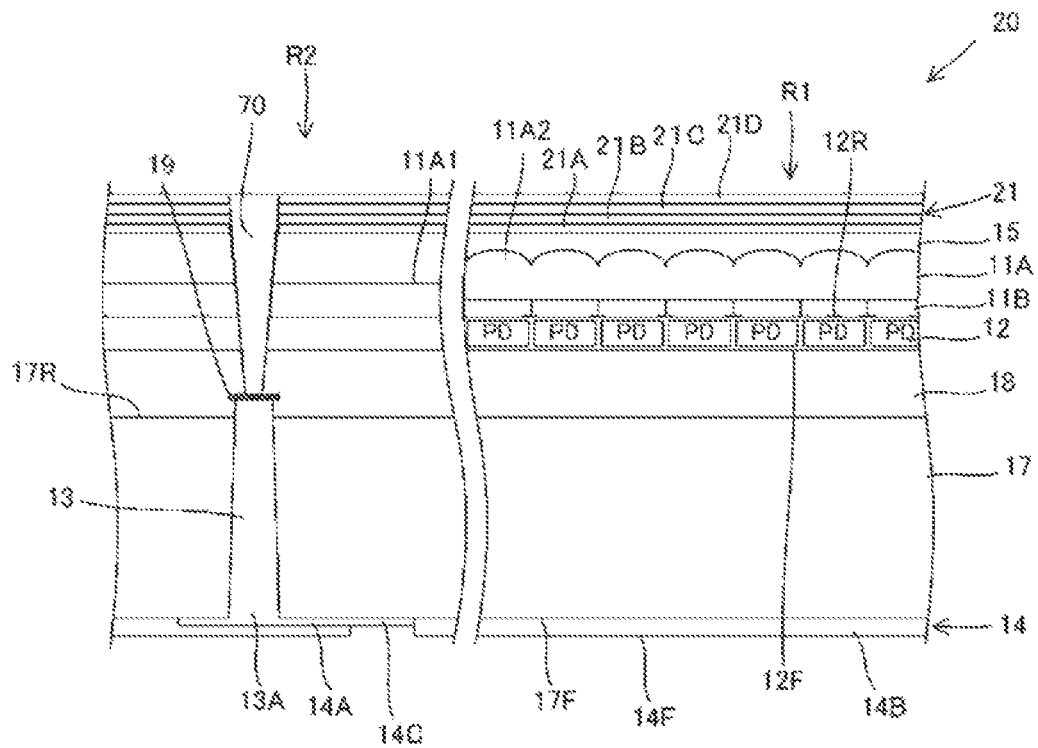
FIG. 6 is a diagram illustrating another example of the solid-state imaging element.

(B) Second Embodiment of Solid-state Imaging Element: FIG. 6 is a diagram schematically illustrating the configuration of a solid-state imaging element 20 according to this embodiment. The solid-state imaging element 20 differs from the solid-state imaging element 10 in that it includes a plurality of inorganic material layers 21 instead of the single inorganic material layer 16. As the plurality of inorganic material layers 21, an oxide other than a Si-based oxide and the Si-based oxide are stacked. For example, a TaO layer 21A, a SiO2 layer 21B, a TaO layer 21C, and a SiO layer 21D are sequentially stacked on the resin layer 15.

For the thickness of each of the plurality of inorganic material layers 21, for example, the thickness of the TaO layer 21A is 15 nm, the thickness of the SiO2 layer 21B is 32 nm, the thickness of the TaO layer 21C is 127 nm, and the thickness of the SiO layer 21D is 91 nm. Each of the plurality of inorganic material layers 21 can be formed by various methods, such as a sputtering method, a vapor deposition method, a spin coating (application) method, a laminate (film bonding) method, and a dispensing (dropping) method.

In a case where each of the plurality of inorganic material layers 21 is formed by the sputtering method, for example, each layer is formed by using a sputtering apparatus in which the distance between a target and a substrate is 10 cm to 4 cm, using a metal target, such as Ta, Nb, or Si, introducing sputtering gas (inert gas such as Ar) and reactive gas (active gas such as O2) into a chamber, performing discharge using a DC power supply or a DC pulse power supply. It is preferable that the flow rate of the sputtering gas is 10 sccm to 200 sccm and the flow rate of the active gas is 10 sccm to 100 sccm. It is desirable that pressure is 0.1 Pa to 1 Pa at the time of deposition. At the time of deposition, the flow rate of the active gas is adjusted such that a desired refractive index and a desired extinction coefficient are obtained in each of the plurality of inorganic material layers 21.

Since the plurality of inorganic material layers 21 function as an antireflection film, the effects of preventing flare and ghost, increasing the amount of transmitted light, removing unnecessary light, and reducing noise are obtained, for example.

Figure 7:
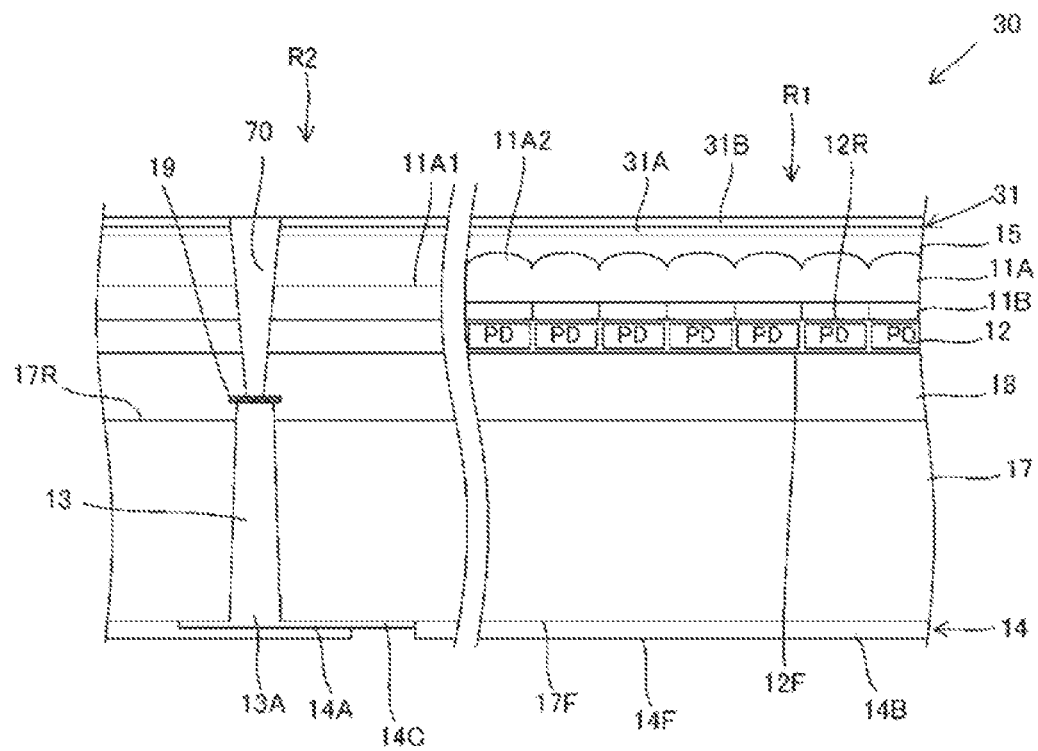
FIG. 7 is a diagram illustrating still another example of the solid-state imaging element.

(C) Third Embodiment of Solid-state Imaging Element: FIG. 7 is a diagram schematically illustrating the configuration of a solid-state imaging element 30 according to this embodiment. The solid-state imaging element 30 differs from the solid-state imaging element 10 in that it includes a plurality of inorganic material layers 31 instead of the single inorganic material layer 16. As the plurality of inorganic material layers 31, oxide layers including materials other than a Si-based material and Si-based oxide layers are stacked. For example, a NbO layer 31A and a SiO layer 31B are sequentially stacked on the resin layer 15.

For the thickness of each of the plurality of inorganic material layers 31, for example, the thickness of the NbO layer 31A is 250 nm and the thickness of the SiO layer 31B is 250 nm. Each of the plurality of inorganic material layers 31 can be formed by various methods, such as a sputtering method, a vapor deposition method, a spin coating (application) method, a laminating (film bonding) method, and a dispensing (dropping) method.

In a case where each of the plurality of inorganic material layers 31 is formed by the sputtering method, for example, each layer is formed by using a sputtering apparatus in which the distance between a target and a substrate is 10 cm to 4 cm, using a metal target, such as Nb or Si, introducing sputtering gas (inert gas such as Ar) and reactive gas (active gas such as O2) into a chamber, performing discharge using a DC power supply or a DC pulse power supply. It is preferable that the flow rate of the sputtering gas is 10 sccm to 200 sccm and the flow rate of the active gas is 10 sccm to 100 sccm. It is desirable that pressure is 0.1 Pa to 1 Pa at the time of deposition. At the time of deposition, the flow rate of the active gas is adjusted such that a desired refractive index and a desired extinction coefficient are obtained in each of the plurality of inorganic material layers 31.

Since the plurality of inorganic material layers 31 function as an antireflection film, the effects of preventing flare and ghost, increasing the amount of transmitted light, removing unnecessary light, and reducing noise are obtained, for example.

In addition, instead of the plurality of inorganic material layers 21 according to the second embodiment or the plurality of inorganic material layers 31 according to the third embodiment, a coating-type antireflection film which is made by using a material obtained by dissolving polysiloxane containing about 1% to 10% silica particles in an organic solvent may be provided.

Figure 8A:
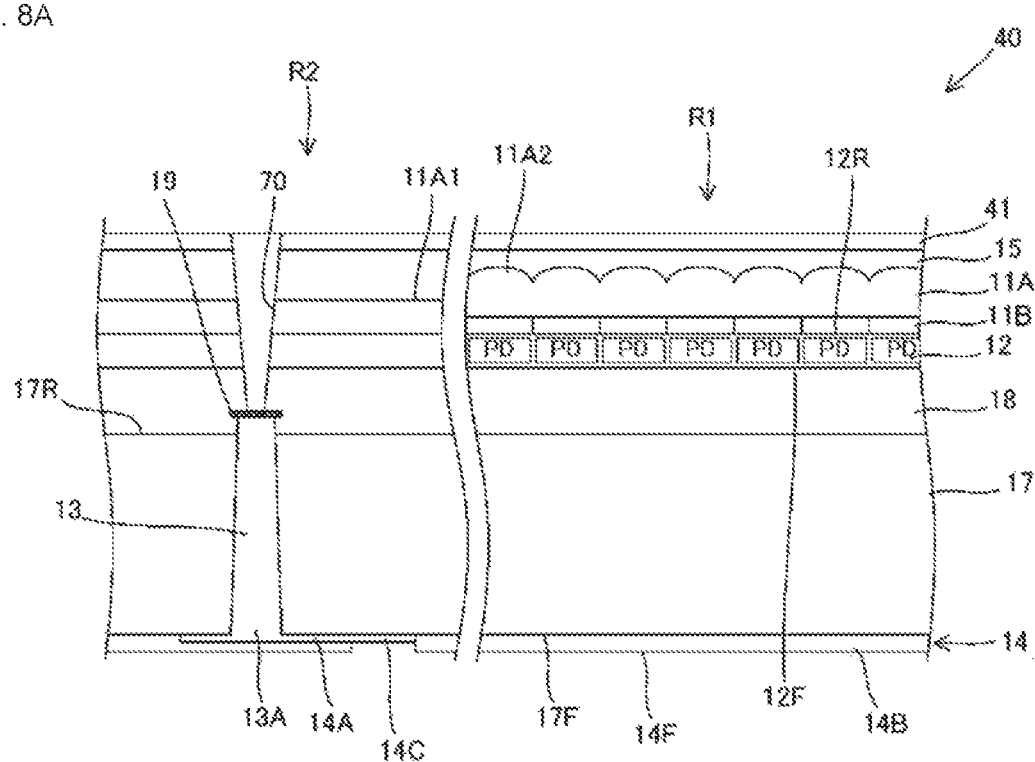
FIGS. 8A and 8B are diagrams illustrating yet another example of the solid-state imaging element.
Figure 8B:
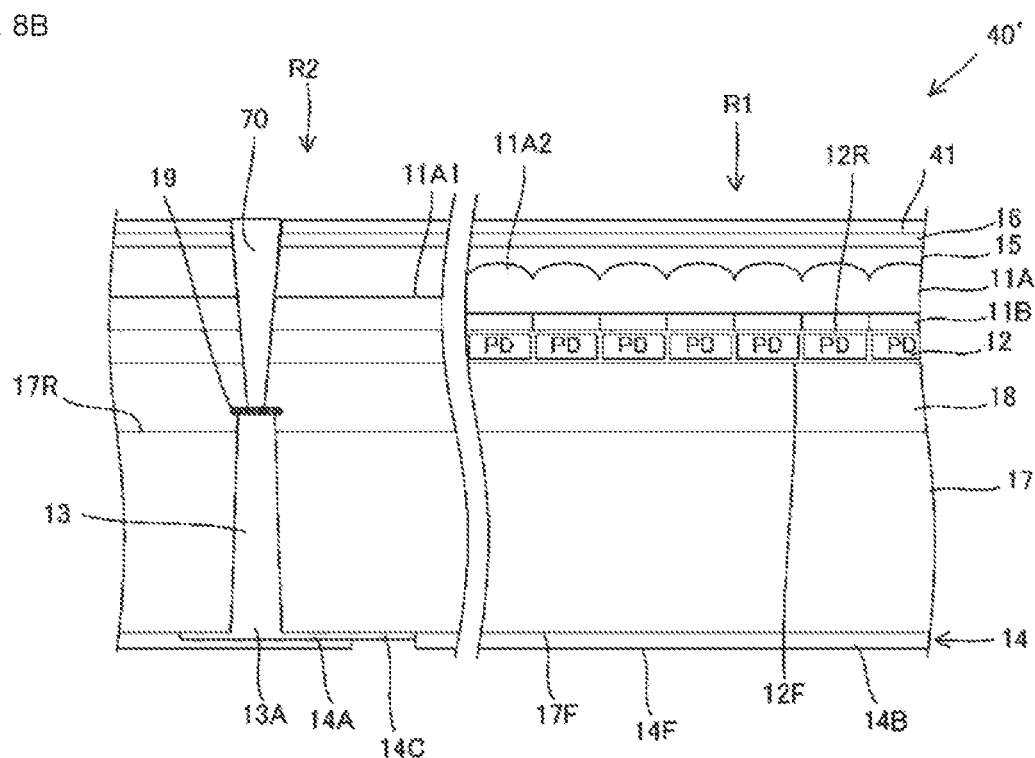

(D) Fourth Embodiment of Solid-state Imaging Element: FIGS. 8A and 8B are diagrams schematically illustrating the configuration of solid-state imaging elements 40 and 40' according to this embodiment. In (a), the solid-state imaging element 40 differs from the solid-state imaging element 10 in that an IR cut film 41 as an optical functional filter (for example, an infrared cut filter) is formed instead of the inorganic material layer 16. Further, in (b), the solid-state imaging element 40' differs from the solid-state imaging element 10 in that the IR cut film 41 as the optical functional filter (for example, an infrared cut filter) is formed on the inorganic material layer 16.

The IR cut film 41 reduces the number of infrared light components included in incident light and prevents infrared light from being incident on the solid-state imaging elements 40 and 40'. For example, an IR cut filter formed by applying a metal complex material, such as a copper complex, using a coating method, such as a spin coating method, can be used as the IR cut film 41. Further, for example, a stacked film obtained by alternately stacking a plurality of TiO layers with a thickness of about 100 nm and SiO2 layers with a thickness of about 100 nm (for example, 30 to 100 layers) using a sputtering method, a vapor deposition method, a dispensing method, or the like may be used as the IR cut film 41.

For example, the IR cut film 41 may have a structure in which two layers, that is, a short IR cut film and a long IR cut film are stacked or a plurality of short IR cut films and long IR cut films are stacked. The short IR cut film and the long IR cut film have different wavelength bands (light shielding bands) for shielding infrared light. In the light shielding band of the short IR cut film, the short IR cut film cuts a shorter wavelength band than the long IR cut film. In the light shielding band of the long IR cut film, the long IR cut film cuts a longer wavelength band than the short IR cut film. In addition, the light shielding band of the short IR cut film and the light shielding band of the long IR cut film may partially overlap each other.

As such, since the IR cut films having different light shielding bands are stacked and the wavelength band to be shielded is divided, the light shielding performance is improved.

Figure 9A:
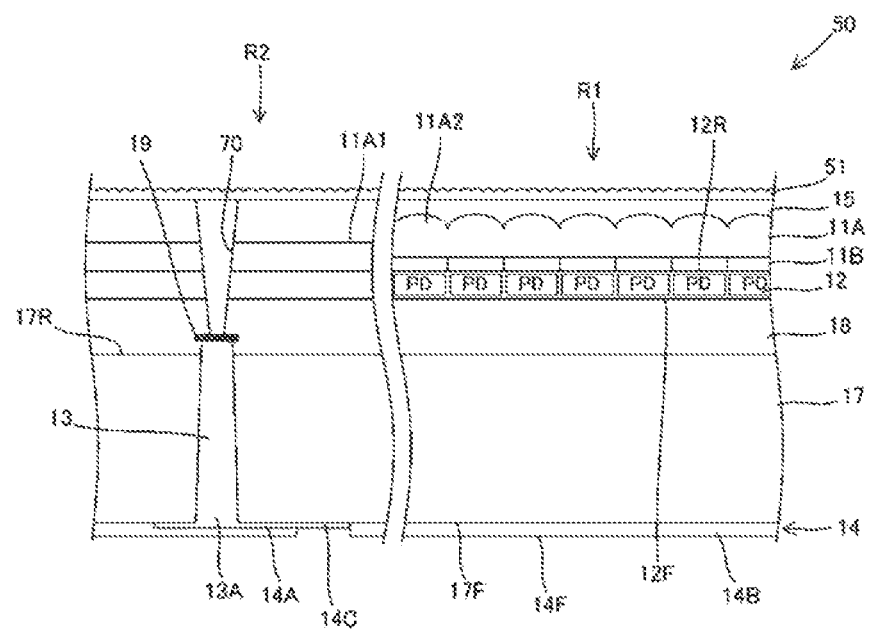
FIGS. 9A and 9B are diagrams illustrating still yet another example of the solid-state imaging element.
Figure 9B:
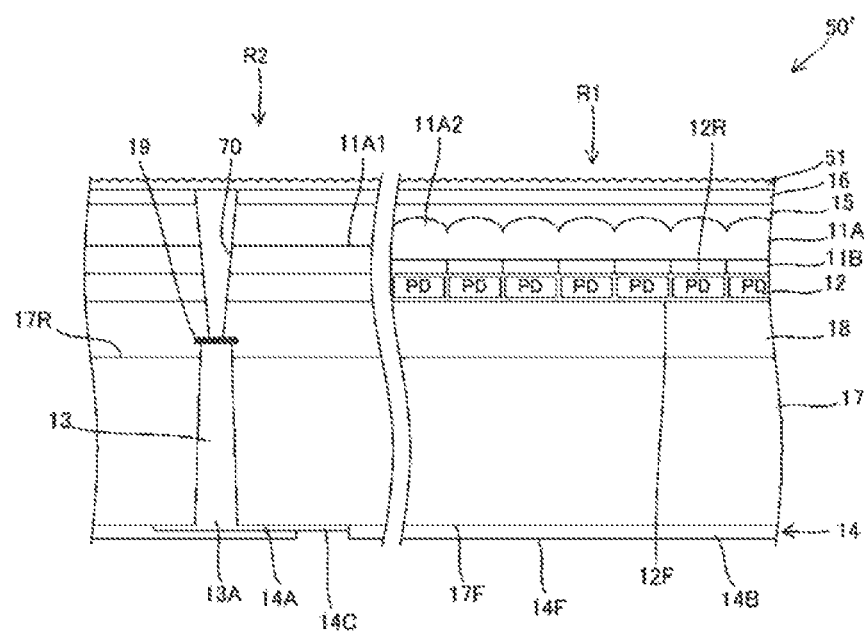

(E) Fifth Embodiment of Solid-state Imaging Element:

FIGS. 9A and 9B are diagrams schematically illustrating the configuration of solid-state imaging elements 50 and 50' according to this embodiment. In (a), the solid-state imaging element 50 differs from the solid-state imaging element 10 in that a grating structure functioning as a diffraction grating is formed instead of the inorganic material layer 16. Further, in (b), the solid-state imaging element 50' differs from the solid-state imaging element 10 in that a similar grating structure is formed on the inorganic material layer 16.

Specifically, a grating structure of a sub-wavelength grating which has a fine uneven structure with a sub-micron period shorter than a light wavelength sensed by the solid-state imaging elements 50 and 50' is formed on an upper surface of a transparent resin film 51. An example of the grating structure is a Moth-eye (registered trademark) structure in which conical projections are two-dimensionally periodically arranged. Therefore, in the front surfaces of the solid-state imaging elements 50 and 50', a structure which has a refractive index that changes continuously and does not have a specific reflecting surface is achieved and it possible to achieve a polarizing filter that reduces Fresnel reflection generated at a refractive index boundary.

(G) Method for Manufacturing Solid-state Imaging Element

FIGS. 10 to 26 are diagrams illustrating an example of a method for manufacturing the solid-state imaging element. Hereinafter, the solid-state imaging element 10 will be described as an example. However, the method can be applied to the solid-state imaging element having the inorganic material layer 21, the inorganic material layer 31, the IR cut film 41, the grating structure formed on the transparent resin film 51, or a light shielding film 62 formed on a transparent resin film 61 instead of the inorganic material layer 16.

Figure 10:
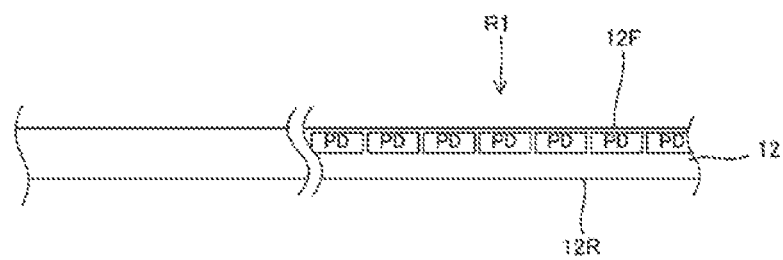
FIG. 10 is a diagram illustrating a process of a method for manufacturing the solid-state imaging element.

First, as illustrated in FIG. 10, components (for example, element separation, the photodiode PD, and a source region/drain region of the pixel transistor) of a plurality of unit pixels 11 are formed in a two-dimensional matrix in the imaging element region R1 of the semiconductor substrate 12 from the front surface 12F of the semiconductor substrate 12 so as to be two-dimensionally arranged by, for example, ion implantation. In addition, FIG. 10 illustrates only the photodiode PD. A gate electrode is stacked on each unit pixel 11, with a gate insulating film interposed therebetween.

Figure 11:
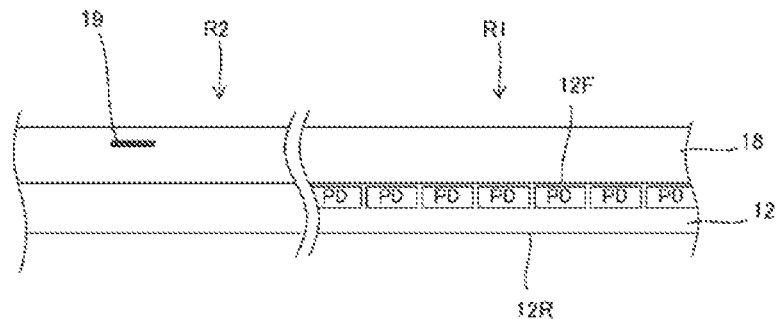
FIG. 11 is a diagram illustrating a process of the method for manufacturing the solid-state imaging element.

Then, as illustrated in FIG. 11, the wiring layer 18, in which a plurality of wiring layers are provided with interlayer insulating films interposed therebetween, is stacked on the front surface 12F of the semiconductor substrate 12. The wiring layer 18 that is formed outside the imaging element region R1 becomes the peripheral circuit region R2 in which a peripheral circuit, such as a logic circuit, is formed. An input/output pad 19 as PAD metal for outputting a signal to the outside of a chip is provided in the wiring layer 18 in the peripheral circuit region R2. An interlayer insulating film, such as a SiO2 film, is stacked on the wiring layer 18. The interlayer insulating film is planarized by chemical mechanical polishing (CMP) such that the front surface of the wiring layer 18 is formed as a substantially flat surface.

Figure 12:
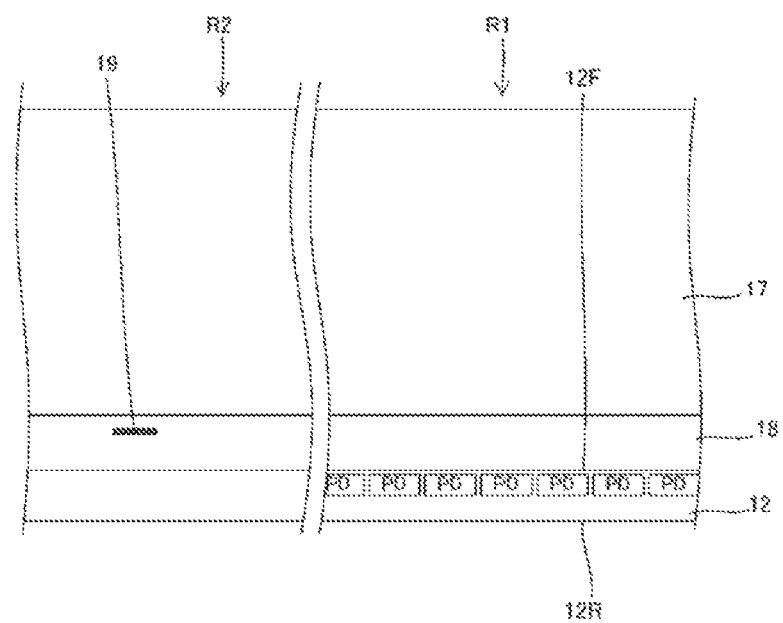
FIG. 12 is a diagram illustrating a process of the method for manufacturing the solid-state imaging element.

As illustrated in FIG. 12, the support substrate 17 is bonded to the substantially flat surface of the wiring layer 18 for reinforcement. For example, a semiconductor substrate, such as bulk silicon, is used as the support substrate 17. In addition, in a case where some or all of the peripheral circuits are formed on a peripheral circuit board that is separately manufactured, the peripheral circuit board is bonded to the front surface of the wiring layer 18 and the support substrate 17 is bonded to the upper surface of the peripheral circuit board.

Figure 13:
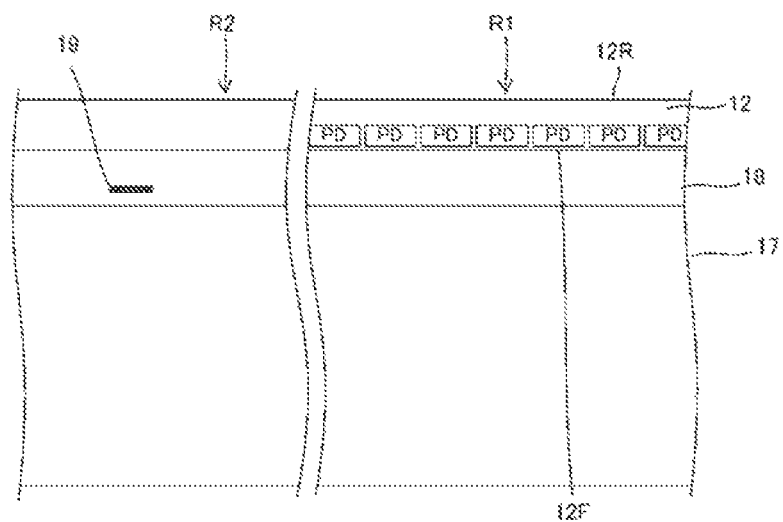
FIG. 13 is a diagram illustrating a process of the method for manufacturing the solid-state imaging element.

Then, as illustrated in FIG. 13, the semiconductor substrate 12 having the support substrate 17 bonded thereto is reversed such that the rear surface 12R of the semiconductor substrate 12 is an upper surface.

Figure 14:
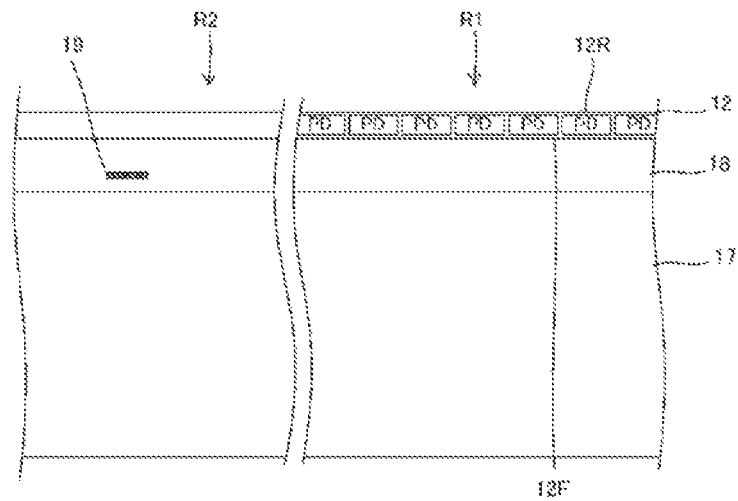
FIG. 14 is a diagram illustrating a process of the method for manufacturing the solid-state imaging element.

Then, as illustrated in FIG. 14, the semiconductor substrate 12 is removed to the vicinity of the rear surface of the photodiode PD from the rear surface 12R by grinding and polishing, if necessary. Finally, the rear surface 12R of the semiconductor substrate 12 is processed by CMP so as to be substantially flat. In addition, the final processing may also be performed by etching.

Figure 15:
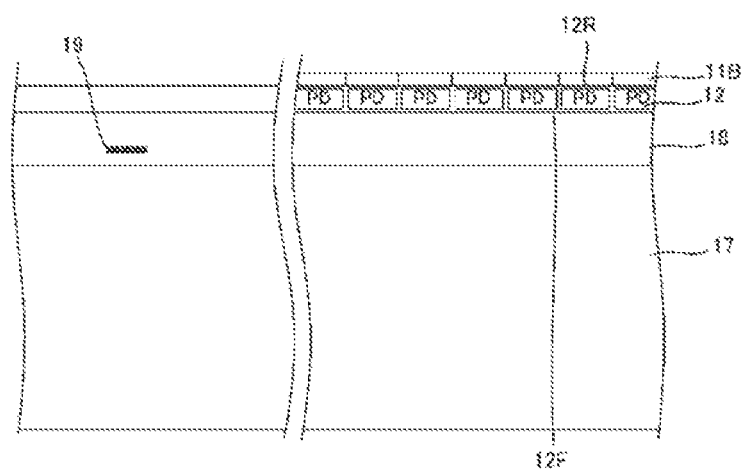
FIG. 15 is a diagram illustrating a process of the method for manufacturing the solid-state imaging element.

Then, as illustrated in FIG. 15, a transparent planarizing film (not illustrated) and the color filters 11B are formed on the rear surface 12R of the semiconductor substrate 12. For example, the planarizing film is formed by forming a thermoplastic resin film using a spin coating method and performing a thermal curing process for the thermoplastic resin film. As primary color filters including green, red, and blue filters, for example, the color filters 11B that are arranged in a Bayer array are formed on the planarizing film. The color filters 11B are formed so as to correspond to each unit pixel 11 and include color filters of three colors, that is, a red filter, a green filter, and a blue filter. The colors of the color filters 11B are not limited to three primary colors of light. For example, it is possible to use filters of complementary colors or a combination of a white color filter and the color filters. The planarizing film may be further provided on the upper surface of the color filter 11B if necessary.

Figure 16:
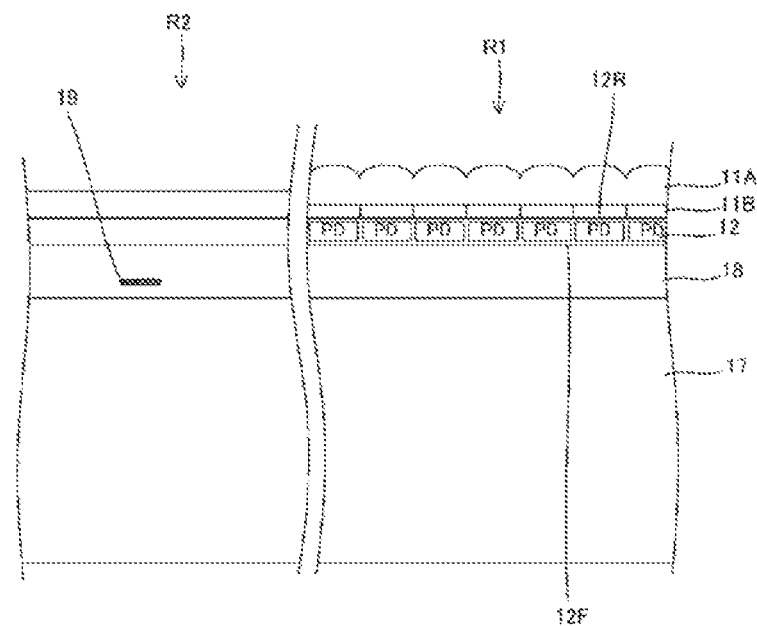
FIG. 16 is a diagram illustrating a process of the method for manufacturing the solid-state imaging element.

Then, as illustrated in FIG. 16, the on-chip lens 11A is formed on the color filter 11B. The on-chip lens 11A is formed by, for example, a method which deposits a thermosetting transparent resin material, such as an acryl-based resin material, a styrene-based resin material, or an epoxy-based resin material, using spin coating, cures the thermosetting transparent resin material, forms a resist by depositing an inorganic material, such as SiO, SiN, or SiON, using a plasma CVD method, processes the resist into a lens shape, patterns the resist, and performs etching.

Figure 17:
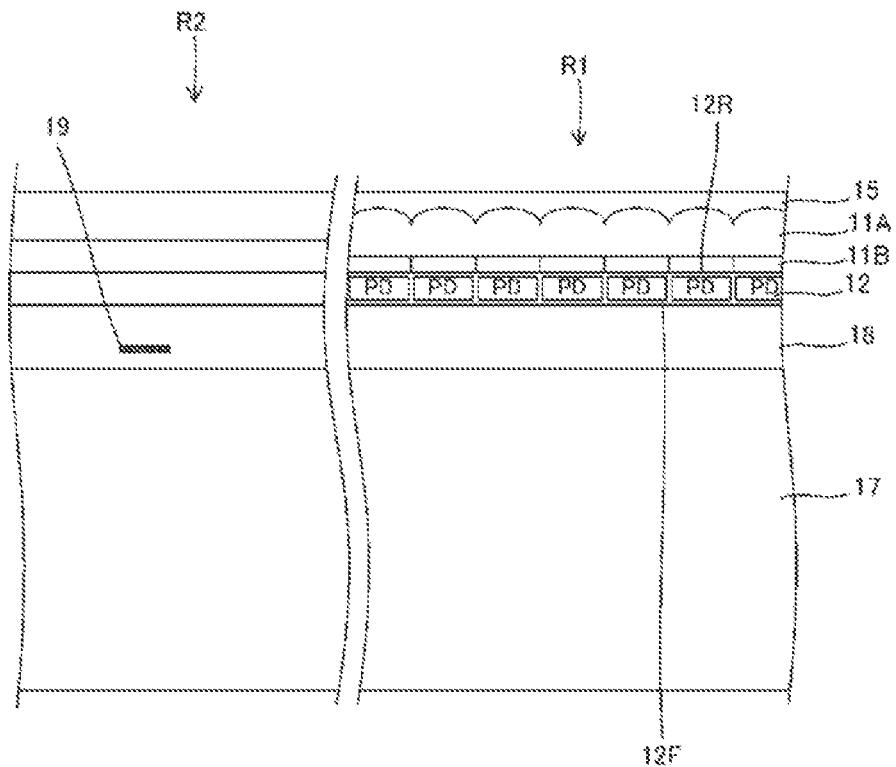
FIG. 17 is a diagram illustrating a process of the method for manufacturing the solid-state imaging element.

Then, as illustrated in FIG. 17, the resin layer 15 having a lower refractive index than the on-chip lens 11A is formed with a sufficient thickness to cover the entire uneven shape of the on-chip lenses 11A such that the on-chip lenses 11A are buried above the rear surface 12R of the semiconductor substrate 12, above which the on-chip lenses 11A are formed, over the imaging element region R1 and the peripheral circuit region R2. The resin layer 15 is formed so as to come into close contact with the entire uneven surface of a layer below the resin layer 15, such as the uneven surface of the on-chip lens 11A. Therefore, a layer boundary between the resin layer 15 with a low refractive index and the on-chip lens 11A with a high refractive index is formed between the on-chip lens 11A and the resin layer 15. The resin layer 15 is formed, for example, by applying a resin material using a spin coating method to form a film.

Figure 18:
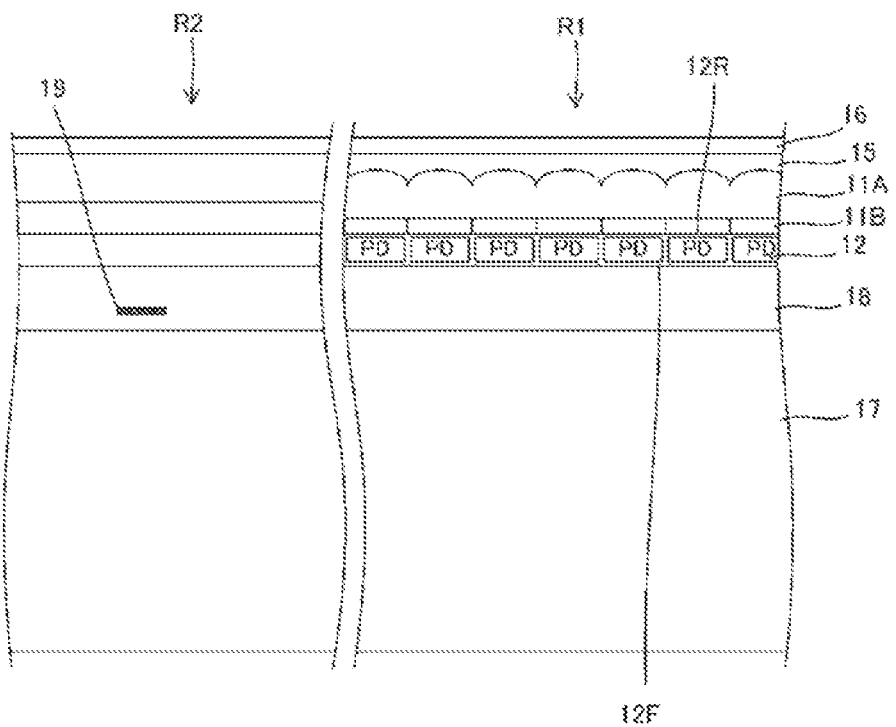
FIG. 18 is a diagram illustrating a process of the method for manufacturing the solid-state imaging element.

Then, as illustrated in FIG. 18, the inorganic material layer 16 is stacked on the resin layer 15. The inorganic material layer 16 is formed with a substantially constant thickness over the imaging element region R1 and the peripheral circuit region R2 so as to cover the entire upper surface of the resin layer 15. Therefore, the upper surface of the inorganic material layer 16 is formed so as to be substantially flat without any unevenness or the like. As a result, the possibility that the characteristics of incident light on the rear surface 12R which is the light receiving surface of the semiconductor substrate 12 will deteriorate can be reduced as much as possible by the inorganic material layer 16. The inorganic material layer 16 can be formed by, for example, a SiO2 or SiN plasma CVD method.

Figure 19:
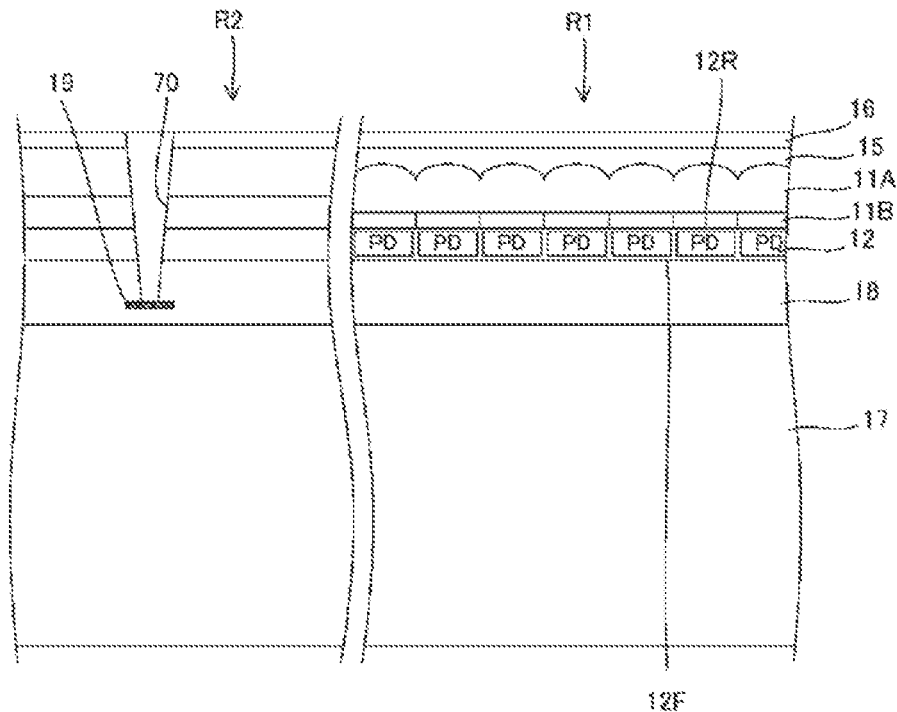
FIG. 19 is a diagram illustrating a process of the method for manufacturing the solid-state imaging element.

Then, as illustrated in FIG. 19, a through hole 70 that passes through the inorganic material layer 16, the resin layer 15, and the semiconductor substrate 12 and reaches the input/output pad 19 formed in the wiring layer or on the peripheral circuit board is formed in the peripheral circuit region R2 outside the imaging element region R1 by, for example, dry etching. A probe is inserted into the through hole 70 and comes into contact with the input/output pad 19 to perform a test, such as the checking of the operation of a peripheral circuit.

Figure 20:
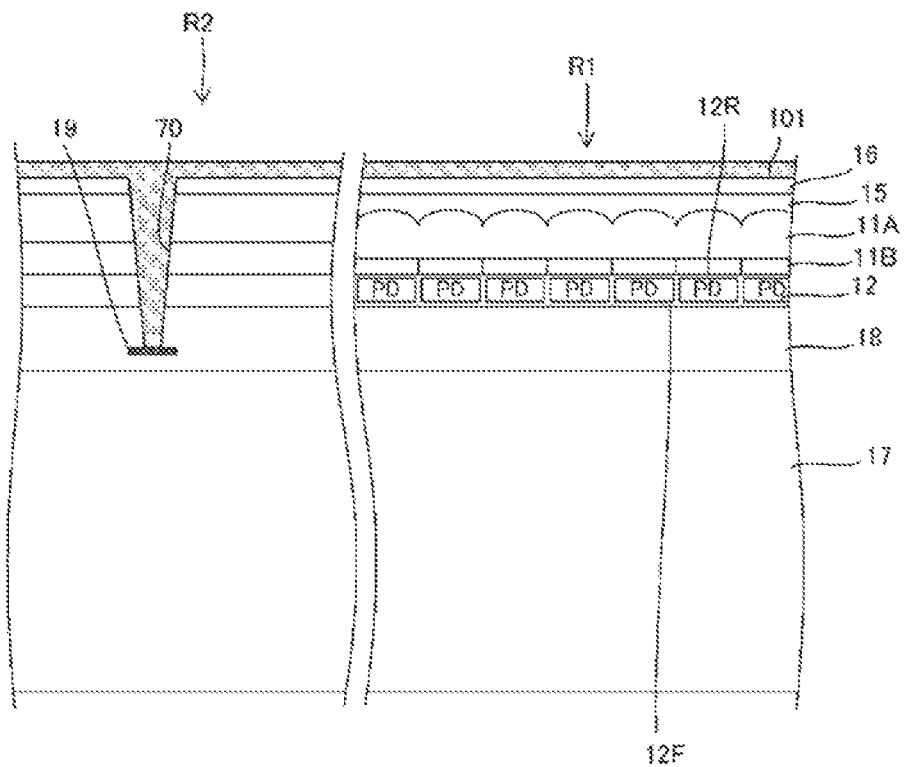
FIG. 20 is a diagram illustrating a process of the method for manufacturing the solid-state imaging element.

Then, as illustrated in FIG. 20, an adhesive layer 101 is formed on the upper surface of the inorganic material layer 16. For example, the adhesive layer 101 is formed by applying an adhesive material using a spin coating method to form a film. The adhesive material enters the through hole 70 such that the through hole 70 is filled with the adhesive material and is solidified. That is, a portion of the adhesive material that is applied onto the upper surface of the inorganic material layer 16, bonds the inorganic material layer 16 and a temporary substrate 102 which will be described later, and is solidified has a projection shape that protrudes toward the inside of the through hole 70.

Figure 21:
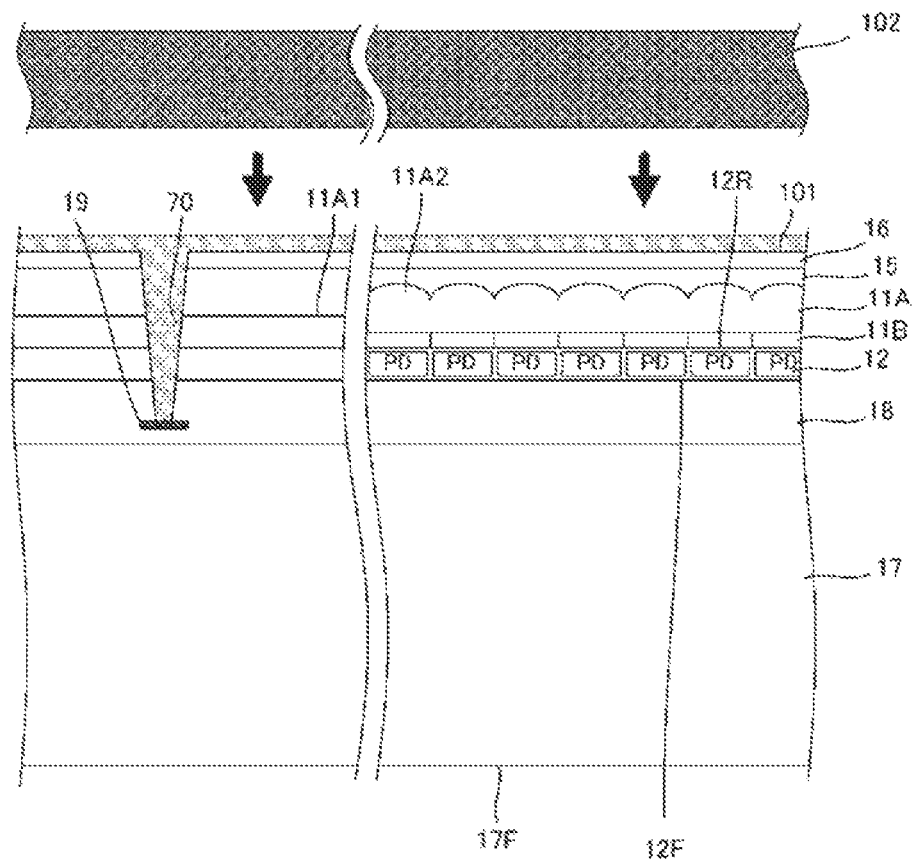
FIG. 21 is a diagram illustrating a process of the method for manufacturing the solid-state imaging element.

Then, as illustrated in FIG. 21, the temporary substrate 102 is bonded to the inorganic material layer 16 through the adhesive layer 101. Since the temporary substrate 102 is bonded to the inorganic material layer 16, the solid-state imaging element 10 that is being manufactured is reinforced, the rigidity of the entire solid-state imaging element 10 is improved, and resistance to warpage and bending is improved. The semiconductor substrate 12 or the support substrate 17 reinforced by the temporary substrate 102 is reversed such that a front surface 17F of the support substrate 17 faces upward. Therefore, it is possible to perform a process of forming the rewiring layer 14 on the front surface 17F of the support substrate 17.

Figure 22:
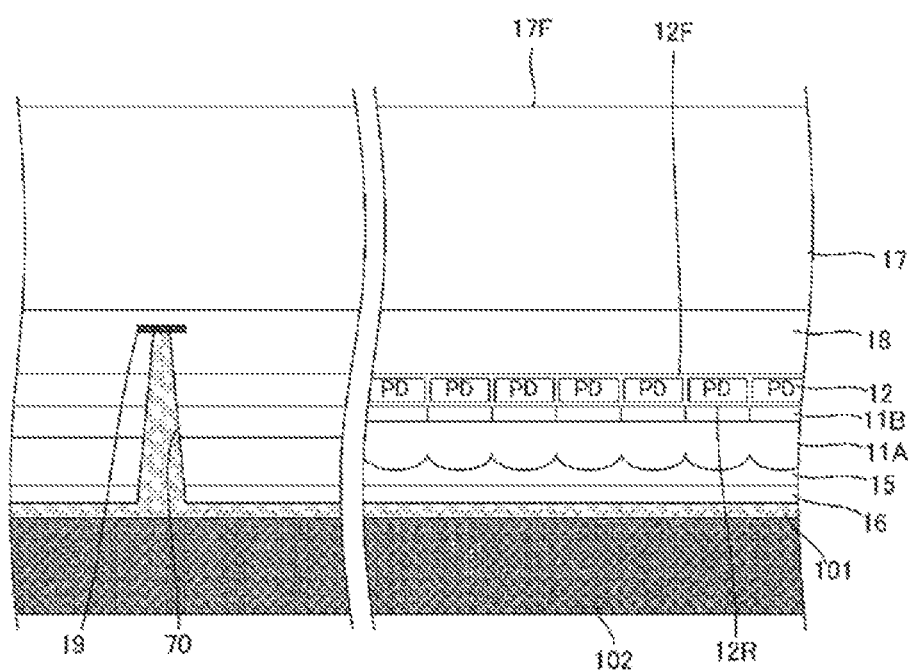
FIG. 22 is a diagram illustrating a process of the method for manufacturing the solid-state imaging element.

Then, as illustrated in FIG. 22, the support substrate 17 is ground and polished by, for example, back grinding or CMP from the front surface 17F and is thinned. Therefore, it is easy to perform a process of forming the through electrode 13 which will be described later and it is possible to reduce the overall height of the solid-state imaging element 10.

Figure 23:
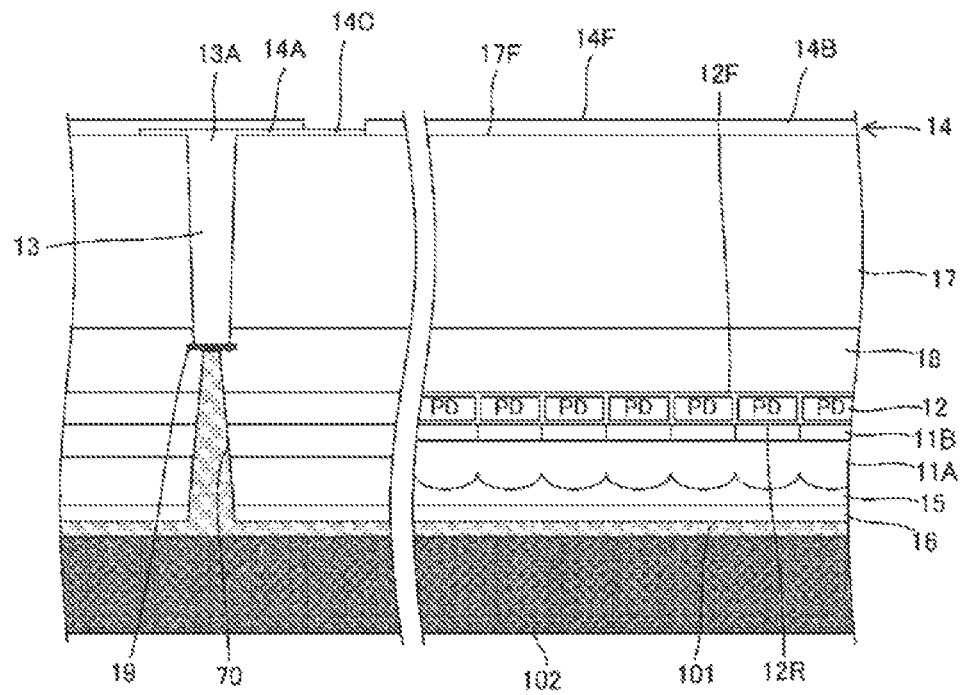
FIG. 23 is a diagram illustrating a process of the method for manufacturing the solid-state imaging element.
Figure 32:
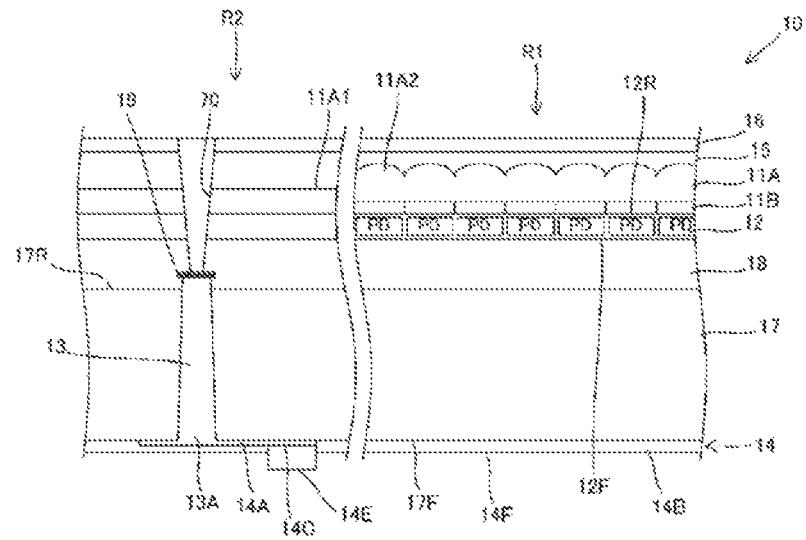
FIG. 32 is a diagram schematically illustrating another example of the solid-state imaging element according to this embodiment.

Then, as illustrated in FIG. 23, the rewiring layer 14 is formed on the front surface 17F of the thinned support substrate 17. In the formation of the rewiring layer 14, first, a through hole that passes through the support substrate 17 and reaches the input/output pad 19 is formed. Then, the through hole is filled with metal such as Cu plating to form the through electrode 13. In addition, the land 14C and the redistribution wire 14A are formed on the front surface 17F of the support substrate 17 by photolithography technique. Then, a portion other than the land 14C is covered by the solder resist 14B to insulate the redistribution wire 14A and the through electrode 13. The solder ball 14D (see FIG. 5) may be formed on the land 14C to form a BGA structure. In addition, a metal post 14E, specifically, a Cu post may be formed on the redistribution wire by electrolytic plating or electroless plating (see FIG. 32). Further, Ni/Au plating may be performed on the front surface of the Cu land to prevent oxidation. Furthermore, the connection destination of the through electrode 13 may be a wire that is used as a terminal for inputting and outputting signals from and to the outside in the peripheral circuit of the solid-state imaging element 10 and may be a portion other than the input/output pad 19.

Figure 24:
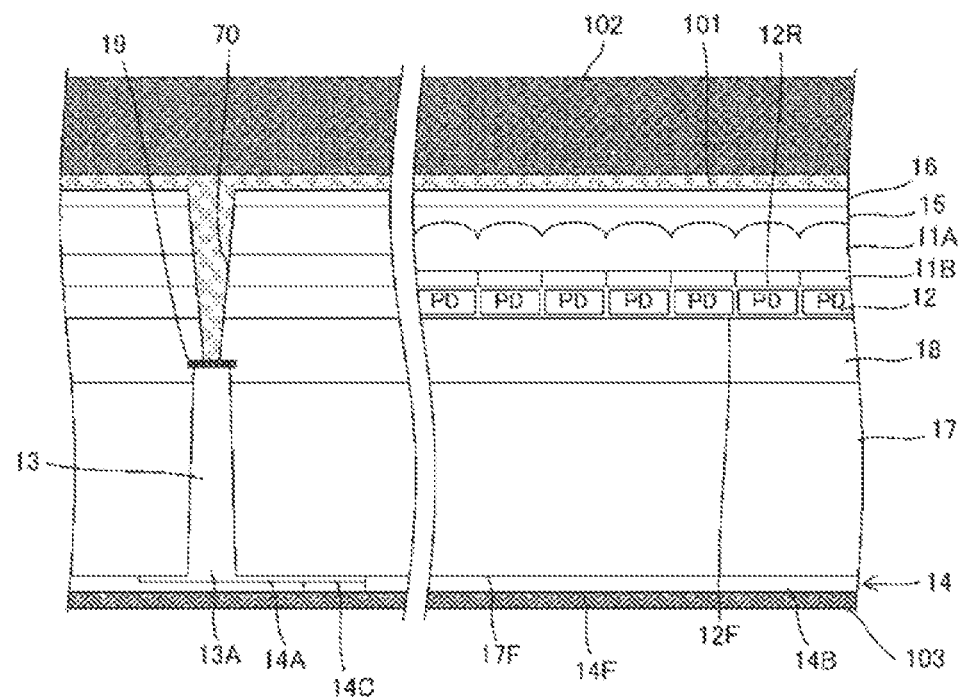
FIG. 24 is a diagram illustrating a process of the method for manufacturing the solid-state imaging element.

Then, as illustrated in FIG. 24, a dicing frame 103 is bonded to a front surface 14F of the rewiring layer 14 and the entire structure is reversed. Then, the temporary substrate 102 faces upward again.

Figure 25:
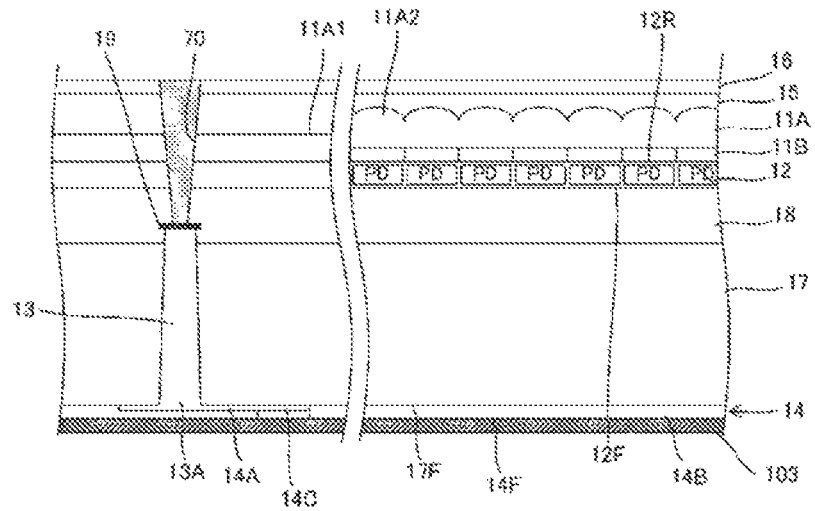
FIG. 25 is a diagram illustrating a process of the method for manufacturing the solid-state imaging element.

Then, as illustrated in FIG. 25, debonding is performed to peel the temporary substrate 102 from the solid-state imaging element 10 (inorganic material layer 16) and the adhesive layer 101 that remains on the front surface of the inorganic material layer 16 is dissolved with an organic solvent or is chemically removed by a chemical etching method. Examples of the debonding include mechanical debonding, debonding by laser emission, and debonding by heat blow. In this way, the inorganic material layer 16 is exposed. Since the inorganic material layer 16 is formed such that the front surface is flat, the possibility that the adhesive material bonded to the front surface of the inorganic material layer 16 will remain after etching is very low and it is possible to prevent a reduction in the yield of the solid-state imaging element 10 due to the fixation of the adhesive material after debonding to the front surface of the solid-state imaging element 10.

Figure 26:
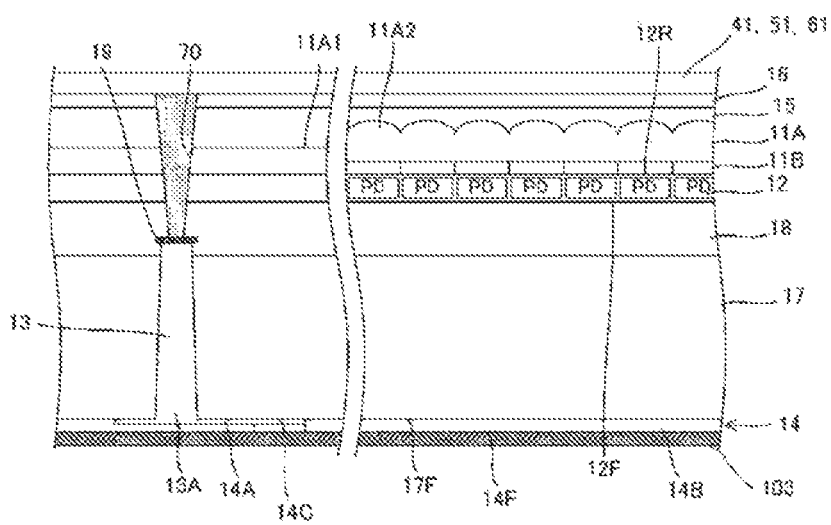
FIG. 26 is a diagram illustrating a process of the method for manufacturing the solid-state imaging element.

Then, as illustrated in FIG. 26, any one of the IR cut film 41, the transparent resin film 51, and the transparent resin film 61 is formed on the inorganic material layer 16. In addition, a grating structure that functions as a diffraction grating formed in the transparent resin film 51 or 61 or the IR cut film 41 can be formed on the exposed inorganic material layer 16.

An IR cut filter formed by applying a metal complex material, such as a copper complex, using a coating method, such as a spin coating method, can be used as the IR cut film 41. Further, for example, a stacked film obtained by alternately stacking a plurality of TiO layers with a thickness of about 100 nm and SiO2 layers with a thickness of about 100 nm (for example, 30 to 100 layers) using a sputtering method, a vapor deposition method, a dispensing method, or the like may be used as the IR cut film 41. This is similar to the fourth embodiment.

An example of the grating structure formed in the transparent resin film 51 or 61 is the Moth-eye (registered trademark) structure in which conical projections are two-dimensionally and periodically arranged. This is similar to the fifth embodiment or the sixth embodiment.

Finally, the solid-state imaging element 10 is diced into pieces along scribe lines to obtain the solid-state imaging elements 10, 20, 30, 40, 40', 50, 50', 60, and 60' according to each of the above-described embodiments.

As described above, the solid-state imaging element 10 can be protected even in a case where the temporary substrate 102 that maintains the strength of the solid-state imaging element 10 and protects the solid-state imaging element 10 is bonded and, finally, the temporary substrate 102 is peeled off to expose the inorganic material layer 16 at the time of manufacture.

In addition, since the inorganic material layer 16 which is the outermost layer is planarized, there is no residue in a case where the temporary substrate 102 is peeled off. Even in a case where a foreign material is attached to the inorganic material layer 16, the foreign material can be easily wiped off and removed. In contrast, in a case where the outermost layer is not planarized, the upper side of the outermost layer needs to be protected by a cover glass. In addition, assembly needs to be performed in a clean environment, such as a clean room, even after the cover glass is removed. In contrast, in the present technology, even in a case where a foreign material is attached, it is possible to simply wide off and remove the foreign material. Therefore, a module can be assembled in a normal environment, not in a clean environment such as a clean room.

Figure 27:
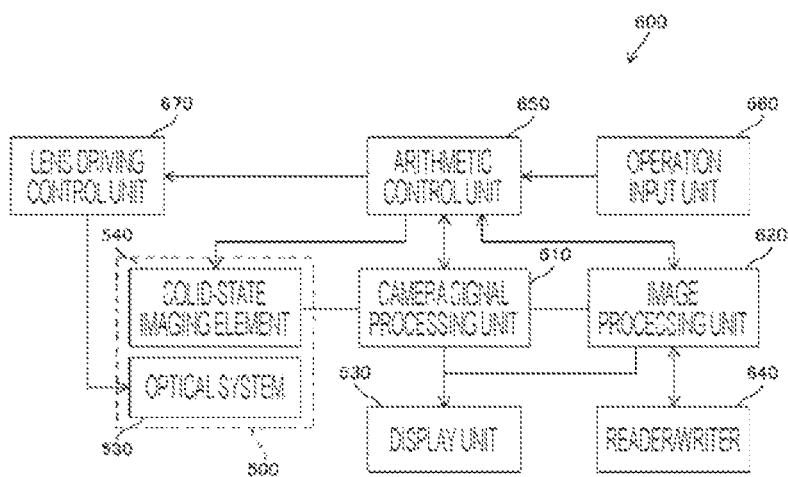
FIG. 27 is a diagram illustrating a process of the method for manufacturing the solid-state imaging element.
Figure 28:
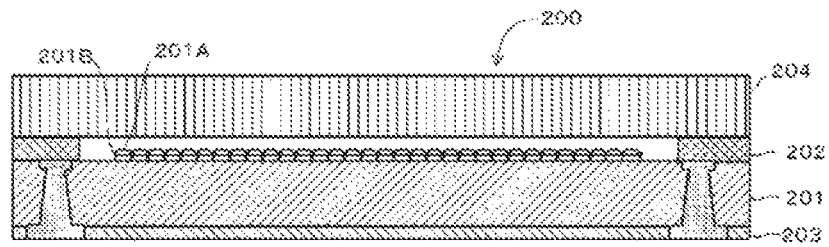
FIG. 28 is a diagram illustrating an example of a solid-state imaging element according to the related art.
Figure 29:
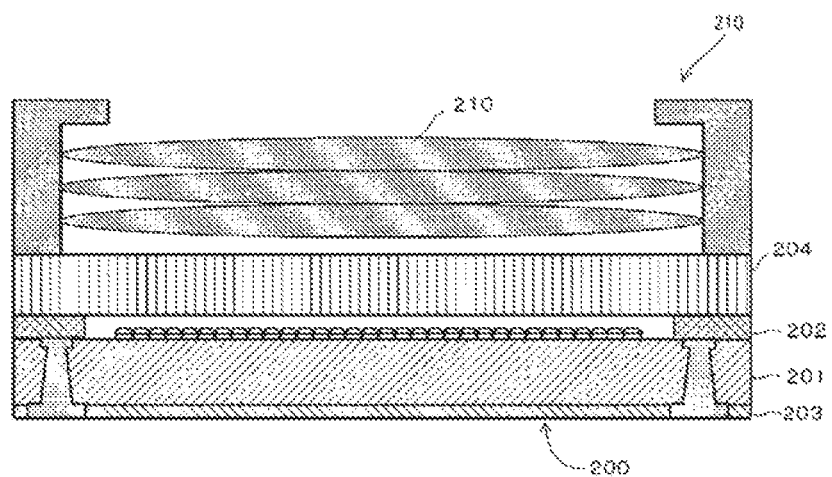
FIG. 29 is a diagram illustrating a module using the solid-state imaging element according to the related art.
Figure 30A:
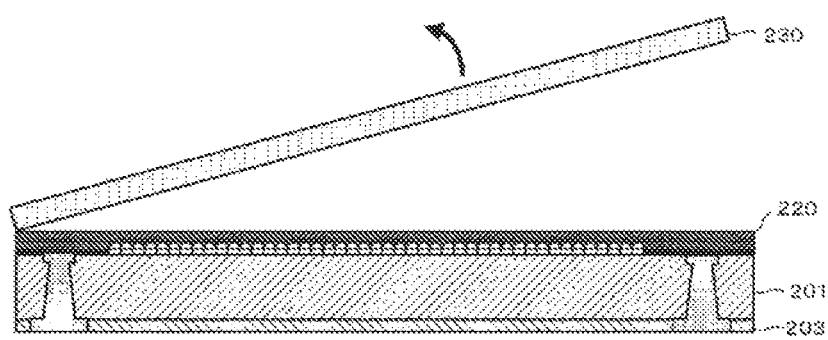
FIGS. 30A and 30B are diagrams illustrating a manufacturing process in a case where a cover glass is removed from the solid-state imaging element according to the related art.
Figure 30B:
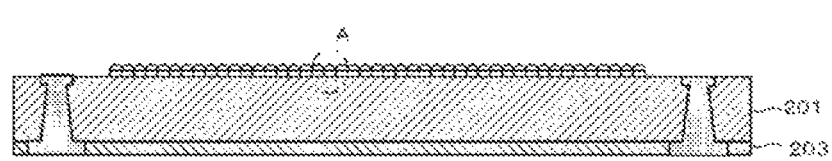
Figure 31:
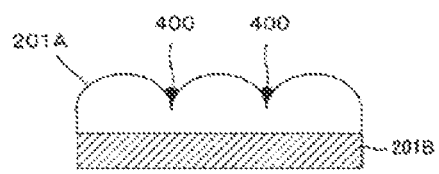
FIG. 31 is a partial enlarged view illustrating a region FIG. 30A.

(H) Embodiment of Imaging Device:

FIG. 27 is a block diagram schematically illustrating the configuration of an example of an imaging device 600 provided with an imaging module 500. The imaging device 600 is, for example, a digital still camera, a digital video camera, or a mobile phone with a camera.

The imaging device 600 includes the imaging module 500, a camera signal control unit 610, an image processing unit 620, a display unit 630, a reader/writer 640, an arithmetic processing unit 650, an operation input unit 660, and a lens driving control unit 670.

The imaging module 500 is a component with an imaging function and includes an optical system 530 that includes a lens 511 as an imaging lens and a solid-state imaging element 540 as the solid-state imaging element according to any one of the first to sixth embodiments or a solid-state imaging element according to any one of seventh to twelfth embodiments which will be described later. The solid-state imaging element 540 converts an optical image formed by the optical system 530 into an electric signal and outputs an imaging signal (image signal) corresponding to the optical image.

The camera signal control unit 610 performs various types of signal processing, such as analog/digital conversion, noise removal, image quality correction, and conversion into brightness and color difference signals, for the image signal output from the solid-state imaging element 540.

The image processing unit 620 performs a process of recording and reproducing the image signal and performs, for example, a compression encoding/decompression decoding process for the image signal based on a predetermined image data format and a conversion processing for data specification such as resolution.

The display unit 630 has a function of displaying various types of data, such as data corresponding to an operation input to the operation input unit 660 and a captured image.

The reader/writer 640 writes data to an external storage medium, such as a memory card, and reads data from the external storage medium. For example, the reader/writer 640 writes image data encoded by the image processing unit 620 to the external storage medium or reads image data stored in the external storage medium and outputs the read image data to the image processing unit 620.

The arithmetic processing unit 650 is a component functioning as a control unit that controls each circuit block of the imaging device 600 and controls each circuit block on the basis of, for example, an operation input signal from the operation input unit 660. A driver of the module 500 controls, for example, a driving motor for driving the lens 511 on the basis of a control signal from the arithmetic processing unit 650.

The operation input unit 660 includes, for example, a switch and a touch panel that is used by a user to perform a necessary operation. For example, the operation input unit 660 includes a shutter release operation element for performing a shutter operation, a selection operation element for selecting an operation mode, and the like, and outputs an operation input signal corresponding to an operation input by the user to the arithmetic processing unit 650.

Figure 33:
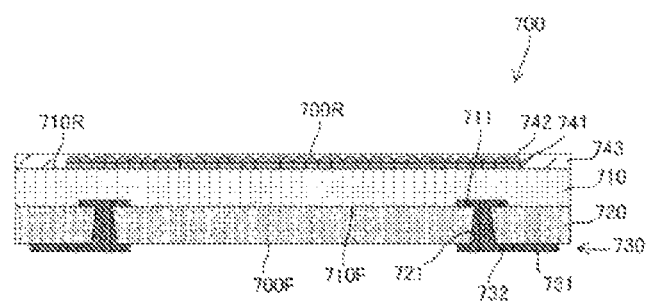
FIG. 33 is a diagram schematically illustrating the cross-sectional configuration of a solid-state imaging element according to a seventh embodiment.
Figure 34:
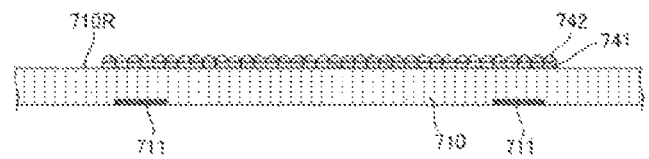
FIG. 34 is a diagram illustrating a method for manufacturing the solid-state imaging element according to the seventh embodiment.

(I) Seventh Embodiment:

FIG. 33 is a diagram schematically illustrating the cross-sectional configuration of a solid-state imaging element according to this embodiment. A solid-state imaging element 700 receives light incident from an object, performs photoelectric conversion, and outputs an electric signal corresponding to the amount of light. The solid-state imaging element 700 is a wafer-level chip size package (WLCSP) formed by a method which performs, for example, the formation of terminals and wiring before a wafer (silicon wafer) is cut and then dices the wafer.

In the solid-state imaging element 700, one layer or a plurality of layers are formed on each of a front surface 710F and a rear surface 710R of an image sensor main body portion 710 as an optical sensor chip. For example, these layers are formed by a chemical vapor deposition method, a physical vapor deposition method, a coating method, such as a spin coating method, a lithography technique, or the adhesion of a support substrate, a peripheral circuit board, or the like that has been manufactured separately.

The image sensor main body portion 710 is at least a stacked structure of a light receiving layer obtained by providing a plurality of photodiodes as photoelectric conversion elements in parallel on a semiconductor substrate, such as a silicon wafer or the like, and a wiring layer including, for example, a pixel driving line and a vertical signal line. In this embodiment, a backside-illumination-type CMOS image sensor is described as an example. A surface on the light receiving layer side is referred to as a rear surface and a surface on the wiring layer side is referred to as a front surface.

In addition, the type of image sensor main body portion 710 is not particularly limited and the image sensor main body portion 710 may be a front side illumination type or a backside illumination type. Further, the image sensor main body portion 710 be a complementary metal oxide semiconductor (CMOS) type, a charge coupled device (CCD) type, or other types. In a case where the image sensor main body portion 710 is the front side illumination type, the order in which the light receiving layer and the wiring layer are stacked is reversed and the expression of the front and rear sides is reversed.

Another substrate 720 is bonded to the front surface 710F of the image sensor main body portion 710. Examples of the substrate 720 include a peripheral circuit board on which some peripheral circuits separately manufactured are three-dimensionally stacked and a support substrate that reinforces the image sensor main body portion 710.

A rewiring layer 730 is formed on the front surface 700F of the solid-state imaging element 700. The rewiring layer 730 includes a pad 731 that is formed on the front surface of the image sensor main body portion 710 or a front surface of the substrate 720 and a redistribution wire 732 that connects a terminal and the pad 731 which are exposed from the same surface. The pad 731 is formed at a position corresponding to a connection terminal of a substrate on which the solid-state imaging element 700 is to be mounted. A through electrode 721 passes through the substrate 720 and has one end connected to the pad 711 in the image sensor main body portion 710 and the other end. The other end is illustrated as the terminal exposed from the front surface in FIG. 33.

The solid-state imaging element 700 has a flat pad structure in which no solder balls are provided on the pad 731. That is, the solid-state imaging element 700 does not pass through a process of mounting a solder ball on the pad 731 and melting the solder ball using a thermal process, such as reflow, into a hemispherical shape. Therefore, an alloy layer of tin and copper is not formed on the surface of the pad 731 of the solid-state imaging element 700 according to this embodiment at the time of the completion of the solid-state imaging element 700.

Since an alloy layer is not formed on the front surface of the pad 731 at the time of completion, the pad 731 can be formed with a thickness that is smaller than that in the related art. Specifically, in the related art, the pad is formed with a thickness of 5 μm to 10 μm. However, the pad 731 can be formed with a thickness of 5 μm or less (except 0) and can be preferably formed with a thickness of 1 μm to 2 μm or less. That is, it is possible to suppress the thickness of the rewiring layer 730 that is made by using copper (with a linear expansion coefficient of about 18 ppm/K) having a larger thermal expansion coefficient than a semiconductor substrate (in the case of the silicon substrate, a linear expansion coefficient is about 3 ppm/K) of the image sensor main body portion 710, a silicon insulating layer (a linear expansion coefficient is about 0.5 ppm/K to 0.6 ppm/K in the case of silicon oxide and is about 3 ppm/K in the case of silicon nitride) of the wiring layer, or the like.

In addition, a solder mask (a linear expansion coefficient is 20 ppm/K to 60 ppm/K) is not formed on the rewiring layer 730 of the solid-state imaging element 700 according to this embodiment. Therefore, in the front surface 700F of the solid-state imaging element 700, thermal expansion by the rewiring layer 730 made by using copper is reduced and thermal expansion by the solder mask does not occur. Therefore, it is possible to remove most of the warping factors caused by the layer provided on the front surface 700F of the solid-state imaging element 700.

In the solid-state imaging element 700, a color filter 741 and an on-chip lens 742 are sequentially stacked on the rear surface 710R which is a light receiving surface of the image sensor main body portion 710. A transparent resin layer 743 is stacked on the on-chip lens 742. In addition, other layers may be interposed between the layers of the solid-state imaging element 700.

The transparent resin layer 743 covers the on-chip lenses 742 such that the on-chip lenses 742 are buried and is formed with such a thickness that the on-chip lenses 742 is not exposed to the outside of the transparent resin layer 743. The surface of the transparent resin layer 743 is substantially flat. The on-chip lens 742 has a spherical lens that is formed on a substantially flat base portion as a hill-shape swelling. The transparent resin layer 743 is formed so as to cover all of the base portion and the spherical lens without any gap therebetween.

The transparent resin layer 743 is made by using a material having transparency, heat resistance, and the like, for example, a transparent silicone-based resin, an acryl-based resin, an epoxy-based resin, a styrene-based resin, or the like. The transparent resin layer 743 has a lower refractive index than the on-chip lens 742 and has a higher refractive index than an optical transmission medium (generally, air) outside the light receiving surface of the solid-state imaging element 700. For example, the transparent resin layer 743 has a refractive index of about 1.3 to 1.5.

Since the on-chip lenses 742 are completely covered with the transparent resin layer 743 and the front surface of the transparent resin layer 743 is substantially flat, it is possible to planarize the light receiving surface of the solid-state imaging element 700. In addition, since the transparent resin layer 743 is made by using the material that has a lower refractive index than the on-chip lens 742 and has a higher refractive index than the optical transmission medium outside the light receiving surface of the solid-state imaging element 700, it is possible to ensure a light focusing performance by the on-chip lens 742.

In this embodiment, a glass substrate is not stacked on the rear surface 700R of the solid-state imaging element 700 and only the transparent resin layer 743 is formed as a protective layer on the rear surface 700R. The various linear expansion coefficient of the glass substrate or the transparent resin layer 743 can be appropriately selected from various values. Since the warping factors of the front surface 700F of the solid-state imaging element 700 are removed, it is possible to reduce the thickness of the transparent resin layer 743 to a sufficient value to cover the on-chip lenses 742 and to planarize the front surface.

As described above, in the solid-state imaging element 700 according to this embodiment, for the rear surface 700R, the thickness of the rewiring layer 730 is less than that in the related art and a solder mask and a solder ball are not provided. For the front surface 700F, glass is not provided and only the transparent resin layer 743 with a thickness that is equal to about α+the thickness of the color filter 741 and the on-chip lens 742 is formed. In addition, the thickness of the rewiring layer 730 on the front surface 700F and the thickness of the transparent resin layer 743 on the rear surface 700R are selected such that the thermal expansion of the rewiring layer 730 and the thermal expansion of the transparent resin layer 743 are substantially balanced. Further, since no solder balls are provided, the necessary thickness of the rewiring layer 730 is significantly reduced. Therefore, the height of the solid-state imaging element 700 is significantly reduced and it is possible to achieve a structure in which warpage is less likely to occur even in a case where a thermal process is performed.

FIGS. 34 to 41 are diagrams illustrating a method for manufacturing the solid-state imaging element 700. Hereinafter, a process of providing the transparent resin layer 743 or the rewiring layer 730 on the image sensor main body portion 710 (FIG. 34), on which the color filter 741 and the on-chip lens 742, have been stacked will be described. Note that the image sensor main body portion 710 in the state illustrated in FIG. 34 can be manufactured by various known manufacturing methods. At that time, it is assumed that a plurality of image sensor main body portions 710 before division are formed on one semiconductor substrate in a two-dimensional matrix.

Figure 35:
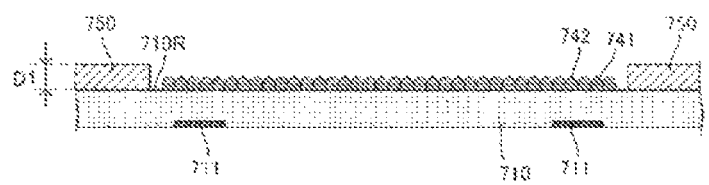
FIG. 35 is a diagram illustrating the method for manufacturing the solid-state imaging element according to the seventh embodiment.

First, as illustrated in FIG. 35, a temporary bonding resin 750 is applied on the rear surface 710R of the image sensor main body portion 710. The temporary bonding resin 750 is applied in a shape (for example, a rectangular shape) that surrounds a light receiving portion (a range in which color filters, on-chip lenses, and photodiodes are formed) and is applied in a thickness direction of the image sensor main body portion 710 so as to be deposited with a thickness D1 equal to or greater than a predetermined value. In the rear surface 710R of the image sensor main body portion 710 on which a plurality of light receiving portions are formed, the temporary bonding resin 750 is applied in a lattice shape in which a plurality of rectangular frames are continuous.

Figure 36:
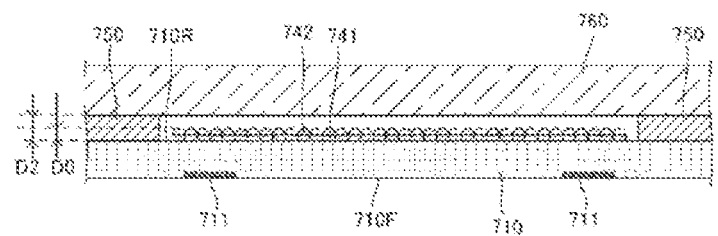
FIG. 36 is a diagram illustrating the method for manufacturing the solid-state imaging element according to the seventh embodiment.

Then, as illustrated in FIG. 36, a temporary substrate 760 (for example, a glass substrate) is placed on an upper surface of the temporary bonding resin 750 and is attached to the temporary bonding resin 750. In this state, the temporary bonding resin 750 is cured. In a case where the thickness of the cured temporary bonding resin 750 is D2 and the total thickness of the color filter 741 and the on-chip lens 742 from the upper surface of the image sensor main body portion 710 is D0, D0<D1 and D0<D2 are satisfied.

In a case where the temporary bonding resin 750 is cured, the temporary substrate 760 is held in a state in which a substrate surface is substantially parallel to the front surface 710F and the rear surface 710R of the image sensor main body portion 710 and is separated from the on-chip lenses 742 and is fixed to the image sensor main body portion 710 by the cured temporary bonding resin. Therefore, a light receiving portion of the image sensor main body portion 710 is sealed in a cavity formed by the temporary bonding resin 750, the temporary substrate 760, and the image sensor main body portion 710.

Figure 37:
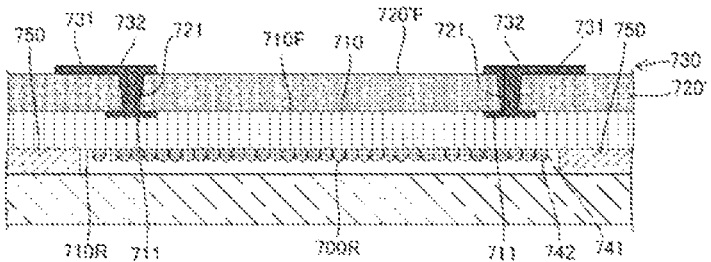
FIG. 37 is a diagram illustrating the method for manufacturing the solid-state imaging element according to the seventh embodiment.

Then, as illustrated in FIG. 37, the entire image sensor main body portion 710 reinforced by the temporary substrate 760 is reversed such that the front surface 710F of the image sensor main body portion 710 faces upward. In this state, another substrate 720' is bonded to the front surface 710F of the image sensor main body portion 710 and a through electrode 721 and a rewiring layer 730 are formed. The through electrode 721 is formed by forming a through hole that passes through the substrate 720' and reaches the pad 711 provided in the image sensor main body portion 710 and filling the through hole with metal using, for example, Cu plating. A pad 731 and a redistribution wire 732 of the rewiring layer 730 are formed on a front surface 720'F of the substrate 720' by, for example, a photolithography technique using resist patterning and a plating method.

Figure 38:
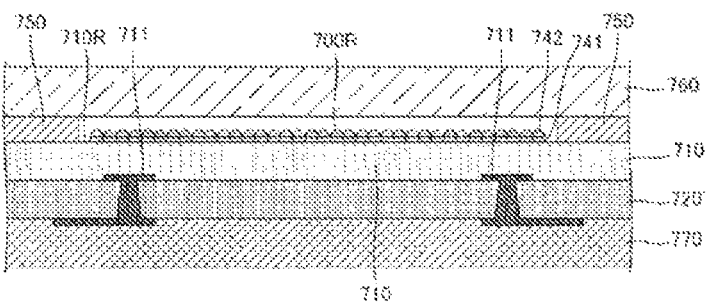
FIG. 38 is a diagram illustrating the method for manufacturing the solid-state imaging element according to the seventh embodiment.

Then, as illustrated in FIG. 38, a laminate tape 770 is bonded to the surface on which the rewiring layer 730 is formed. The laminate tape 770 with a thickness of a few hundreds of micrometers, specifically, a thickness of, for example, 400 μm to 500 μm is used. The total thickness of the image sensor main body portion 710 and the substrate 720' is about 700 μm to 900 μm. In a case where the laminate tape 770 is bonded, a total work thickness is ensured, which facilitate handling while maintaining a work state in the subsequent process. For example, in the processes before a dicing process, the holding and transportation of a wafer are stabilized, a work distance is constant, and a process variation is reduced.

Figure 39:
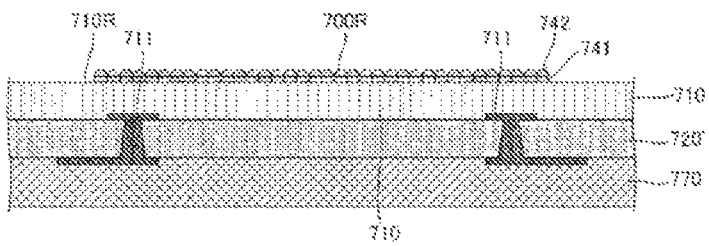
FIG. 39 is a diagram illustrating the method for manufacturing the solid-state imaging element according to the seventh embodiment.

Then, as illustrated in FIG. 39, the temporary bonding resin 750 is peeled off to remove the temporary substrate 760 from the image sensor main body portion 710.

Figure 40:
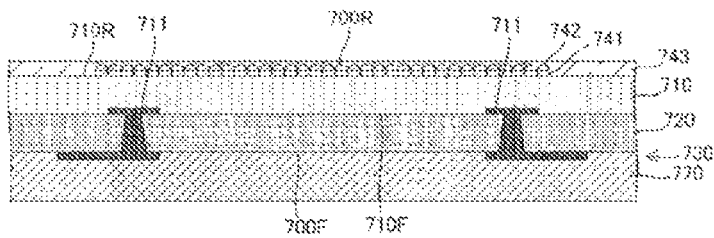
FIG. 40 is a diagram illustrating the method for manufacturing the solid-state imaging element according to the seventh embodiment.

Then, as illustrated in FIG. 40, a transparent resin layer 743 having a lower refractive index than the on-chip lens 742 is stacked on the rear surface 710R of the image sensor main body portion 710, on which the on-chip lenses 742 have been formed, with a thickness that covers the entire uneven shape of the on-chip lenses 742 such that the on-chip lenses 742 are buried over the entire surfaces of the light receiving portion and the peripheral circuit region. Since the transparent resin layer 743 is formed so as to come into close contact with an uneven portion of a layer below the transparent resin layer 743 such as an uneven portion of the on-chip lens 742, a layer boundary between the transparent resin layer 743 with a low refractive index and the on-chip lens 742 with a high refractive index is formed between the on-chip lens 742 and the transparent resin layer 743. The transparent resin layer 743 is formed by, for example, applying a resin material using a spin coating method to form a film and solidifying the film.

Then, the laminate tape 770 is peeled and removed and a work is divided into pieces on, for example, a dicing tape to obtain a plurality of solid-state imaging elements 700.

Figure 41:
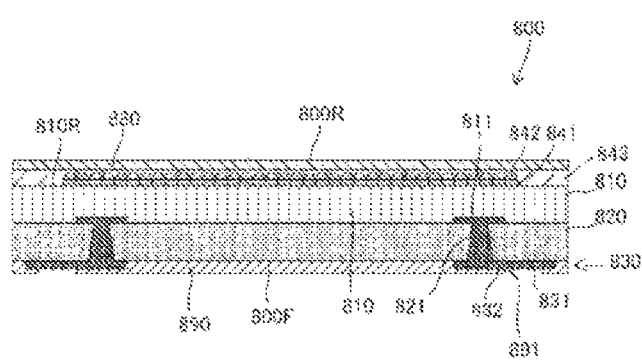
FIG. 41 is a diagram illustrating the method for manufacturing the solid-state imaging element according to the seventh embodiment.

(J) Eighth Embodiment:

FIG. 41 is a diagram schematically illustrating the cross-sectional configuration of a solid-state imaging element 800 according to this embodiment. The configuration of the solid-state imaging element 800 is similar to the configuration of the solid-state imaging element 700 except that a glass substrate 880 is stacked on and bonded to a rear surface 800R and a redistribution wire 832 provided on a front surface 800F is covered by a solder mask 890. Therefore, hereinafter, the shape of the glass substrate 880 and the solder mask 890 and a method for manufacturing the glass substrate 880 and the solder mask 890 will be mainly described and the detailed description of the other configurations will be omitted. If necessary, components are denoted by reference numerals obtained by changing the first digit "7" of the configuration of the solid-state imaging element 700 to "8" and are described.

The glass substrate 880 is bonded to a rear surface 810R of an image sensor main body portion 810 by a transparent adhesive resin. That is, a transparent adhesive resin layer 843 is interposed between the glass substrate 880 and the rear surface 810R of the image sensor main body portion 810. The transparent adhesive resin layer 843 is formed with such a thickness that an on-chip lens 742 is not exposed from the transparent adhesive resin layer 843 and color filters or on-chip lenses formed on a light receiving surface are included in the transparent adhesive resin layer 843. In addition, a surface of the transparent adhesive resin layer 843 which is opposite to the on-chip lens 842 is substantially flat since the glass substrate 880 is closely bonded to the surface by an adhesive. The transparent adhesive resin layer 843 is filled so as to cover all of a base portion and a spherical lens of the on-chip lens 842 without any gap therebetween.

A surface of the glass substrate 880 which is opposite to the transparent adhesive resin layer 843 is thinned by a glass thickness reducing method and the glass substrate 880 is thinner than a similar glass substrate used for the solid-state imaging element according to the related art.

The solder mask 890 is formed so as to cover the entire front surface 800F of the solid-state imaging element 800 including the rewiring layer 830 and is not provided in a portion corresponding to the pad 831 such that an opening 891 is formed. That is, the solder mask 890 covers the front surface 800F of the solid-state imaging element 800 except the pad 831. The thickness of the redistribution wire 832 and the pad 831 is similar to that in the seventh embodiment.

As described above, in the solid-state imaging element 800 according to this embodiment, the thickness of the rewiring layer 830 on the front surface 800F is less than that in the related art and the solder mask 890 covers the rewiring layer 830 except the pad 831. In addition, no solder balls are provided. The transparent adhesive resin layer 843 with a thickness that is equal to about α+the thickness of the color filter 841 and the on-chip lens 842 is formed on the rear surface 800R and the thinned glass substrate 880 is stacked on the transparent adhesive resin layer 843. Further, the thickness of each layer is selected such that the thermal expansion of the rewiring layer 830 including the solder mask 890 on the front surface 800F is substantially balanced with the thermal expansion of the transparent adhesive resin layer 843 and the glass substrate 880 on the rear surface 800R. In addition, since no solder balls are provided, the necessary thickness of the rewiring layer 830 is significantly reduced. Therefore, the height of the solid-state imaging element 800 is less than that in the related art and a structure in which warpage is unlikely to occur even in a case where a thermal process is performed is achieved.

FIGS. 42 to 45 are diagrams illustrating a method for manufacturing the solid-state imaging element 800. Hereinafter, a process of providing the rewiring layer 830 and the transparent adhesive resin layer 843 and the thinned glass substrate 880 which function as protective members on the image sensor main body portion 810 (see FIG. 34), on which similar color filter 841 and on-chip lens 842 to those in the seventh embodiment have been stacked, will be described.

Figure 42:
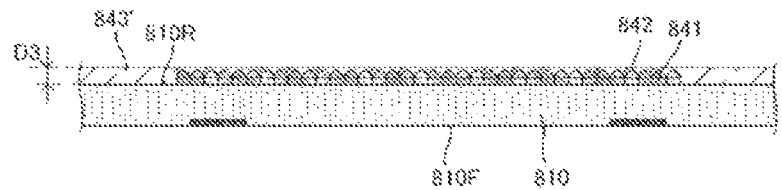
FIG. 42 is a diagram schematically illustrating the cross-sectional configuration of a solid-state imaging element according to an eighth embodiment.

First, as illustrated in FIG. 42, a transparent adhesive resin 843' is applied onto the rear surface 810R of the image sensor main body portion 810. The transparent adhesive resin 843' is applied onto the entire rear surface 810R including a light receiving portion (a range in which color filters, on-chip lenses, and photodiodes are formed) and is applied in a thickness direction of the image sensor main body portion 810 so as to be deposited with a thickness D3 equal to or greater than a predetermined value.

Figure 43:
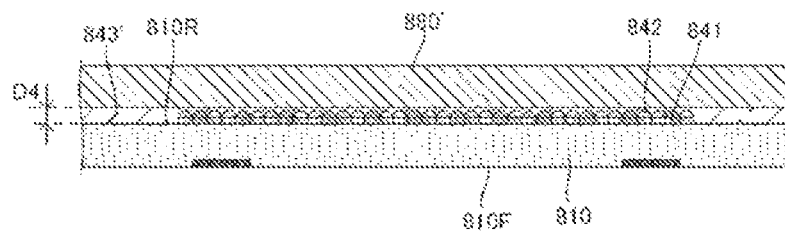
FIG. 43 is a diagram illustrating a method for manufacturing the solid-state imaging element according to the eighth embodiment.

Then, as illustrated in FIG. 43, a glass substrate 880' is placed on an upper surface of the transparent adhesive resin 843' and is attached to the transparent adhesive resin 843'. In this state, the transparent adhesive resin 843' is cured. In a case where the thickness of the transparent adhesive resin layer 843 after the transparent adhesive resin 843' is cured is D4 and the thickness of the color filter 841 and the on-chip lens 842 from the upper surface of the image sensor main body portion 810 is D0, D0<D3 and D0<D4 are satisfied.

Figure 44:
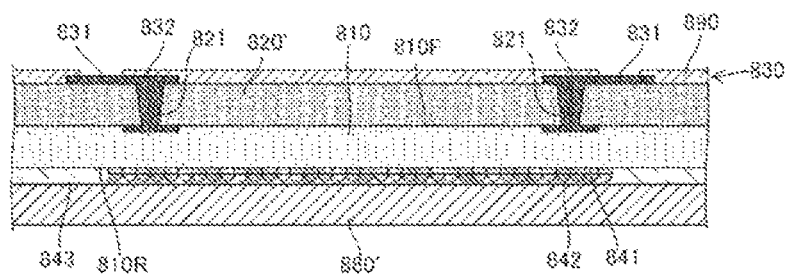
FIG. 44 is a diagram illustrating the method for manufacturing the solid-state imaging element according to the eighth embodiment.

Then, as illustrated in FIG. 44, this embodiment is similar to the seventh embodiment in that the entire image sensor main body portion 810 reinforced by the glass substrate 880' is reversed such that the front surface 810F of the image sensor main body portion 810 faces upward, another substrate 820' is bonded to the front surface 810F, and the through electrode 821 and the rewiring layer 830 are formed. The solder mask 890 that covers portions other than the pad 831 is formed on the rewiring layer 830 by, for example, a photolithography resist patterning.

Figure 45:
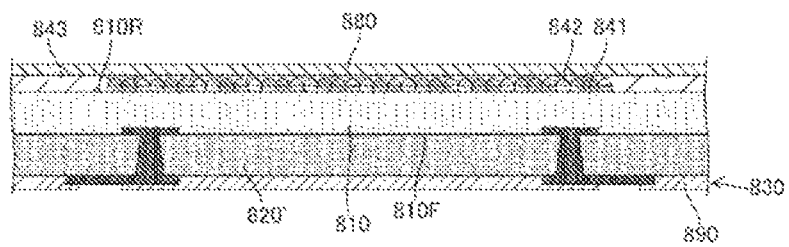
FIG. 45 is a diagram illustrating the method for manufacturing the solid-state imaging element according to the eighth embodiment.

Then, as illustrated in FIG. 45, the front surface of the glass substrate 880' is thinned by a thickness reducing means, such as grinding, polishing, or etching such that the glass substrate 880 is obtained.

Then, a work is divided into pieces on, for example, a dicing tape to obtain a plurality of solid-state imaging elements 800.

Figure 46:
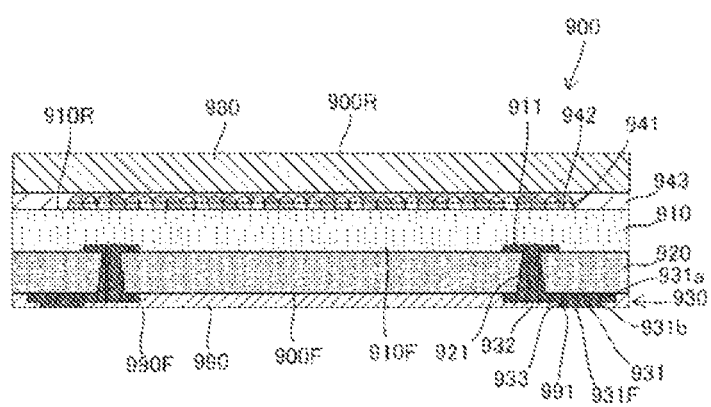
FIG. 46 is a diagram schematically illustrating the cross-sectional configuration of a solid-state imaging element according to a ninth embodiment.

(K) Ninth Embodiment:

FIG. 46 is a diagram schematically illustrating the cross-sectional configuration of a solid-state imaging element 900 according to this embodiment. The configuration of the solid-state imaging element 900 is similar to the configuration of the solid-state imaging element 800 except that a solder mask 990 covering a front surface 900F and a pad 931 exposed from an opening 991 of the solder mask 990 are formed so as to be flush with each other. Therefore, hereinafter, the shape of the pad 931 and a method for manufacturing the pad 931 will be mainly described and the detailed description of the other configurations will be omitted. If necessary, components are denoted by reference numerals obtained by changing the first digit "8" of the configuration of the solid-state imaging element 800 to "9" and are described.

The solder mask 990 is similar to that according to the eighth embodiment in that the solder mask 990 is formed so as to cover the entire front surface 900F of the solid-state imaging element 900 including a rewiring layer 930 and a portion corresponding to the pad 931 is removed such that an opening 991 is formed. The thickness of the rewiring layer 930 is similar to that in the eighth embodiment.

For a glass substrate 980, ae similar thinned glass substrate to that in the eighth embodiment may be used, a glass substrate that is not thinned and has a normal thickness may be stacked, or the glass substrate may not be provided as in the seventh embodiment.

In the solid-state imaging element 900 according to this embodiment, a front surface 990F of the solder mask 990 and a front surface 931F of the pad 931 are flush with each other and the front surface 900F of the solid-state imaging element 900 is flat. That is, the pad 931 is formed so as to be thicker than a redistribution wire 932 and a step portion 933 is formed between the redistribution wire 932 and the pad 931 on the front surface side of the redistribution wire 932 and the pad 931. That is, the pad 931 has a base portion 931a that is formed continuously with the redistribution wire 932 and has substantially the same thickness as the redistribution wire 932 and a swelling portion 931b that is stacked on the base portion 931a. Connection to a mounting destination substrate by, for example, an anisotropic conductive film is facilitated by this configuration in which a surface close to the rewiring layer 930 is planarized.

The solder mask 990 stacked on the rear side of the redistribution wire 932 has substantially the same thickness as the step portion 933 corresponding to the height of the swelling portion 931b. The solder mask 990 formed on the front side of another substrate 920 has a thickness that is substantially equal to the total thickness of the base portion 931a and the swelling portion 931b of the pad 931. It is preferable that the height of the step portion 933 is equal to or less than 5 μm (except 0).

As described above, in the solid-state imaging element 900 according to this embodiment, the thickness of the rewiring layer 930 on the rear surface 900R is less than that in the related art, the solder mask 990 covers the rewiring layer 930 except the pad 931, and no solder balls are provided. A transparent adhesive resin layer 943 with a thickness that is equal to about α+the thickness of a color filter 941 and an on-chip lens 942 is formed on the front surface 900F and the thinned glass substrate 980 is stacked on the transparent adhesive resin layer 943.

In addition, the thickness of each layer is selected such that the thermal expansion of the rewiring layer 830 including the solder mask 890 on the front surface 800F is substantially balanced with the thermal expansion of the transparent adhesive resin layer 943 and the glass substrate 980 on the rear surface 900R. Therefore, a structure in which warpage is unlikely to occur even in a case where a thermal process is performed is achieved.

Further, since no solder balls are provided, the necessary thickness of the rewiring layer 930 is significantly reduced. In addition, in a case where the pad 931 and the solder mask 990 are flush with each other, a process of wholly grinding the pad 931 and the solder mask 990 to planarize the pad 931 and the solder mask 990 is performed, which will be described later. In this case, it is possible to reduce the thickness of the entire rewiring layer 930 including the solder mask 990. Therefore, the height of the solid-state imaging element 900 can be less than that in the related art.

Figure 47:
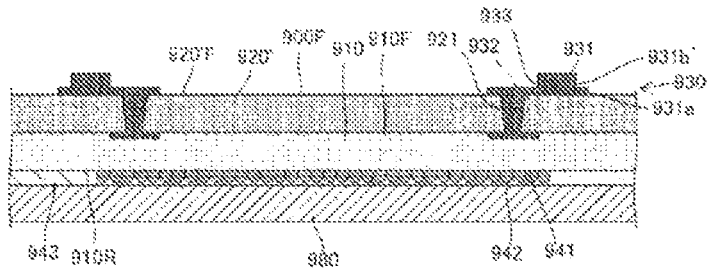
FIG. 47 is a diagram illustrating a method for manufacturing the solid-state imaging element according to the ninth embodiment.
Figure 48:
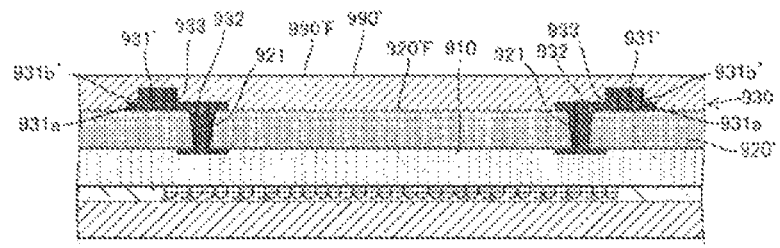
FIG. 48 is a diagram illustrating the method for manufacturing the solid-state imaging element according to the ninth embodiment.
Figure 49:
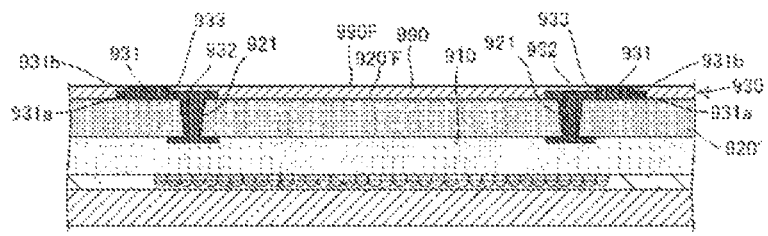
FIG. 49 is a diagram illustrating the method for manufacturing the solid-state imaging element according to the ninth embodiment.

FIGS. 47 to 49 are diagrams illustrating a method for manufacturing the solid-state imaging element 900. Hereinafter, a process of providing the rewiring layer 930 on the image sensor main body portion 910 (see FIG. 34) on which the color filter 941 and the on-chip lens 942 have been stacked will be described. A process of providing a protective member on the rear surface 910R of the image sensor main body portion 910 is performed by the same method as that described in the seventh embodiment or the eighth embodiment.

In the formation of the rewiring layer 930 of the solid-state imaging element 900 according to this embodiment, the glass substrate 980 is fixed to the rear surface of the image sensor main body portion 910 by a transparent adhesive resin 943'. Then, the entire work is reversed such that the front surface 910F of the image sensor main body portion 910 faces upward. In this state, another substrate 920' is bonded to the front surface 910F of the image sensor main body portion 910 and a through electrode 921 and the rewiring layer 930 are formed. A method for forming the through electrode 921 is similar to that in the eighth embodiment.

As illustrated in FIG. 47, the base portion 931a of the pad 931 and the redistribution wire 932 of the rewiring layer 930 are formed on a front surface 920'F of the substrate 920' by, for example, a photolithography technique using resist patterning and a plating method. In addition, similarly, a swelling portion 931b' of the pad 931 is formed on the base portion 931a by, for example, the photolithography technique using resist patterning and the plating method. The height of the swelling portion 931b' is reduced by grinding in a grinding process which will be described later. Therefore, the height of the swelling portion 931b' is slightly greater than the height of the swelling portion 931b of the solid-state imaging element 900.

Then, as illustrated in FIG. 48, a solder mask 990' covering the rewiring layer 930 is formed by, for example, a photolithography technique using resist patterning. The solder mask 990' is formed in a range and with a thickness that covers all of the surfaces of the base portion 931a and the swelling portion 931b' of the pad 931, the redistribution wire 932, and the exposed substrate 920'.

Then, as illustrated in FIG. 49, the front surface 990'F of the solder mask 990' is planarized by, for example, a back grinding method or a chemical mechanical polishing method. Grinding by the planarization is performed to the extent that at least a portion of the front surface of the swelling portion 931b' is ground and a portion of the solder mask 990 which is stacked on the redistribution wire 932 remains so as to cover the redistribution wire 932. The swelling portion 931b' and the solder mask 990' remaining after the planarization are processed so as to be flush with each other to form the swelling portion 931 and the solder mask 990, respectively.

Then, a work is divided into pieces on, for example, a dicing tape to obtain a plurality of solid-state imaging elements 900.

Figure 50:
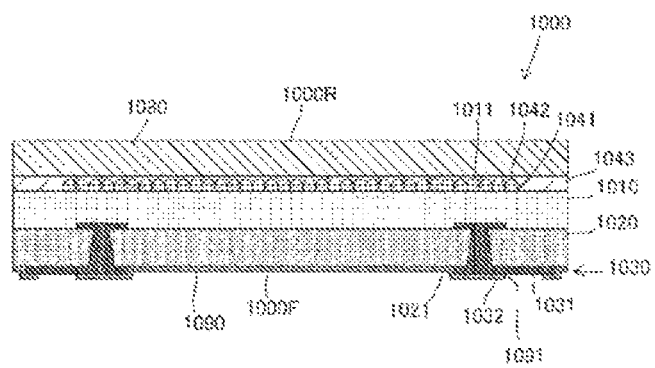
FIG. 50 is a diagram schematically illustrating the cross-sectional configuration of a solid-state imaging element according to a tenth embodiment.

(L) Tenth Embodiment:

FIG. 50 is a diagram schematically illustrating the cross-sectional configuration of a solid-state imaging element 1000 according to this embodiment. The configuration of the solid-state imaging element 1000 is similar to the configuration of the solid-state imaging element 800 except that a glass substrate 1080 is stacked on a rear surface 1000R and a redistribution wire 1032 on a front surface 1000F is not covered by a solder mask, but is covered by an inorganic insulating film 1090. Therefore, hereinafter, the shape of the inorganic insulating film 1090 and a method for manufacturing the inorganic insulating film 1090 will be mainly described and the detailed description of the other configurations will be omitted. If necessary, components are denoted by reference numerals obtained by changing the first digit "8" of the configuration of the solid-state imaging element 800 to "10" and are described.

For the glass substrate, similar thinned glass to that in the eighth embodiment may be stacked, a glass substrate that is not thinned and has a normal thickness may be stacked, or glass may not be provided as in the seventh embodiment.

The inorganic insulating film 1090 is formed so as to cover the entire front surface 1000F of the solid-state imaging element 1000 including a rewiring layer 1030 and is not provided in a portion corresponding to a pad 1031 such that an opening 1091 is formed. That is, the inorganic insulating film 1090 covers the front surface 1000F of the solid-state imaging element 1000 except the pad 1031. The thickness of the redistribution wire 1032 is similar to that in the eighth embodiment. The inorganic insulating film 1090 is made of, for example, SiO2, SiN, SiC, SiCN, SiOC, SiOCH, or the like.

As described above, in the solid-state imaging element 1000 according to this embodiment, the thickness of the rewiring layer 1030 on the rear surface 1000R is less than that in the related art and the inorganic insulating film 1090 covers the rewiring layer 1030 except the pad 1031. In addition, no solder balls are provided. A transparent adhesive resin layer 1043 with a thickness that is equal to about α+the thickness of a color filter 1041 and an on-chip lens 1042 is formed on the front surface 1000F and the glass substrate 1080 is stacked on the transparent adhesive resin layer 1043. In addition, the thickness of each layer is selected such that the thermal expansion of the rewiring layer 1030 including the inorganic insulating film 1090 on the front surface 1000F is substantially balanced with the thermal expansion of the transparent adhesive resin layer 1043 and the glass substrate 1080 on the rear surface 1000R. Further, since no solder balls are provided, the necessary thickness of the rewiring layer 1030 is significantly reduced. Therefore, the height of the solid-state imaging element 1000 is less than that in the related art and a structure in which warpage is unlikely to occur even in a case where a thermal process is performed is achieved.

Figure 51:
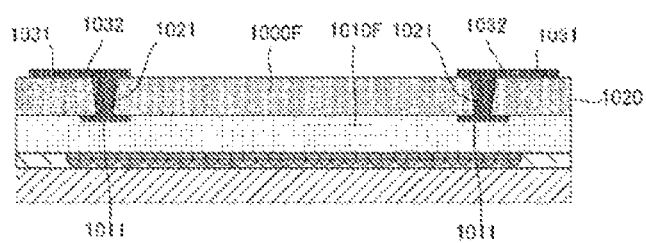
FIG. 51 is a diagram illustrating a method for manufacturing the solid-state imaging element according to the tenth embodiment.
Figure 52:
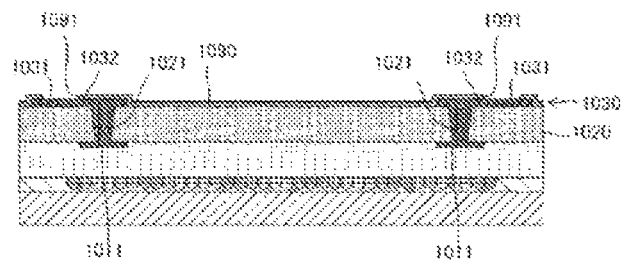
FIG. 52 is a diagram illustrating the method for manufacturing the solid-state imaging element according to the tenth embodiment.

FIGS. 51 and 52 are diagrams illustrating a method for manufacturing the solid-state imaging element 1000. Hereinafter, a process of stacking the inorganic insulating film 1090 on an image sensor main body portion 1010 having a rear surface, on which the transparent adhesive resin layer 1043 and the glass substrate 1080 functioning as protective members that cover the color filter 1041 and the on-chip lens 1042 are stacked, and as illustrated in FIG. 51, a front surface, on which the rewiring layer 1030 is formed, will be described.

An inorganic insulating film 1090' (not illustrated) is formed on the redistribution wire 1032 by, for example, a CVD method so as to cover the entire rear surface. Then, a portion of the inorganic insulating film 1090' which covers the pad 1031 is removed by a photolithography technique using resist patterning and dry etching such that the opening 1091 is formed. In this way, the inorganic insulating film 1090 having the opening 1091 is formed as illustrated in FIG. 52.

Then, a work is divided into pieces on, for example, a dicing tape to obtain a plurality of solid-state imaging elements 1000.

Figure 53:
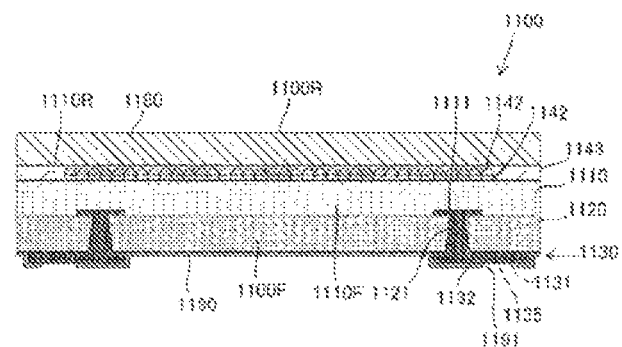
FIG. 53 is a diagram schematically illustrating the cross-sectional configuration of a solid-state imaging element according to an eleventh embodiment.

(M) Eleventh Embodiment:

FIG. 53 is a diagram schematically illustrating the cross-sectional configuration of a solid-state imaging element 1100 according to this embodiment. The configuration of the solid-state imaging element 1100 is similar to the configuration of the solid-state imaging element 1000 except that a gold layer 1135 is provided as a corrosion prevention film which covers the surface of a metal portion of a rewiring layer 1130, such as a redistribution wire 1132 or a pad 1131. Therefore, hereinafter, a method for manufacturing the gold layer 1135 will be mainly described and the detailed description of the other configurations will be omitted. If necessary, components are denoted by reference numerals obtained by changing the first digit "10" of the configuration of the solid-state imaging element 1000 to "11" and are described.

In a case where the corrosion prevention film covering the surface of the metal portion of the rewiring layer is provided as in this embodiment, it is possible to prevent poor connection at the time of secondary mounting. The corrosion prevention film is not limited to the gold layer and may be made by using metal having oxidation resistance or chemical resistance. For example, metal, such as alloys containing nickel (Ni), titanium (Ti), cobalt (Co), tantalum (Ta), and gold, may be used.

Figure 54:
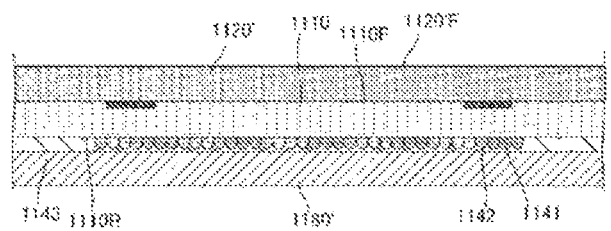
FIG. 54 is a diagram illustrating a method for manufacturing the solid-state imaging element according to the eleventh embodiment.
Figure 55:
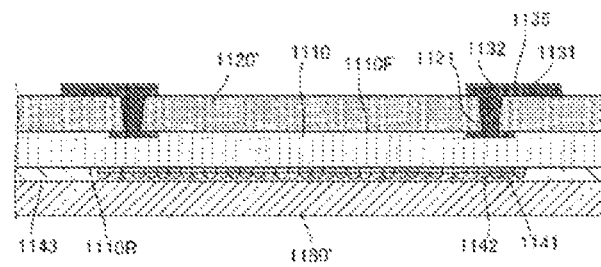
FIG. 55 is a diagram illustrating the method for manufacturing the solid-state imaging element according to the eleventh embodiment.
Figure 56:
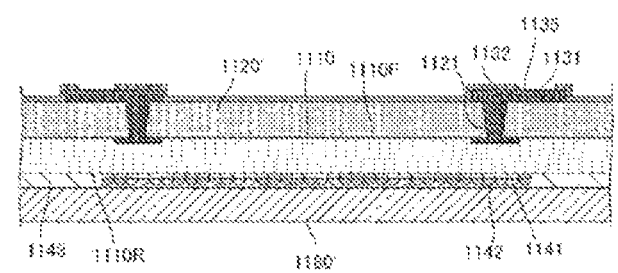
FIG. 56 is a diagram illustrating the method for manufacturing the solid-state imaging element according to the eleventh embodiment.

FIGS. 54 to 56 are diagrams illustrating a method for manufacturing the solid-state imaging element 1100. Hereinafter, a process of stacking the rewiring layer 1130 including the gold layer 1135 on an image sensor main body portion 1110 (FIG. 54) having a rear surface 1110R, on which a transparent resin layer 1143 and a glass substrate 1180 functioning as protective members that cover a color filter 1141 and an on-chip lens 1142 are stacked, and a front surface 1110F, on which another substrate 1120' is stacked, will be described.

The pad 1131 and the redistribution wire 1132 of the rewiring layer 1130 is formed on a front surface 1120'F of another substrate 1120' by, for example, a photolithography technique using resist patterning and a plating method as illustrated in FIG. 55. In addition, similarly, the gold layer 1135 covering the pad 1131 and the redistribution wire 1132 is formed on the pad 1131 and the redistribution wire 1132 by, for example, the photolithography technique using resist patterning and a plating method.

An inorganic insulating film 1190' (not illustrated) is formed on the redistribution wire 1132 by, for example, a plasma CVD method so as to cover the entire rear surface. Then, as illustrated in FIG. 56, a portion of the inorganic insulating film 1190' which covers the pad 1131 is removed by a photolithography technique using resist patterning and dry etching such that an opening 1191 is formed. In this way, an inorganic insulating film 1190 having the opening 1191 is formed. The gold layer 1135 is exposed from the opening 1191.

Then, a work is divided into pieces on, for example, a dicing tape to obtain a plurality of solid-state imaging elements 1100.

Figure 57:
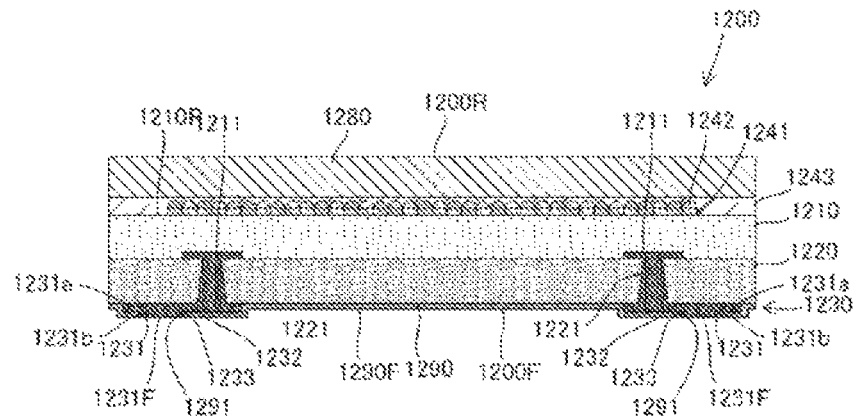
FIG. 57 is a diagram schematically illustrating the cross-sectional configuration of a solid-state imaging element according to a twelfth embodiment.

(N) Twelfth Embodiment:

FIG. 57 is a diagram schematically illustrating the cross-sectional configuration of a solid-state imaging element 1200 according to this embodiment. The configuration of the solid-state imaging element 1200 is similar to the configuration of the solid-state imaging element 900 except that a rewiring layer 1230 is not covered by a solder mask, but is covered by an inorganic insulating film 1290. Therefore, hereinafter, a method for manufacturing the rewiring layer 1230 will be mainly described and the detailed description of the other configurations will be omitted. If necessary, components are denoted by reference numerals obtained by changing the first digit "9" of the configuration of the solid-state imaging element 900 to "12" and are described. The inorganic insulating film 1290 is formed so as to cover the entire front surface 1200F of the solid-state imaging element 1200 including the rewiring layer 1230. This embodiment is similar to the tenth embodiment in that a portion of the inorganic insulating film 1290 corresponding to the pad 1231 is removed and an opening 1291 is formed.

For a glass substrate 1280, similar thinned glass to that in the eighth embodiment may be stacked, a glass substrate that is not thinned and has a normal thickness may be stacked, or the glass substrate may not be provided as in the seventh embodiment.

In the solid-state imaging element 1200 according to this embodiment, a front surface 1290F of the inorganic insulating film 1290 and a front surface 1231F of the pad 1231 are flush with each other in the vicinity of the pad 1231 and the front surface 1200F of the solid-state imaging element 1200 is flat in the vicinity of the pad 1231. That is, the pad 1231 is thicker than the redistribution wire 1232 and has a step portion 1233 between the redistribution wire 1232 and the pad 1231 on the front surface sides of the redistribution wire 1232 and the pad 1231. That is, the pad 1231 has a base portion 1231a that is formed continuously with the redistribution wire 1232 and has substantially the same thickness as the redistribution wire 1232 and a swelling portion 1231b that is stacked on the base portion 1231a. Therefore, connection to a mounting destination substrate by, for example, an anisotropic conductive film is facilitated by this configuration. The height of the step portion 1233 is preferably equal to or less than 5 μm (except 0).

The inorganic insulating film 1290 is stacked as a whole on the front side of the redistribution wire 1232 so as to cover the redistribution wire 1232 and a front surface 1220'F of another substrate 1220' with a substantially constant thickness as a whole.

As described above, in the solid-state imaging element 1200 according to this embodiment, the thickness of the rewiring layer 1230 on a rear surface 1200R is less than that in the related art and the inorganic insulating film 1290 covers the rewiring layer 1230 except the pad 1231. In addition, no solder balls are provided. A transparent adhesive resin layer 1243 with a thickness that is equal to about α+the thickness of a color filter 1241 and an on-chip lens 1242 is formed on the front surface 1200F and the glass substrate 1280 is stacked on the transparent adhesive resin layer 1243.

In addition, the thickness of each layer is selected such that the thermal expansion of the rewiring layer 1230 including the inorganic insulating film 1290 on the front surface 1200F is substantially balanced with the thermal expansion of the transparent adhesive resin layer 1243 and the glass substrate 1280 on the rear surface 1200R. Therefore, a structure in which warpage is unlikely to occur even in a case where a thermal process is performed is achieved.

Furthermore, since no solder balls are provided, the necessary thickness of the pad 1231 is significantly reduced. In addition, in a case where the pad 1231 and the inorganic insulating film 1290 are formed so as to be flush with each other, the overall thickness of the rewiring layer 1230 including the inorganic insulating film 1290 can be reduced by a process of wholly grinding the pad 1231 and the inorganic insulating film 1290 to planarize the pad 1231 and the inorganic insulating film 1290, which will be described later. Therefore, the height of the solid-state imaging element 1200 can be less than that in the related art.

Figure 58:
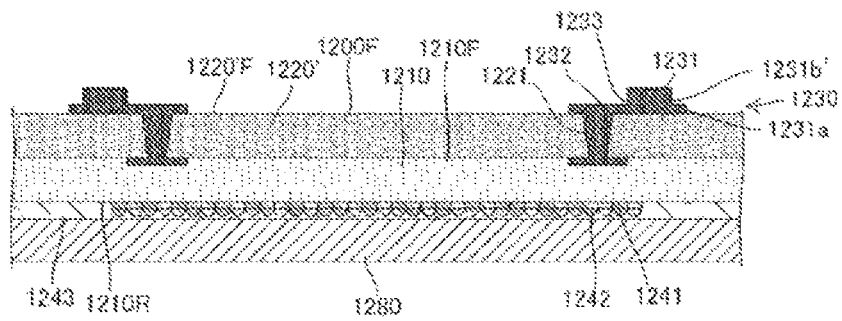
FIG. 58 is a diagram illustrating a method for manufacturing the solid-state imaging element according to the twelfth embodiment.
Figure 59:
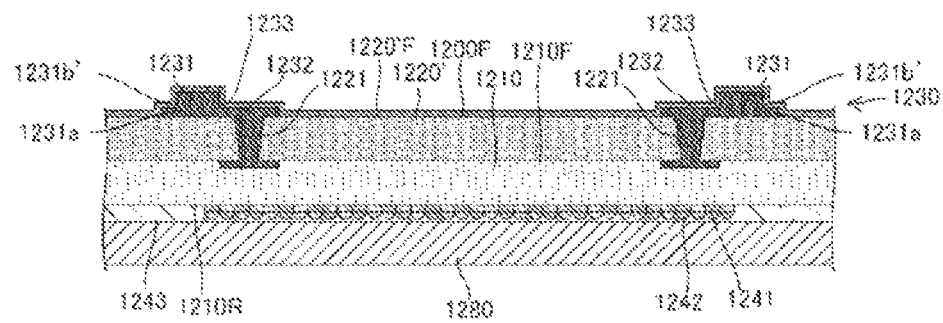
FIG. 59 is a diagram illustrating the method for manufacturing the solid-state imaging element according to the twelfth embodiment.
Figure 60:
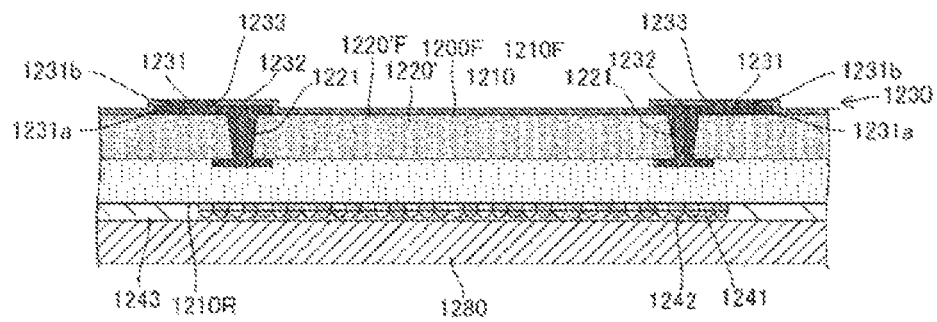
FIG. 60 is a diagram illustrating the method for manufacturing the solid-state imaging element according to the twelfth embodiment.

FIGS. 58 to 60 are diagrams illustrating a method for manufacturing the solid-state imaging element 1200. Hereinafter, a process of providing the rewiring layer 1230 on an image sensor main body portion 1210 (see FIG. 34) on which the color filter 1241 and the on-chip lens 1242 have been stacked will be described. A process of providing the transparent adhesive resin layer 1243 and the glass substrate 1280 as protective members on a rear surface 1210R of the image sensor main body portion 1210 is performed by a similar method to that in the ninth embodiment.

In the formation of the rewiring layer 1230 of the solid-state imaging element 1200 according to this embodiment, the glass substrate 1280 is fixed to the rear surface of the image sensor main body portion 1210 by a transparent adhesive resin 1243'. Then, the entire work is reversed such that the front surface 1210F of the image sensor main body portion 1210 faces upward. In this state, another substrate 1220' is bonded to the front surface 1210F of the image sensor main body portion 1210 and a through electrode 1221 and the rewiring layer 1230 are formed. A method for forming the through electrode 1221 is similar to that in the eighth embodiment.

As illustrated in FIG. 58, the base portion 1231a of the pad 1231 and the redistribution wire 1232 of the rewiring layer 1230 are formed on the front surface 1220'F of the substrate 1220' by, for example, a photolithography technique using resist patterning and a plating method as in the ninth embodiment.

Then, as illustrated in FIG. 59, an inorganic insulating film 1290' covering the rewiring layer 1230 is formed by, for example, a photolithography technique using resist patterning. The inorganic insulating film 1290' is formed in a range in which it covers all of the surfaces of the base portion 1231a and the swelling portion 1231b' of the pad 1231, the redistribution wire 1232, and the exposed substrate 1220'.

Then, as illustrated in FIG. 60, the front surfaces of the swelling portion 1231' and the inorganic insulating film 1290' in the vicinity of the swelling portion 1231' are planarized by, for example, a back grinding method or a chemical mechanical polishing method. Grinding by the planarization is performed to the extent that at least a portion of the front surface of the swelling portion 1231b' is ground and a portion of the inorganic insulating film 1290 which is stacked on the redistribution wire 1232 remains so as to cover the redistribution wire 1232. The swelling portion 1231b' and the inorganic insulating film 1290' remaining after the planarization are processed so as to be flush with each other to form the swelling portion 1231b and the inorganic insulating film 1290, respectively.

Then, a work is divided into pieces on, for example, a dicing tape to obtain a plurality of solid-state imaging elements 1200.

(O) Application Example to In-vivo Information Acquisition System:

The technology (present technology) according to the present disclosure can be applied to various products. For example, the technology according to the present disclosure may be applied to an endoscopic operation system.

Figure 61:
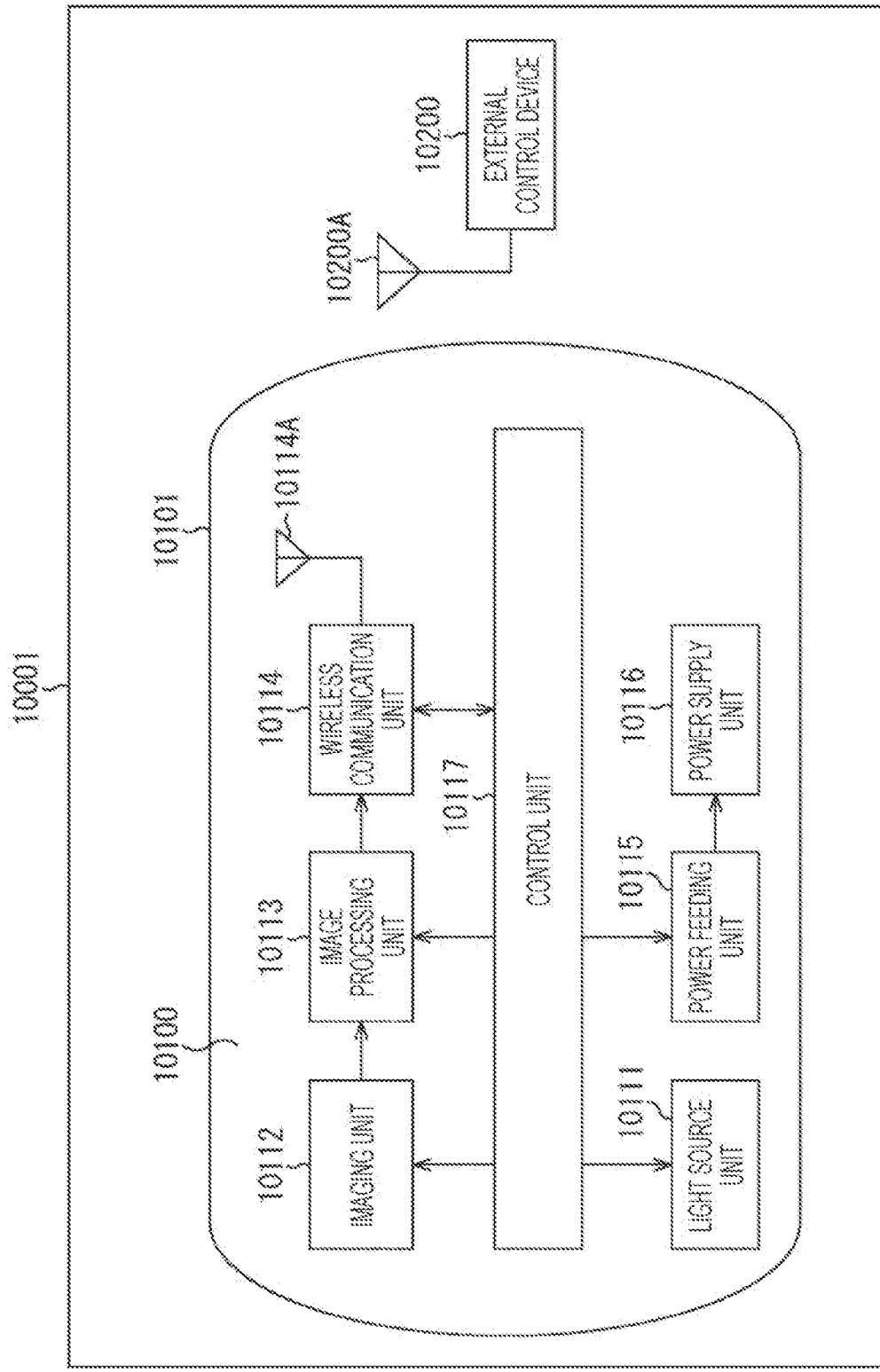
FIG. 61 is a block diagram illustrating an example of the schematic configuration of an in-vivo information acquisition system.

FIG. 61 is a block diagram illustrating an example of the schematic configuration of a patient in-vivo information acquisition system using a capsule-type endoscope to which the endoscopic (present technology) according to the present disclosure can be applied.

An in-vivo information acquisition system 10001 includes a capsule-type endoscope 10100 and an external control device 10200.

The patient swallows the capsule-type endoscope 10100 at the time of examination. The capsule-type endoscope 10100 has an imaging function and a wireless communication function, sequentially captures the internal images of the organs (hereinafter, referred to as in-vivo images), such as the stomach and the intestines, at predetermined intervals while peristaltically moving in the organs, for example, and sequentially wirelessly transmits information related to the in-vivo images to the external control device 10200 outside the body until it is naturally excreted from the patient.

The external control device 10200 controls the overall operation of the in-vivo information acquisition system 10001. In addition, the external control device 10200 receives the information related to the in-vivo image transmitted from the capsule-type endoscope 10100 and generates image data for displaying the in-vivo image on a display device (not illustrated) on the basis of the received information related to the in-vivo image.

In the in-vivo information acquisition system 10001, this configuration makes it possible to obtain an in-vivo image obtained by capturing the in-vivo aspect of the patient at any time until the capsule-type endoscope 10100 swallowed by the patient is excreted.

The configuration and functions of the capsule-type endoscope 10100 and the external control device 10200 will be described in detail.

The capsule-type endoscope 10100 includes a capsule-type housing 10101. A light source unit 10111, an imaging unit 10112, an image processing unit 10113, a wireless communication unit 10114, a power feeding unit 10115, a power supply unit 10116, and a control unit 10117 are accommodated in the housing 10101.

The light source unit 10111 is, for example, a light source, such as a light emitting diode (LED), and emits light in the field of view of the imaging unit 10112.

The imaging unit 10112 is an optical system including an imaging element and a plurality of lenses that are provided in front of the imaging element. The reflected light (hereinafter, referred to as observation light) of light emitted to a body tissue which is an observation target is focused by the optical system and is incident on the imaging element. In the imaging unit 10112, the imaging element performs photoelectric conversion for the incident observation light and an image signal corresponding to the observation light is generated. The image signal generated by the imaging unit 10112 is provided to the image processing unit 10113.

The image processing unit 10113 is a processor, such as a central processing unit (CPU) or a graphics processing unit (GPU), and performs various types of signal processing for the image signal generated by the imaging unit 10112. The image processing unit 10113 provides the image signal subjected to the signal processing as RAW data to the wireless communication unit 10114.

The wireless communication unit 10114 performs a predetermined process, such as a modulation process, for the image signal subjected to the signal processing by the image processing unit 10113 and transmits the image signal to the external control device 10200 through an antenna 10114A. In addition, the wireless communication unit 10114 receives a control signal related to the control of the driving of the capsule-type endoscope 10100 from the external control device 10200 through the antenna 10114A. The wireless communication unit 10114 provides the control signal received from the external control device 10200 to the control unit 10117.

The power feeding unit 10115 includes, for example, an antenna coil for receiving power, a power regeneration circuit that regenerates power from a current generated in the antenna coil, and a booster circuit. The power feeding unit 10115 generates power using a so-called non-contact charging principle.

The power supply unit 10116 is a secondary battery and accumulates power generated by the power feeding unit 10115. In FIG. 61, for example, an arrow indicating the supply destination of power from the power supply unit 10116 is not illustrated in order to avoid the complication of the drawings. However, the power accumulated in the power supply unit 10116 is supplied to the light source unit 10111, the imaging unit 10112, the image processing unit 10113, the wireless communication unit 10114, and the control unit 10117 and can be used to drive these units.

The control unit 10117 is a processor, such as a CPU, and appropriately controls the driving of the light source unit 10111, the imaging unit 10112, the image processing unit 10113, the wireless communication unit 10114, and the power feeding unit 10115 according to the control signal transmitted from the external control device 10200.

The external control device 10200 is a processor, such as a CPU or a GPU, a microcomputer which is a mixture of a processor and a storage element, such as a memory, a control substrate, or the like. The external control device 10200 transmits a control signal to the control unit 10117 of the capsule-type endoscope 10100 through an antenna 10200A to control the operation of the capsule-type endoscope 10100. In the capsule-type endoscope 10100, for example, the light emission conditions of the light source unit 10111 to an observation target can be changed by a control signal from the external control device 10200. In addition, imaging conditions (for example, the frame rate, exposure value of the imaging unit 10112, and the like) can be changed by a control signal from the external control device 10200. Further, the content of the process of the image processing unit 10113 or the image signal transmission conditions (for example, a transmission interval, the number of images transmitted, and the like) of the wireless communication unit 10114 may be changed by a control signal from the external control device 10200.

In addition, the external control device 10200 performs various types of image processing for the image signal transmitted from the capsule-type endoscope 10100 and generates image data for displaying the captured in-vivo image on the display device. For example, various types of signal processing, such as a development process (demosaicing process), a process of improving image quality (a band enhancement process, super-resolution processing, a noise reduction (NR) process, and/or a camera shake correction process, for example), and/or an enlargement process (electronic zoom process) can be performed as the image processing. The external control device 10200 controls the driving of the display device such that the captured in-vivo image is displayed on the basis of the generated image data. Alternatively, the external control device 10200 may direct a recording device (not illustrated) to record the generated image data or may direct a printing device (not illustrated) to print out the image data.

An example of the in-vivo information acquisition system to which the technology according to the present disclosure can be applied has been described above. The technology according to the present disclosure can be applied to the imaging unit 10112 among the above-mentioned configurations. Specifically, the solid-state imaging elements or the imaging devices in each of the above-described embodiments can be applied to the imaging unit 10112. In a case where the technology according to the present disclosure is applied to the imaging unit 10112, it is possible to reduce the size and height of the capsule-type endoscope 10100. Therefore, it is possible to further reduce a burden on the patient.

(P) Application Example to Endoscopic Operation System:

The technology (present technology) according to the present disclosure can be applied to various products. For example, the technology according to the present disclosure may be applied to an endoscopic operation system.

Figure 62:
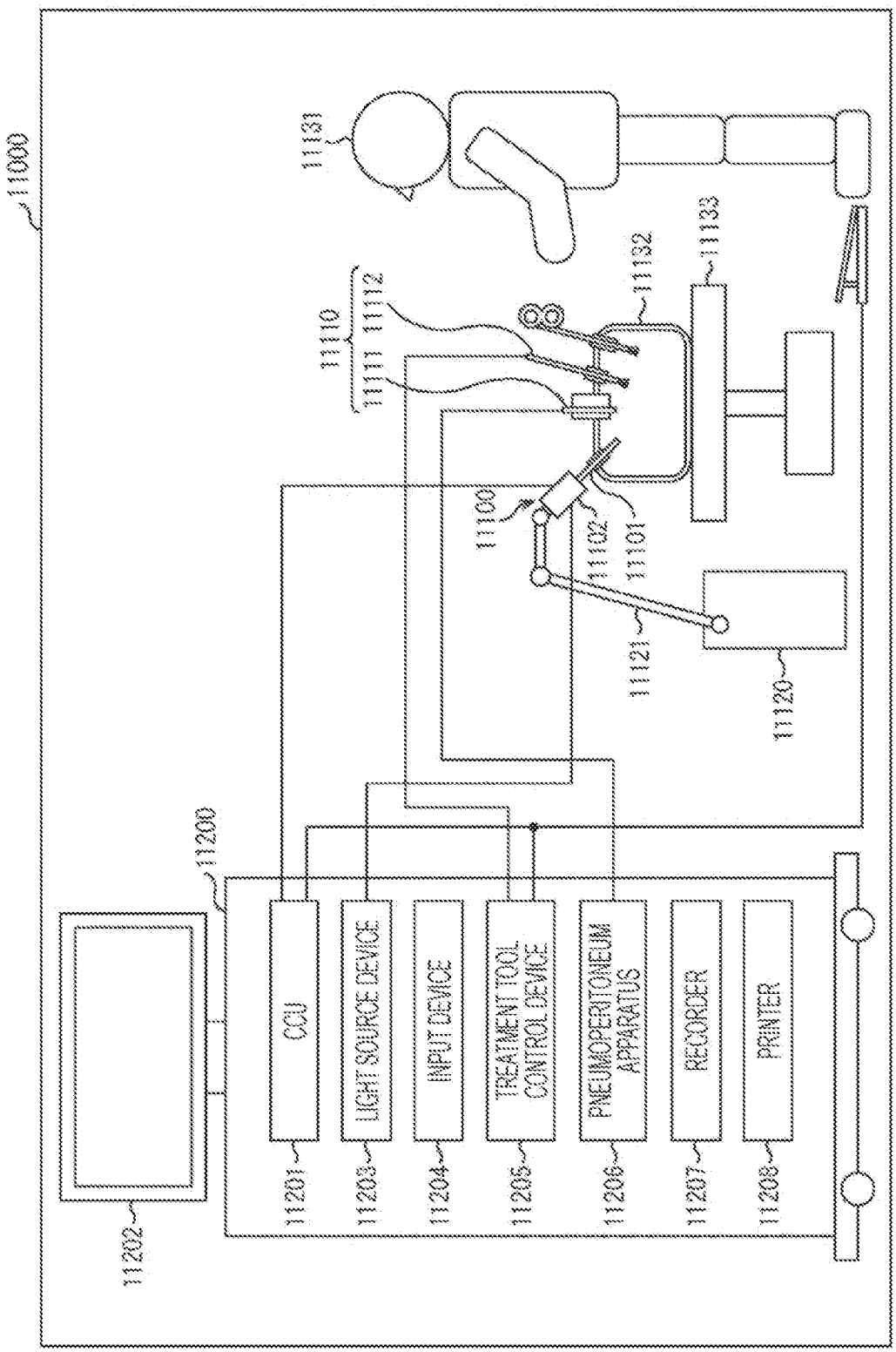
FIG. 62 is a diagram illustrating an example of the schematic configuration of an endoscopic operation system.

FIG. 62 is a block diagram illustrating an example of the schematic configuration of the endoscopic operation system to which the technology (present technology) according to the present disclosure can be applied.

FIG. 62 illustrates an aspect in which a surgeon (doctor) 11131 performs an operation on a patient 11132 on a patient bed 11133 using an endoscopic operation system 11000. As illustrated in FIG. 62, the endoscopic operation system 11000 includes an endoscope 11100, other surgical tools 11110 such as a pneumoperitoneum tube 11111 and an energy treatment tool 11112, a support arm device 11120 that supports the endoscope 11100, and a cart 11200 that is provided with various devices for an endoscopic operation.

The endoscope 11100 includes a lens barrel 11101 in which a region with a predetermined length from the tip is inserted into the body cavity of the patient 11132 and a camera head 11102 that is connected to a base end of the lens barrel 11101. In the example illustrated in FIG. 62, the endoscope 11100 configured as a so-called hard mirror having the hard lens barrel 11101 is illustrated. However, the endoscope 11100 may be configured as a so-called soft mirror having a soft lens barrel.

An opening portion to which an objective lens is fitted is provided at the tip of the lens barrel 11101. A light source device 11203 is connected to the endoscope 11100. Light generated by the light source device 11203 is guided to the tip of the lens barrel by a light guide that extends in the lens barrel 11101 and is emitted to an observation target in the body cavity of the patient 11132 through the objective lens. In addition, the endoscope 11100 may be a forward-viewing endoscope, an oblique-viewing endoscope, or a side-viewing endoscope.

An optical system and an imaging element are provided in the camera head 11102 and light (observation light) reflected from the observation target is focused on the imaging element by the optical system. The imaging element performs photoelectric conversion for the observation light and generates an electric signal corresponding to the observation light, that is, an image signal corresponding to an observation image. The image signal is transmitted as RAW data to a camera control unit (CCU) 11201.

The CCU 11201 is, for example, a central processing unit (CPU) or a graphics processing unit (GPU) and controls the overall operation of the endoscope 11100 and a display device 11202. In addition, the CCU 11201 receives the image signal from the camera head 11102 and performs various types of image processing for displaying an image based on the image signal, such as a development process (demosaicing process), for example, for the image signal.

The display device 11202 displays the image based on the image signal subjected to the image processing by the CCU 11201 under the control of the CCU 11201.

The light source device 11203 is a light source, such as a light emitting diode (LED) and supplies irradiation light used in a case where, for example, an image of an operative site or the like is captured to the endoscope 11100.

An input device 11204 is an input interface for the endoscopic operation system 11000. The user can input various kinds of information or commands to the endoscopic operation system 11000 through the input device 11204. For example, the user inputs a command to change the imaging conditions (the type of irradiation light, magnification, a focal length, and the like) of the endoscope 11100 and the like.

The treatment tool control device 11205 controls the driving of the energy treatment tool 11112 for, for example, cauterization or incision of tissues or the sealing of blood vessels. The pneumoperitoneum apparatus 11206 sends gas into the body cavity of the patient 11132 through a pneumoperitoneum tube 11111 in order to expand the body cavity for the purpose of ensuring the field of view of the endoscope 11100 and a working space of the surgeon. The recorder 11207 is a device that can record various kinds of information related to the operation. A printer 11208 is a device that can print various kinds of information related to the operation in various format, such as a text, an image, and a graph.

In addition, the light source device 11203 that supplies irradiation light used in a case where an image of an operative site is captured to the endoscope 11100 may be, for example, a white light source formed by an LED, a laser light source, or a combination thereof. In a case where R, G, and B laser light sources are combined to form the white light source, it is possible to control the output intensity and output timing of each color (each wavelength) with high accuracy. Therefore, the light source device 11203 can adjust the white balance of a captured image. In addition, in this case, it is possible to capture R, G, and B images in a time division manner by irradiating an observation target with laser light components emitted from the R, G, and B laser light sources in a time division manner and controlling the driving of the imaging element of the camera head 11102 in synchronization with the irradiation timing. This method can obtain a color image without providing a color filter in the imaging element.

In addition, the driving of the light source device 11203 may be controlled such that the intensity of light output from the light source device 11203 is changed at a predetermined time interval. It is possible to generate a high-dynamic-range image without so-called black blur and white blur by controlling the driving of the imaging element of the camera head 11102 in synchronization with the change timing of light intensity to acquire images in a time division manner and combining the images.

Further, the light source device 11203 may be configured to supply light in a predetermined wavelength band corresponding to special light observation. In the special light observation, for example so-called narrow band imaging is performed which emits light in a band narrower than the band of irradiation light (that is, white light) used at the time of normal observation to capture the image of a predetermined tissue, such as a blood vessel in a superficial portion of a mucous membrane, with high contrast, using the wavelength dependency of light absorption in the body tissue. Alternatively, in the special light observation, fluorescence observation may be performed which obtains an image using fluorescence that is generated by the emission of excitation light. In the fluorescence observation, for example the following can be performed: the body tissue is irradiated with excitation light and fluorescence from the body tissue is observed (self-fluorescence observation); or a reagent such as indocyanine green (ICG), is locally injected into the body tissue and the body tissue is irradiated with exciting light corresponding to the fluorescent wavelength of the reagent to obtain a fluorescent image. The light source device 11203 can be configured so as to supply light in a narrow band and/or excitation light corresponding to the special light observation.

Figure 63:
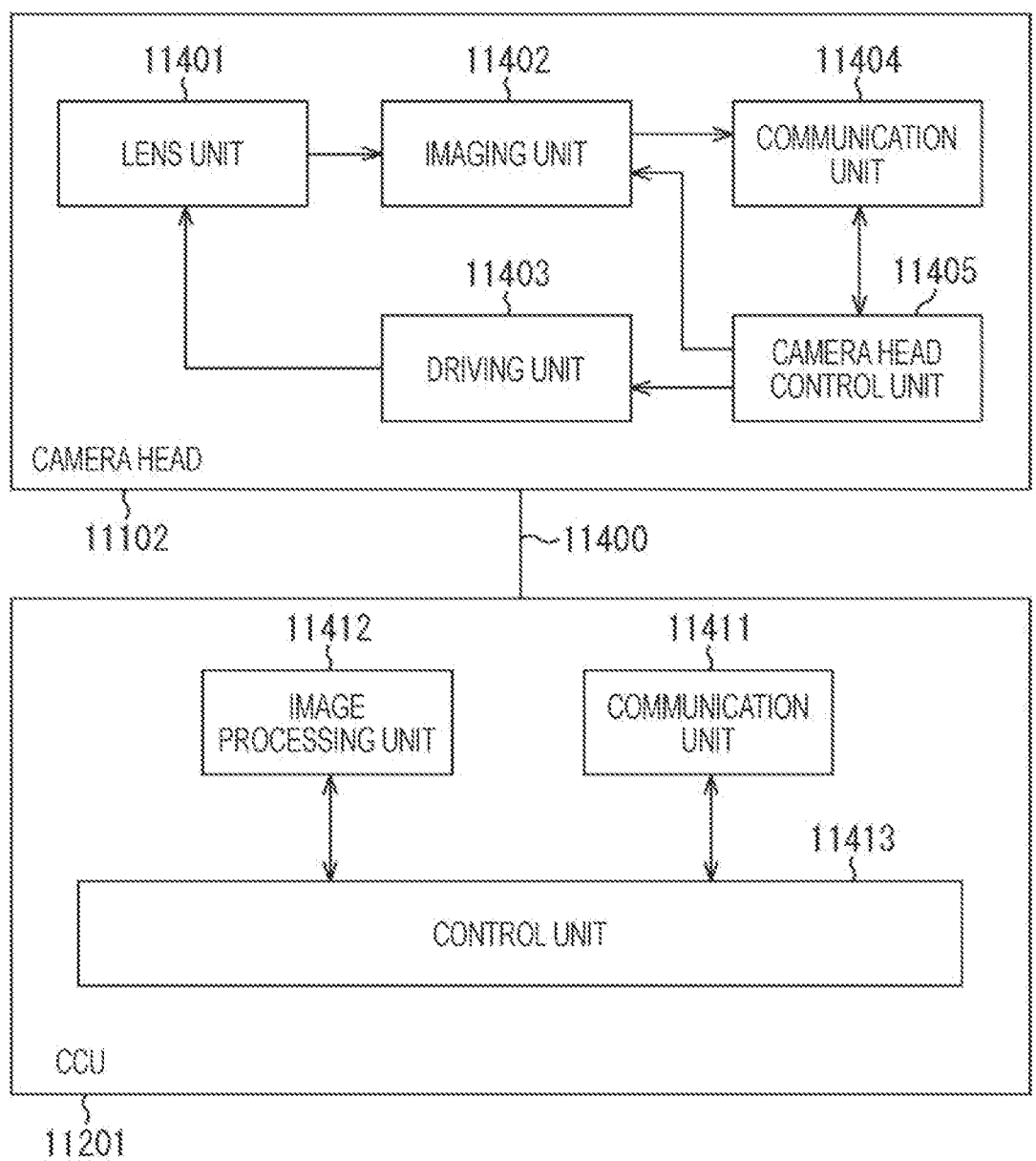
FIG. 63 is a block diagram illustrating an example of the functional configuration of a camera head and a CCU.

FIG. 63 is a block diagram illustrating an example of the functional configuration of the camera head 11102 and the CCU 11201 illustrated in FIG. 62.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are connected by a transmission cable 11400 so as to communicate with each other.

The lens unit 11401 is an optical system that is provided in a connection portion with the lens barrel 11101. The observation light acquired from the tip of the lens barrel 11101 is guided to the camera head 11102 and is incident on the lens unit 11401. The lens unit 11401 is configured by a combination of a plurality of lenses including a zoom lens and a focusing lens.

The imaging unit 11402 includes an imaging element. One imaging element (single plate type) or a plurality of imaging elements (multi-plate type) may form the imaging unit 11402. In a case where the imaging unit 11402 is the multi-plate type, for example, the imaging elements may generate R, G, and B image signals and the image signals may be combined to obtain a color image. Alternatively, the imaging unit 11402 may be configured so as to include a pair of imaging elements for acquiring image signals for the left and right eyes corresponding to three-dimensional (3D) display. The 3D display makes it possible for the surgeon 11131 to accuracy check the depth of the body tissue in the operative site. In addition, in a case where the imaging unit 11402 is the multi-plate type, a plurality of lens units 11401 corresponding to each imaging element can be provided.

In addition, the imaging unit 11402 may not be necessarily provided in the camera head 11102. For example, the imaging unit 11402 may be provided immediately after the objective lens in the lens barrel 11101.

The driving unit 11403 is an actuator and moves the zoom lens and the focusing lens of the lens unit 11401 by a predetermined distance along the optical axis under the control of the camera head control unit 11405. Therefore, it is possible to appropriately adjust the magnification and focus of the image captured by the imaging unit 11402.

The communication unit 11404 is a communication device for transmitting and receiving various kinds of information to and from the CCU 11201. The communication unit 11404 transmits the image signal obtained from the imaging unit 11402 as RAW data to the CCU 11201 through the transmission cable 11400.

In addition, the communication unit 11404 receives a control signal for controlling the driving of the camera head 11102 from the CCU 11201 and supplies the control signal to the camera head control unit 11405. The control signal includes, for example, information related to imaging conditions, such as information for designating the frame rate of the captured image, information for designating an exposure value at the time of imaging, and/or information for designating the magnification and focus of the captured image.

Further, the user may appropriately designate the imaging conditions, such as the frame rate, the expose value, the magnification, and the focus, or the control unit 11413 of the CCU 11201 may automatically set the imaging conditions on the basis of the acquired image signal. In the latter case, the endoscope 11100 has a so-called auto exposure (AE) function, a so-called auto focus (AF) function, and a so-called auto white balance (AWB) function.

The camera head control unit 11405 controls the driving of the camera head 11102 on the basis of the control signal received from the CCU 11201 through the communication unit 11404.

The communication unit 11411 is a communication device for transmitting and receiving various kinds of information to and from the camera head 11102. The communication unit 11411 receives the image signal transmitted from the camera head 11102 through the transmission cable 11400.

In addition, the communication unit 11411 transmits a control signal for controlling the driving of the camera head 11102 to the camera head 11102. The image signal or the control signal can be transmitted by, for example, electric communication or optical communication.

The image processing unit 11412 performs various types of image processing for the image data which is RAW data transmitted from the camera head 11102.

The control unit 11413 performs various control processes related to the capture of the image of, for example, an operative site by the endoscope 11100 and the display of the captured image of the operative site or the like. For example, the control unit 11413 generates a control signal for controlling the driving of the camera head 11102.

In addition, the control unit 11413 directs the display device 11202 to display the captured image of, for example, the operative site on the basis of the image signal subjected to the image processing by the image processing unit 11412. At that time, the control unit 11413 may recognize various objects in the captured image using various image recognition techniques. For example, the control unit 11413 detects the shape, color, and the like of the edge of an object included in the captured image to recognize a surgical tool, such as forceps, a specific living body part, bleeding, mist in a case where the energy treatment tool 11112 is used, and the like. In a case where the captured image is displayed on the display device 11202, the control unit 11413 may display various kinds of operation support information so as to be superimposed on the image of the operative side, using the recognition result. Since the operation support information is displayed so as to be superimposed and is presented to the surgeon 11131, it is possible to reduce a burden on the surgeon 11131 and the surgeon 11131 can reliably progress the operation.

The transmission cable 11400 connecting the camera head 11102 and the CCU 11201 is an electric signal cable corresponding to electric signal communication, an optical fiber corresponding to optical communication, or a composite cable of them.

Here, in the example illustrated in FIG. 63, the transmission cable 11400 is used to perform wired communication. However, the camera head 11102 and the CCU 11201 may wirelessly communicate with each other.

An example of the endoscopic operation system to which the technology according to the present disclosure can be applied has been described above. The technology according to the present disclosure can be applied to the imaging unit 11402 of the camera head 11102 among the above-mentioned configurations. Specifically, the solid-state imaging elements or the imaging devices in each of the above-described embodiments can be applied to the imaging unit 10402. In a case where the technology according to the present disclosure is applied to the imaging unit 10402, it is possible to reduce the size and height of the camera head 11102.

Note that, here, for example, the endoscopic operation system has been described. However, the technology according to the present disclosure may be applied to, for example, a microscope operation system and the like.

(Q) Application Example to Moving Body:

The technology (present technology) according to the present disclosure can be applied to various products. For example, the technology according to the present disclosure may be implemented as a device that is mounted on any kind of moving body, such as vehicles, electric vehicles, hybrid electric vehicles, motorcycles, bicycles, personal mobility, airplanes, drones, ships, and robots.

Figure 64:
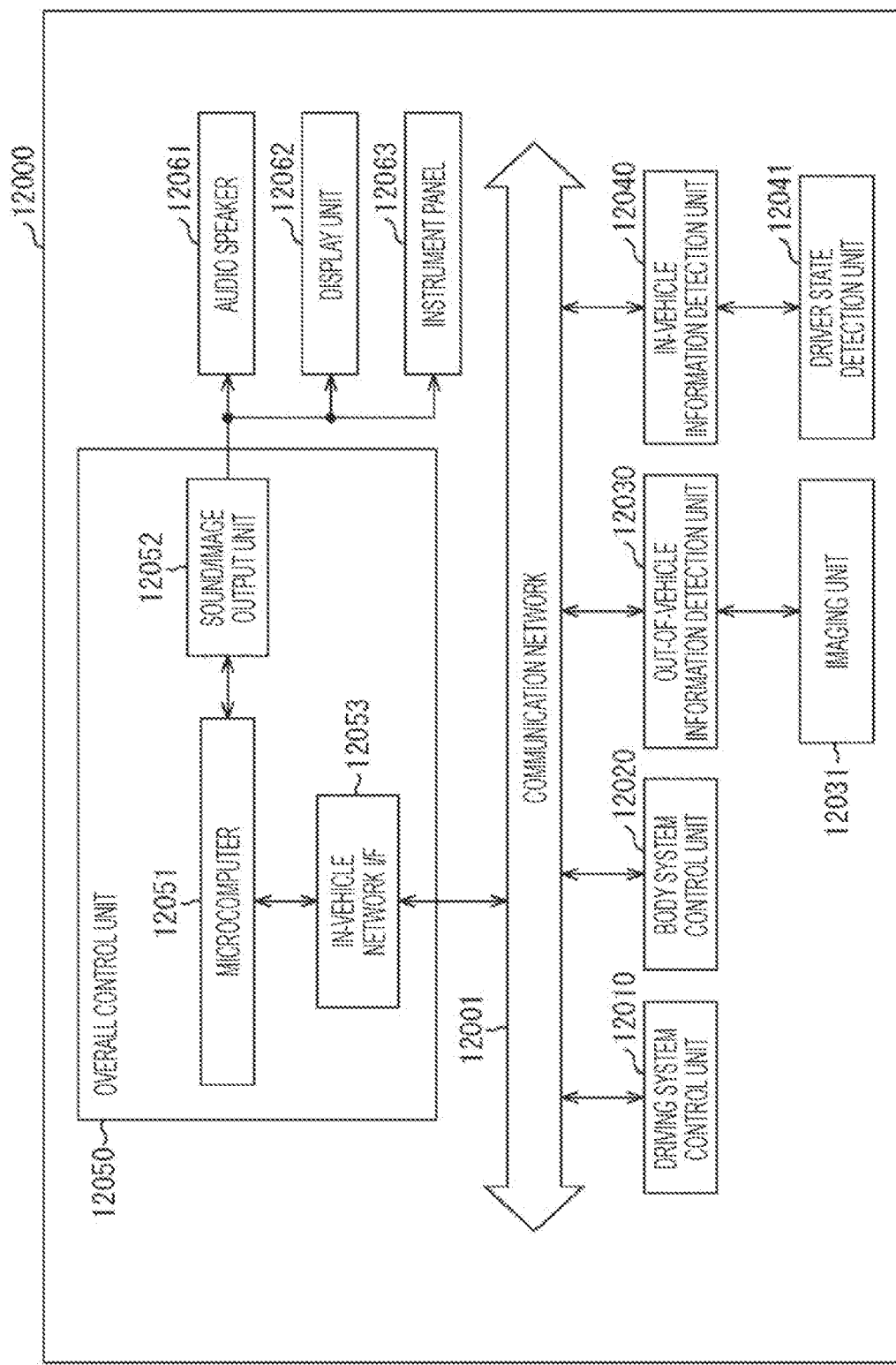
FIG. 64 is a block diagram illustrating an example of the schematic configuration of a vehicle control system.

FIG. 64 is a block diagram illustrating an example of the schematic configuration of a vehicle control system which is an example of a moving body control system to which the technology according to the present disclosure can be applied.

A vehicle control system 12000 includes a plurality of electronic control units that are connected to each other through a communication network 12001. In the example illustrated in FIG. 64, the vehicle control system 12000 includes a driving system control unit 12010, a body system control unit 12020, an out-of-vehicle information detection unit 12030, an in-vehicle information detection unit 12040, and an overall control unit 12050. In addition, as the functional components of the overall control unit 12050, a microcomputer 12051, a sound/image output unit 12052, and an in-vehicle network interface (I/F) 12053 are illustrated.

The driving system control unit 12010 controls the operation of devices related to a driving system of a vehicle on the basis of various programs. For example, driving system control unit 12010 functions as a control device for a driving force generation device that generates the driving force of the vehicle, such as the driving force of an internal combustion engine or a driving motor, a driving force transmission mechanism that transmits the driving force to wheels, a steering mechanism that adjusts the steering angle of the vehicle, a braking device that generates the braking force of the vehicle, and the like.

The body system control unit 12020 controls the operation of various devices mounted on a vehicle body on the basis of various programs. For example, the body system control unit 12020 functions as a control device for a keyless entry system, a smart key system, a power window device, or various lamps, such as a head lamp, a back lamp, a brake lamp, an indicator lamp, and a fog lamp. In this case, radio waves that are transmitted from a portable machine substituting a key or signals of various switches can be inputted to the body system control unit 12020. The body system control unit 12020 receives the input radio waves or signals and controls, for example, a door lock device, a power window device, and lamps of the vehicle.

The out-of-vehicle information detection unit 12030 detects information outside the vehicle provided with the vehicle control system 12000. For example, an imaging unit 12031 is connected to the out-of-vehicle information detection unit 12030. The out-of-vehicle information detection unit 12030 directs the imaging unit 12031 to capture an image of the outside of the vehicle and receives the captured image. The out-of-vehicle information detection unit 12030 may perform a process of detecting an object, such as a person, a vehicle, an obstacle, a sign, or a character on a road surface, or a distance detection process on the basis of the received image.

The imaging unit 12031 is an optical sensor that receives light and outputs an electric signal corresponding to the amount of light received. The imaging unit 12031 can output the electric signal as an image and can also output the electric signal as distance measurement information. In addition, the light received by the imaging unit 12031 may be visible light or invisible light such as infrared light.

The in-vehicle information detection unit 12040 detects information in the vehicle. For example, a driver state detection unit 12041 that detects the state of a driver is connected to the in-vehicle information detection unit 12040. The driver state detection unit 12041 includes, for example, a camera that captures an image of the driver. The in-vehicle information detection unit 12040 may calculate the degree of fatigue or the degree of concentration of the driver or may determine whether or not the driver is dozing, on the basis of detection information input from the driver state detection unit 12041.

The microcomputer 12051 calculates control target values of the driving force generation device, the steering mechanism, or the braking device on the basis of information inside and outside the vehicle acquired by the out-of-vehicle information detection unit 12030 or the in-vehicle information detection unit 12040 and outputs a control command to the driving system control unit 12010. For example, the microcomputer 12051 can perform cooperative control for implementing an advanced driver assistance system (ADAS) function including vehicle collision avoidance, vehicle impact relaxation, follow-up traveling, vehicle speed maintenance traveling, and vehicle collision warning based on a vehicle-to-vehicle distance, lane departure warning or the like.

In addition, the microcomputer 12051 controls, for example, the driving force generation device, the steering mechanism, or the braking device on the basis of information around the vehicle acquired by the out-of-vehicle information detection unit 12030 or the in-vehicle information detection unit 12040 to perform cooperative control for implementing, for example, automatic driving that allows the vehicle to travel autonomously without depending on the operation of the driver.

In addition, the microcomputer 12051 can output a control command to the body system control unit 12020 on the basis of information outside the vehicle acquired by the out-of-vehicle information detection unit 12030. For example, the microcomputer 12051 can perform cooperative control to perform a glare prevention process, such as a process of controlling a headlamp according to the position of a vehicle in front or an oncoming vehicle detected by the out-of-vehicle information detection unit 12030 such that a high beam is switched to a low beam.

The sound/image output unit 12052 transmits at least one of a sound output signal or an image output signal to an output device that can visually or audibly notify information to passengers in the vehicle or the outside of the vehicle. In the example illustrated in FIG. 64, examples of the output device include an audio speaker 12061, a display unit 12062, and an instrument panel 12063. The display unit 12062 may include, for example, at least one of a pointing device or a head-up display.

Figure 65:
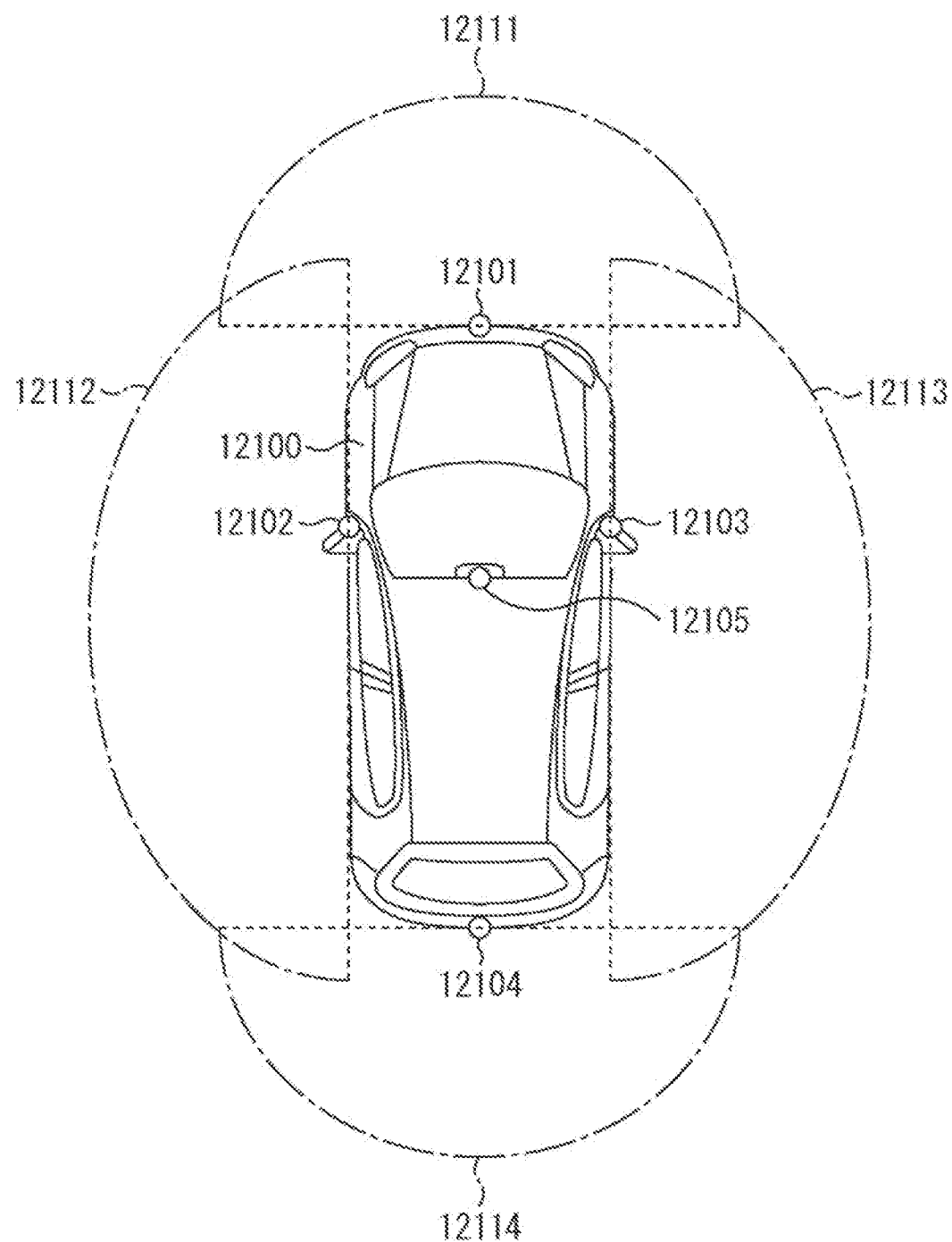
FIG. 65 is a diagram illustrating an example of the installation position of an out-of-vehicle information detection unit and an imaging unit.

FIG. 65 is a diagram illustrating an example of the installation position of the imaging unit 12031.

In FIG. 65, a vehicle 12100 includes imaging units 12101, 12102, 12103, 12104, and 12105 as the imaging unit 12031.

For example, the imaging units 12101, 12102, 12103, 12104, and 12105 are provided at positions, such as a front nose, a side mirror, a rear bumper, a back door, and an upper part of a front glass in a vehicle cabin of the vehicle 12100. The imaging unit 12101 provided in the front nose and the imaging unit 12105 provided in the upper part of the front glass in the vehicle cabin mainly acquire images in front of the vehicle 12100. The imaging units 12102 and 12103 provided in the side mirrors mainly acquire images on the sides of the vehicle 12100. The imaging unit 12104 provided in the rear bumper or the back door mainly acquires images behind the vehicle 12100. The images in front of the vehicle acquired by the imaging units 12101 and 12105 are mainly used to detect, for example, vehicles in front, pedestrians, obstacles, traffic signals, traffic signs, or lanes.

In addition, FIG. 65 illustrates an example of the imaging range of the imaging units 12101 to 12104. An imaging range 12111 indicates the imaging range of the imaging unit 12101 provided in the front nose. Imaging ranges 12112 and 12113 indicates the imaging ranges of the imaging units 12102 and 12103 provided in the side mirrors, respectively. An imaging range 12114 indicates the imaging range of the imaging unit 12104 provided in the rear bumper or the back door. For example, image data items captured by the imaging units 12101 to 12104 are superimposed to obtain a bird's-eye view image of the vehicle 12100 viewed from the upper side.

At least one of the imaging units 12101 to 12104 may have a function of acquiring distance information. For example, at least one of the imaging units 12101 to 12104 may be a stereo camera including a plurality of imaging elements or may be an imaging element having a pixel for detecting a phase difference.

For example, the microcomputer 12051 calculates a distance to each three-dimensional object in the imaging ranges 12111 to 12114 and a change in the distance over time (a relative speed with respect to the vehicle 12100) on the basis of distance information obtained from the imaging units 12101 to 12104 to extract, as a vehicle in front, a three-dimensional object that is closest to the vehicle 12100 on a travel path of the vehicle 12100 and particularly travels at a predetermined speed (for example, 0 km/h or more) substantially in the same direction as the vehicle 12100. In addition, the microcomputer 12051 can set a distance to the vehicle in front which is to be ensured in advance and can perform, for example, automatic brake control (including follow-up stop control) and automatic acceleration control (including follow-up start control). As such, it is possible to perform cooperative control for implementing, for example, automatic driving that allows the vehicle to travel autonomously without depending on the operation of the driver.

For example, the microcomputer 12051 can classify three-dimensional object data related to three-dimensional objects into other three-dimensional objects, such as a two-wheel vehicle, an ordinary vehicle, a large vehicle, a pedestrian, and an electric pole on the basis of the distance information obtained from the imaging units 12101 to 12104, extract the three-dimensional object data, and use the three-dimensional object data for automatic obstacle avoidance. For example, the microcomputer 12051 classifies obstacles in the vicinity of the vehicle 12100 into obstacles that are visible by the driver of the vehicle 12100 and obstacles that are hardly visible. Then, the microcomputer 12051 determines a collision risk indicating the degree of risk of collision with each obstacle. In a case where the collision risk is equal to or greater than a set value, the microcomputer 12051 outputs a warning to the driver through the audio speaker 12061 or the display unit 12062 or performs forced deceleration or avoidance steering through the driving system control unit 12010 to perform drive assistance for collision avoidance.

At least one of the imaging units 12101 to 12104 may be an infrared camera that detects infrared light. For example, the microcomputer 12051 determines whether or not a pedestrian is present in the images captured by the imaging units 12101 to 12104 to recognize the pedestrian. For example, the recognition of the pedestrian is performed by a process of extracting feature points in the images captured by the imaging units 12101 to 12104 as the infrared cameras and a process of performing a pattern matching process for a series of feature points indicating the contour of an object to determine whether or not the pedestrian is present. In a case where the microcomputer 12051 determines that a pedestrian is present in the images captured by the imaging units 12101 to 12104 and recognizes the pedestrian, the sound/image output unit 12052 controls the display unit 12062 such that a square outline for emphasis is superimposed on the recognized pedestrian and is then displayed. In addition, the sound/image output unit 12052 may control the display unit 12062 such that, for example, an icon indicating the pedestrian is displayed at a desired position.

An example of the vehicle control system to which the technology according to the present disclosure can be applied has been described. The technology according to the present disclosure can be applied to the imaging unit 12031 among the above-mentioned configurations. Specifically, the solid-state imaging elements or the imaging devices in each of the above-described embodiments can be applied to the imaging unit 12031. In a case where the technology according to the present disclosure is applied to the imaging unit 12031, it is possible to reduce the size and height of the imaging unit 12031.

Note that the present technology is not limited to the above-described embodiments and also includes configurations obtained by replacing the configurations disclosed in each of the above-described embodiments or changing combinations of the configurations and configurations obtained by replacing the configurations disclosed in each of the above-described embodiments and the related art or changing combinations of the configurations, for example. In addition, the technical scope of the present technology is not limited to the above-described embodiments and includes the matters described in the claims and equivalents thereof.

The present technology can have the following configurations.

(1-1) A solid-state imaging element includes: a semiconductor substrate in which a plurality of photoelectric conversion elements are provided in parallel along a light receiving surface; a color filter that is stacked on the light receiving surface; an on-chip lens that is stacked on the color filter; a resin layer that is made by using a material having a lower refractive index than the on-chip lens and is stacked on the on-chip lens such that a front surface is flat; and an inorganic material layer that is formed with a substantially constant thickness on the resin layer. A plate-shaped translucent member is not mounted and fixed to the inorganic material layer by an adhesive.

(1-2) In the solid-state imaging element according to (1-1), the inorganic material layer includes silicon oxide (SiO) or silicon oxynitride (SiON).

(1-3) In the solid-state imaging element according to (1-1) or (1-2), the inorganic material layer is an antireflection film obtained by stacking an oxide other than a silicon (Si)-based oxide and the silicon (Si)-based oxide.

(1-4) In the solid-state imaging element according to (1-1), an IR cut film is formed as the inorganic material layer.

(1-5) In the solid-state imaging element according to (1-1), a diffraction grating is formed as the inorganic material layer.

(1-6) In the solid-state imaging element according to any one of (1-1) to (1-5), a wiring layer and a rewiring layer are formed on a front surface side of the semiconductor substrate through a support substrate and a through silicon via (TSV) is formed so as to pass through the support substrate from a front surface to a rear surface.

(1-7) A method for manufacturing a solid-state imaging element includes: a step of stacking a color filter and an on-chip lens on an imaging element region of a first surface of a semiconductor substrate; a step of forming a coating film having a first refractive index on the on-chip lens such that a front surface is flat; a step of stacking an inorganic material layer on the coating film so as to be substantially flat; a step of bonding a support substrate to a front surface of the inorganic material layer and reversing the semiconductor substrate having the support substrate bonded thereto; a step of forming a rewiring layer on a second surface that is opposite to the first surface of the semiconductor substrate in a state in which the support substrate is bonded; a step of forming a through electrode that passes through the rewiring layer and the semiconductor substrate in a region outside the imaging element region; and a step of peeling off the support substrate from the inorganic material layer.

(1-8) There is provided an imaging device including a solid-state imaging element and a signal processing circuit that processes a signal from the solid-state imaging element. The solid-state imaging element includes: a semiconductor substrate in which a plurality of photoelectric conversion elements are provided in parallel along a light receiving surface; a color filter that is stacked on the light receiving surface; an on-chip lens that is stacked on the color filter; a resin layer that includes a material having a lower refractive index than the on-chip lens and is stacked on the on-chip lens such that a front surface is flat; and an inorganic material layer that is formed with a substantially constant thickness on the resin layer. A plate-shaped translucent member is not mounted and fixed to the inorganic material layer by an adhesive.

(2-1)
A solid-state imaging element that is a wafer-level chip size package, including:
an optical sensor chip;
a protective layer that is stacked on a light receiving surface of the optical sensor chip; and a rewiring layer that is stacked on a surface opposite to the light receiving surface of the optical sensor chip,
in which a connection terminal of the rewiring layer is a copper flat pad without a solder ball,
an alloy layer of tin and copper is not formed on a front surface of the flat pad, and
a thermal expansion coefficient of the protective layer is substantially balanced with a thermal expansion coefficient of the rewiring layer.

(2-2)
The solid-state imaging element according to (2-1),
in which the protective layer is a transparent resin layer that is formed with a sufficient thickness to cover a color filter or an on-chip lens formed on the light receiving surface and is solidified, and
a glass substrate is not stacked on the transparent adhesive resin layer.

(2-3)
The solid-state imaging element according to (2-1),
in which the protective layer includes a transparent adhesive resin layer made by using a transparent adhesive resin that is applied with a sufficient thickness to cover a color filter or an on-chip lens formed on the light receiving surface and a glass substrate which is stacked on and bonded to the transparent adhesive resin layer and is thinned by a thickness reduction means from a front surface.

(2-4)
The solid-state imaging element according to any one of (2-1) to (2-3),
in which the rewiring layer includes a redistribution wire, a solder mask that covers the redistribution wire, and a flat pad that is connected to the redistribution wire and is exposed from the solder mask, and
a front surface of the solder mask is flush with a surface of the flat pad.

(2-5)
The solid-state imaging element according to any one of (2-1) to (2-3),
in which the rewiring layer includes a redistribution wire, an inorganic insulating film that covers the redistribution wire, and a flat pad that is connected to the redistribution wire and is exposed from the inorganic insulating film.

(2-6)
The solid-state imaging element according to (2-5),
in which a front surface of the inorganic insulating film is flush with a surface of the flat pad.

(2-7)
The solid-state imaging element according to any one of (2-1) to (2-6),
in which a surface of the flat pad is covered with a corrosion prevention film.

REFERENCE SIGNS LIST 10, 20, 30, 40, 40', 50, 50', 60, 60', 200 Solid-state imaging element
11A, 201A On-chip lens
11A1 Base portion
11A2 Spherical lens
11B, 201B Color filter
12, 201 Semiconductor substrate
12F Front surface
12R Rear surface
13 Through electrode
13A End portion
14, 203 Rewiring layer
14A Redistribution wire
14B Solder resist
14C Land
14D Solder ball
15 Resin layer
16 Inorganic material layer
17 Support substrate
17F Front surface
17R Rear surface
18 Wiring layer
19 Input/output pad
21, 31 Plurality of inorganic material layers
21A TaO layer
21B $SiO_2$ layer
21C TaO layer
21D SiO layer
31A NbO layer
31B SiO layer
41 IR cut film
51, 61 Transparent resin film
62 Light shielding film
101 Adhesive layer
102 Temporary substrate
103 DG frame
202 LIB resin
204 Cover glass
210 Lens module
220 Adhesive
230 Support substrate
500 Module
530 Optical system
540 Solid-state imaging element
600 Imaging device
610 Camera signal control unit
620 Image processing unit
630 Display unit
640 Reader/writer
650 Arithmetic processing unit
660 Operation input unit
670 Lens driving control unit
121 Pixel unit
122 Vertical driving unit
123 Analog-to-digital conversion unit
123 AD conversion unit
123a Comparator
123b Counter
123c Latch
124 Reference signal generation unit
125 Horizontal driving unit
126 Timing control unit
127 Signal control unit
FD Floating diffusion
HSLn Pixel driving line
Lrst Signal line
Lsel Signal line
Ltrf Horizontal signal line
Ltrg Signal line
PD Photodiode
PXL Pixel
R1 Imaging element region
R2 Peripheral circuit region
T1 Input terminal
T2 Input terminal
T3 Output terminal
TR1 Transfer transistor
TR2 Reset transistor
TR3 Amplifying transistor
TR4 Select transistor VSL Vertical signal line
VSLm Vertical signal line
700 Solid-state imaging element
700F Front surface
700R Rear surface
710 Image sensor main body portion
710F Front surface
710R Rear surface
711 Pad
720 Another substrate
720' Another substrate
720'F Front surface
721 Through electrode
730 Rewiring layer
731 Pad
732 Redistribution wire
741 Color filter
742 On-chip lens
743 Transparent resin layer
750 Temporary bonding resin
760 Temporary substrate
770 Laminate tape
800 Solid-state imaging element
800F Front surface
800R Rear surface
810 Image sensor main body portion
810F Front surface
810R Rear surface
820' Another substrate
821 Through electrode
830 Rewiring layer
831 Pad
832 Redistribution wire
841 Color filter
842 On-chip lens
843 Transparent adhesive resin layer
843' Transparent adhesive resin
880 Glass substrate
880' Glass substrate
890 Solder mask
891 Opening
900 Solid-state imaging element
900F Front surface
900R Rear surface
910 Image sensor main body portion
910F Front surface
910R Rear surface
920 Another substrate
920' Another substrate
920'F Front surface
921 Through electrode
930 Rewiring layer
931 Pad
931F Front surface
931a Base portion
931b Swelling portion
931b' Swelling portion
932 Redistribution wire
941 Color filter
942 On-chip lens
943 Transparent adhesive resin layer
943' Transparent adhesive resin
980 Glass substrate
990 Solder mask
990' Solder mask
990F Front surface
990'F Front surface
991 Opening
1000 Solid-state imaging element
1000F Front surface
1000R Rear surface
1010 Image sensor main body portion
1030 Rewiring layer
1031 Pad
1032 Redistribution wire
1041 Color filter
1042 On-chip lens
1043 Transparent adhesive resin layer
1080 Glass substrate
1090 Inorganic insulating film
1090' Inorganic insulating film
1091 Opening
1100 Solid-state imaging element
1110 Image sensor main body portion
1110F Front surface
1110R Rear surface
1120' Another substrate
1120'F Front surface
1130 Rewiring layer
1131 Pad
1132 Redistribution wire
1135 Gold layer
1141 Color filter
1142 On-chip lens
1143 Transparent resin layer
1180 Glass substrate
1190 Inorganic insulating film
1190' Inorganic insulating film
1191 Opening
1200 Solid-state imaging element
1200F Front surface
1200R Rear surface
1210 Image sensor main body portion
1210F Front surface
1210R Rear surface
1220' Another substrate
1220'F Front surface
1221 Through electrode
1230 Rewiring layer
1231 Pad
1231' Swelling portion
1231F Front surface
1231a Base portion
1231b Swelling portion
1231b' Swelling portion
1232 Redistribution wire
1241 Color filter
1242 On-chip lens
1243 Transparent adhesive resin layer
1243' Transparent adhesive resin
1280 Glass substrate
1290 Inorganic insulating film
1290' Inorganic insulating film
1290F Front surface
1291 Opening

What is claimed is:

1. A solid-state imaging element, comprising:
an optical sensor chip;
a color filter;
an on-chip lens, wherein the color filter and the on-chip lens are on a light receiving surface of the optical sensor chip;
a protective layer on the light receiving surface of the optical sensor chip, wherein the protective layer is a transparent resin layer that covers the color filter and the on-chip lens, and a glass substrate is absent on the transparent resin layer; and a rewiring layer on a surface opposite to the light receiving surface of the optical sensor chip, wherein a solder ball is above a flat portion of the rewiring layer.

2. The solid-state imaging element according to claim 1, further comprising the glass substrate, wherein the color filter and the on-chip lens are on the light receiving surface of the optical sensor chip, the glass substrate is on the transparent resin layer and bonded to the transparent resin layer, and the glass substrate is thinned from a front surface of the glass substrate by a thickness reduction method.

3. The solid-state imaging element according to claim 1, wherein the rewiring layer includes a redistribution wire, a solder mask, and the flat portion, the solder mask covers the redistribution wire, the flat portion is connected to the redistribution wire, and the flat portion is exposed from the solder mask.

4. The solid-state imaging element according to claim 1, wherein the rewiring layer includes a redistribution wire, an inorganic insulating film, and the flat portion, the inorganic insulating film covers the redistribution wire, the flat portion is connected to the redistribution wire, and the flat portion is exposed from the inorganic insulating film.

5. The solid-state imaging element according to claim 4, wherein a front surface of the inorganic insulating film is flush with a front surface of the flat portion.

6. The solid-state imaging element according to claim 1, further comprising a corrosion prevention film that covers a front surface of the flat portion.

7. An imaging device, comprising:

a solid-state imaging element that is a wafer-level chip size package; and a signal processing circuit configured to process a signal from the solid-state imaging element, wherein the solid-state imaging element includes:

an optical sensor chip;

a color filter;

an on-chip lens, wherein the color filter and the on-chip lens are on a light receiving surface of the optical sensor chip;

a protective layer on the light receiving surface of the optical sensor chip, wherein the protective layer is a transparent resin layer that covers the color filter and the on-chip lens, and a glass substrate is absent on the transparent resin layer; and a rewiring layer on a surface opposite to the light receiving surface of the optical sensor chip, wherein a solder ball is above a flat portion of the rewiring layer.

* * * * *